United States Patent
Yamazaki

(10) Patent No.: US 8,389,343 B2
(45) Date of Patent: Mar. 5, 2013

(54) METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/198,971

(22) Filed: Aug. 5, 2011

(65) Prior Publication Data

US 2011/0287592 A1     Nov. 24, 2011

Related U.S. Application Data

(62) Division of application No. 12/213,617, filed on Jun. 23, 2008, now Pat. No. 7,998,800.

(30) Foreign Application Priority Data

Jul. 6, 2007    (JP) ................................ 2007-179095

(51) Int. Cl.
*H01L 21/20* (2006.01)

(52) U.S. Cl. ........ 438/149; 438/479; 438/482; 438/488; 257/E21.09; 257/E21.412

(58) Field of Classification Search .................. 438/149, 438/151–159, 164, 479–491
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,648,662 A | 7/1997 | Zhang et al. |
| 5,701,167 A | 12/1997 | Yamazaki |
| 5,766,989 A | 6/1998 | Maegawa et al. |
| 5,811,328 A | 9/1998 | Zhang et al. |
| 5,834,345 A * | 11/1998 | Shimizu ........................ 438/158 |
| 5,849,601 A | 12/1998 | Yamazaki |
| 6,023,075 A | 2/2000 | Yamazaki |
| 6,124,155 A | 9/2000 | Zhang et al. |
| 6,166,399 A | 12/2000 | Zhang et al. |
| 6,228,751 B1 | 5/2001 | Yamazaki et al. |
| 6,252,249 B1 | 6/2001 | Yamazaki |

(Continued)

FOREIGN PATENT DOCUMENTS

| | | |
|---|---|---|
| JP | 60098680 | 6/1985 |
| JP | 04-242724 | 8/1992 |

(Continued)

OTHER PUBLICATIONS

Lee et al., Postdeposition Thermal Annealing and Material Stability of 75° C. Hydrogenated Nanocrystalline Silicon Plasma-Enhanced Chemical Vapor Deposition Films, Journal of Applied Physics, Aug. 2005, pp. 034305-1 to 034305-7, vol. 98.

(Continued)

*Primary Examiner* — Thanh Nguyen
(74) *Attorney, Agent, or Firm* — Eric J. Robinson; Robinson Intellectual Property Law Office, P.C.

(57) ABSTRACT

A method for manufacturing a semiconductor device is provided, which comprises at least a steps of forming a gate insulating film over a substrate, a step of forming a microcrystalline semiconductor film over the gate insulating film, and a step of forming an amorphous semiconductor film over the microcrystalline semiconductor film. The microcrystalline semiconductor film is formed by introducing a silicon hydride gas or a silicon halide gas when a surface of the gate insulating film is subjected to hydrogen plasma to generate a crystalline nucleus over the surface of the gate insulating film, and by increasing a flow rate of the silicon hydride gas or the silicon halide gas.

19 Claims, 26 Drawing Sheets

U.S. PATENT DOCUMENTS

| | | | |
|---|---|---|---|
| 6,306,213 | B1 | 10/2001 | Yamazaki |
| 6,335,213 | B1 | 1/2002 | Zhang et al. |
| 6,703,264 | B2 | 3/2004 | Yamazaki et al. |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,393,723 | B2 | 7/2008 | Yamazaki et al. |
| 7,507,991 | B2 | 3/2009 | Zhang et al. |
| 7,576,360 | B2 | 8/2009 | Yamazaki |
| 7,598,159 | B2 | 10/2009 | Oh et al. |
| 7,923,311 | B2 | 4/2011 | Zhang et al. |
| 2004/0164298 | A1* | 8/2004 | Hiramatsu et al. ............... 257/66 |
| 2005/0012097 | A1 | 1/2005 | Yamazaki |
| 2006/0035035 | A1 | 2/2006 | Sakama |
| 2008/0108226 | A1* | 5/2008 | Oh et al. ....................... 438/762 |

FOREIGN PATENT DOCUMENTS

| | | |
|---|---|---|
| JP | 05-226656 | 9/1993 |
| JP | 08-195492 | 7/1996 |
| JP | 2001-007024 | 1/2001 |
| JP | 2005-049832 | 2/2005 |

OTHER PUBLICATIONS

Lee et al., High-Mobility Nanocrystalline Silicon Thin-Film Transistors Fabricated by Plasma-Enhanced Chemical Vapor Deposition, Applied Physics Letters, May 2005, pp. 222106-1 to 222106-3, vol. 86.

Lee et al., Directly Deposited Nanocrystalline Silicon Thin-Film Transistors with Ultra High Mobilities, Applied Physics Letters, Dec. 2006, pp. 252101-1 to 252101-3, vol. 89.

Esmaeili-Rad et al., Absence of Defect State Creation in Nanocrystalline Silicon Thin Film Transistors Deduced from Constant Current Stress Measurements, Applied Physics Letters, Sep. 2007, pp. 113511-1 to 113511-3, vol. 91.

Esmaeili-Rad et al., Stability of Nanocrystalline Silicon Bottom-Gate Thin Film Transistors with Silicon Nitride Gate Dielectric, Journal of Applied Physics, Sep. 2007, pp. 064512-1 to 064512-7, vol. 102.

H. J. Lee et al., Leakage Current Mechanisms in Top-Gate Nanocrystalline Silicon Thin Film Transistors, Applied Physics Letters, Feb. 2008, pp. 083509-1 to 083509-3, vol. 92.

Lee et al., High Mobility N-Channel and P-Channel Nanocrystalline Silicon Thin-Film Transistors, Technical Digest of International Electron Devices Meeting, 2005, pp. 937-940.

Lee et al., How to Achieve High Mobility Thin Film Transistors by Direct Deposition of Silicon Using 13.56 MHz RF PECVD?, Technical Digest of International Electron Devices Meeting, 2006, pp. 29-32.

Esmaeili-Rad et al., High Stability, Low Leakage Nanocrystalline Silicon Bottom Gate Thin Film Transistors for AMOLED Displays, Technical Digest of International Electron Devices Meeting, 2006, pp. 49-52.

Lee et al., Stability of nc-Si:H TFTs with Silicon Nitride Gate Dielectric, IEEE Transactions on Electron Devices, Jan. 2007, pp. 45-51, vol. 54, No. 1.

Lee et al., Top-Gate TFTs using 13.56 MHz PECVD Microcrystalline Silicon, IEEE Electron Device Letters, Sep. 2005, pp. 637-639, vol. 26, No. 9.

Sazonov et al, Low-Temperature Materials and Thin Film Transistors for Flexible Electronics, Proceedings of the IEEE, Aug. 2005, pp. 1420-1428, vol. 93, No. 8.

\* cited by examiner

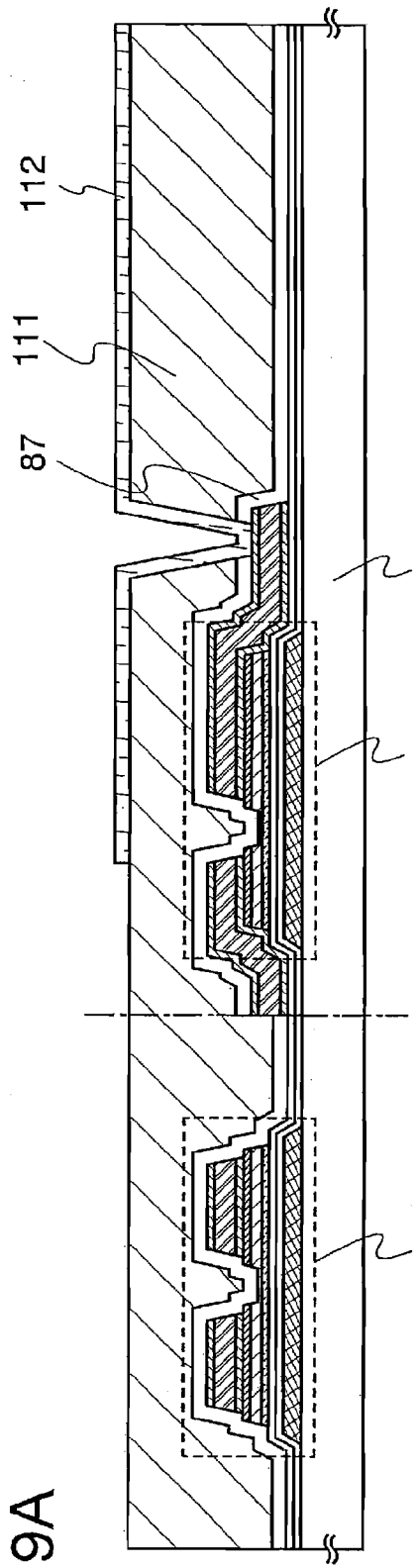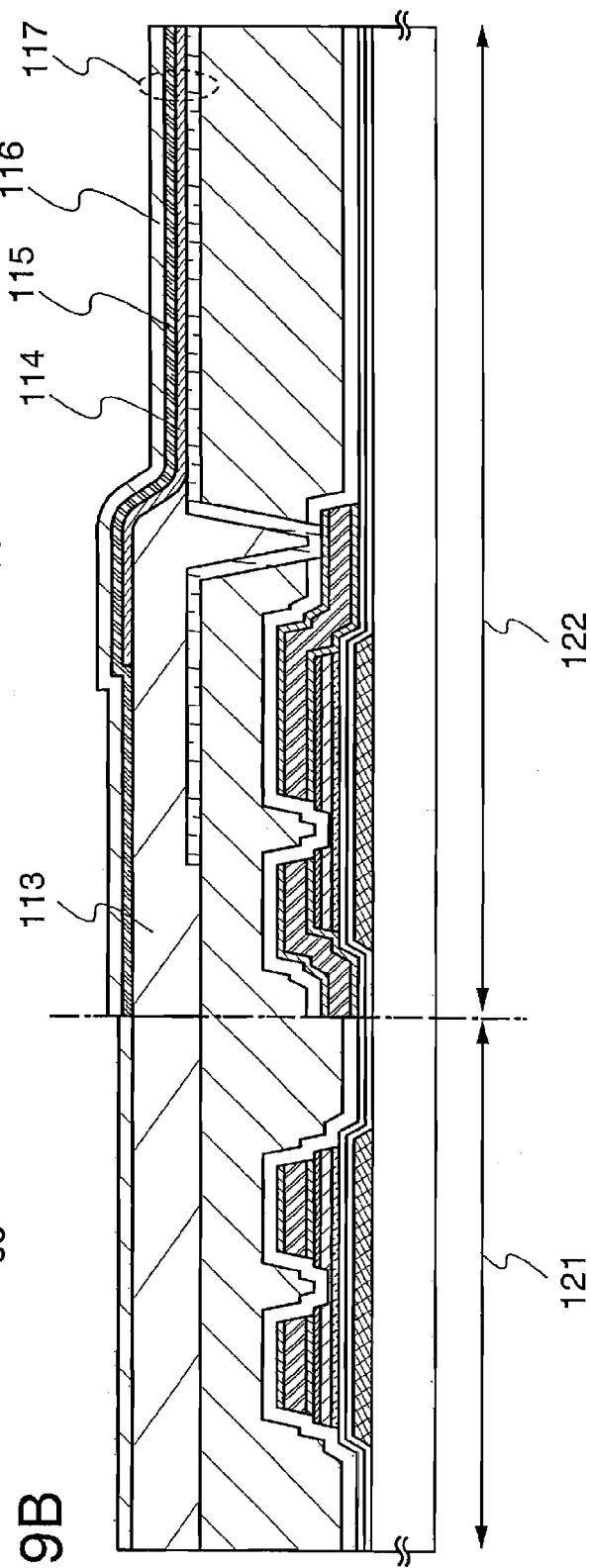

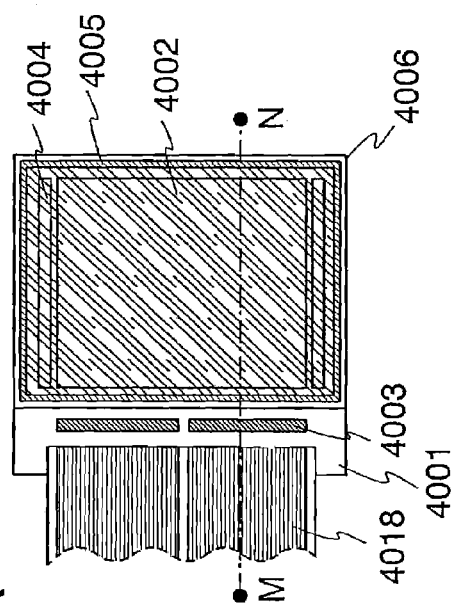
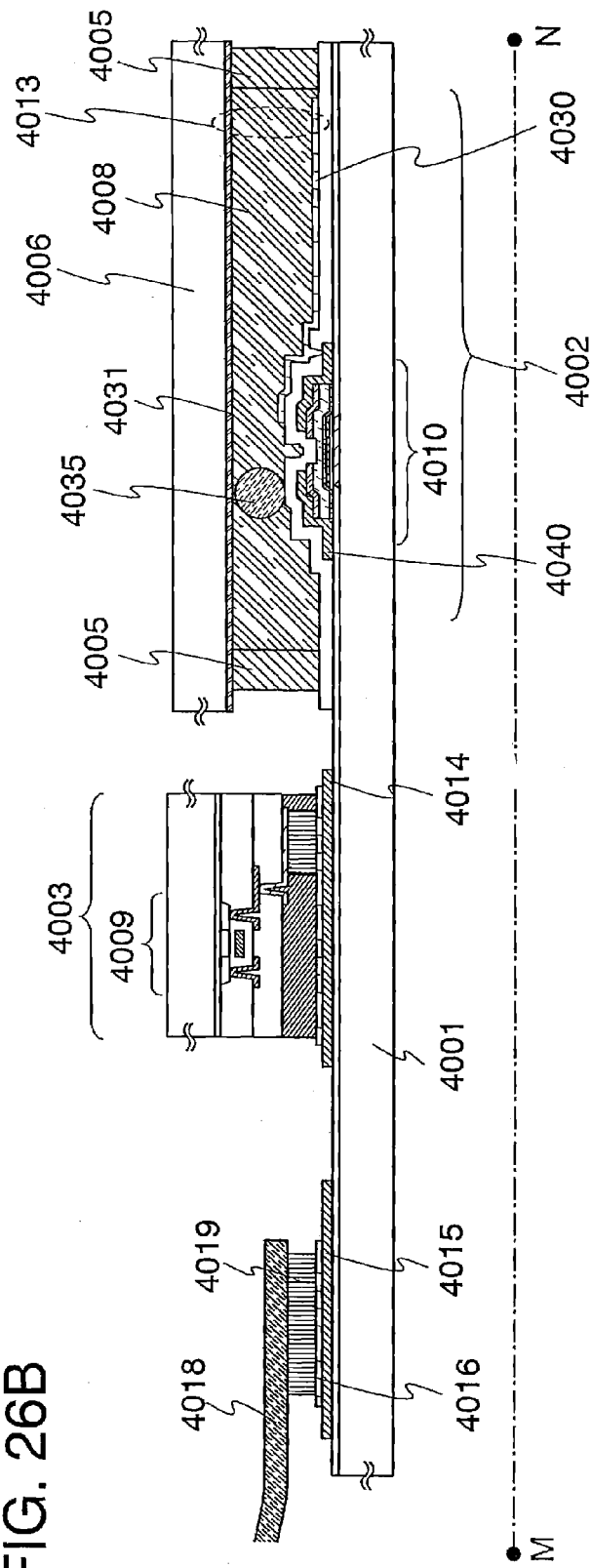
FIG. 26A
FIG. 26B

METHOD FOR MANUFACTURING SEMICONDUCTOR DEVICE

BACKGROUND OF THE INVENTION

1. Field of the Invention

The present invention relates to a display device using a thin film transistor at least for a pixel portion.

2. Description of the Related Art

In recent years, a technique that is used to form thin film transistors using semiconductor thin films (with thicknesses of from several nanometers to several hundreds of nanometers, approximately) formed over substrates having an insulating surface has been attracting attention. Thin film transistors are applied to a wide range of electronic devices such as ICs or electro-optical devices, and prompt development of thin film transistors that are to be used as switching elements in image display devices, in particular, is being pushed.

As a switching element in an image display device, a thin film transistor using an amorphous semiconductor film, a thin film transistor using a polycrystalline semiconductor film, or the like is used. As a method for forming a polycrystalline semiconductor film, there is known a technique in which a pulsed excimer laser beam is shaped into a linear laser beam by an optical system and an amorphous silicon film is scanned and irradiated with the linear beam so as to crystallize the amorphous silicon film.

As a switching element in an image display device, further, a thin film transistor using a microcrystalline semiconductor film is used (see Reference 1: Japanese Published Patent Application No. H4-242724; and Reference 2: Japanese Published Patent Application No. 2005-49832).

SUMMARY OF THE INVENTION

A thin film transistor using a polycrystalline semiconductor film has an advantage in that mobility is higher than that of a thin film transistor using an amorphous semiconductor film by two or more digits, and a pixel portion and a peripheral driver circuit of a display device can be formed over one substrate. However, the thin film transistor using a polycrystalline semiconductor film requires a more complicated process than the thin film transistor using an amorphous semiconductor film because of crystallization of the semiconductor film. Thus, there are problems such as a reduction in yield and an increase in cost.

In view of the above problems, it is an object of the present invention to provide a method for manufacturing a display device having a thin film transistor which has excellent electric characteristics and high reliability, with high mass productivity.

In a display device having an inversely-staggered thin film transistor with a channel-etched structure in which a microcrystalline semiconductor film is used for a channel formation region, the inversely-staggered thin film transistor has a structure in which a gate insulating film is formed over a gate electrode, a microcrystalline semiconductor film (also referred to as a semi-amorphous semiconductor film) serving as a channel formation region is formed over the gate insulating film, a buffer layer is formed over the microcrystalline semiconductor film, a pair of a source region and a drain region is formed over the buffer layer, and a pair of a source electrode and a drain electrode is formed in contact with the source and drain regions. In the above description, a surface of the gate insulating film over which the microcrystalline semiconductor film is formed is subjected to hydrogen plasma according to the present invention.

By the formation of the microcrystalline semiconductor film over the gate insulating film which has been (or which is being) subjected to hydrogen plasma, a microcrystalline nucleus is generated on a surface of the gate insulating film and crystal growth can be accelerated.

The hydrogen plasma treatment with respect to the surface of the gate insulating film can be performed by increasing the flow rate ratio of hydrogen to a silicon gas in a deposition gas including hydrogen and a silicon gas (a silicon hydride gas or a silicon halide gas) which forms the microcrystalline semiconductor film. The flow rate of a silicon gas is increased and the flow rate of hydrogen is decreased, so that the flow rate ratio of hydrogen to a silicon gas is decreased as film formation proceeds. Thus, the microcrystalline semiconductor film is formed. For example, the microcrystalline semiconductor film may be formed in such a way that the flow rate ratio of hydrogen to a silicon gas is approximately set to be 1000:1 at the time of starting film formation, and the flow rate of a silicon gas is increased and the flow rate of hydrogen is decreased until the flow rate ratio of hydrogen to a silicon gas is approximately 50:1 at the time of terminating film formation. The flow rate of hydrogen and a silicon gas may be controlled in a phased manner by varying the flow rate in each given period, or may be controlled continuously. Further, time for performing hydrogen plasma treatment may be provided in which, immediately after film formation is started, a silicon gas is not supplied and only hydrogen is supplied as a deposition gas.

In the above description, the flow rate of hydrogen and a silicon gas is further controlled, and hydrogen is decreased and a silicon gas is increased so that the flow rate ratio of hydrogen to a silicon gas is decreased. Thus, a buffer layer can be successively formed over the microcrystalline semiconductor film. The buffer layer can be formed over the microcrystalline semiconductor film without exposing a surface of the microcrystalline semiconductor film to the atmosphere. The buffer layer may be formed only by a silicon gas by setting the flow rate ratio of hydrogen to a silicon gas to 1 or less so that the flow rate of hydrogen may be further reduced.

Further, hydrogen plasma treatment and a step of forming a microcrystalline semiconductor film may be separately performed. A surface of the gate insulating film may be subjected to hydrogen plasma treatment, and a microcrystalline semiconductor film may be formed using a deposition gas over the gate insulating film which has been subjected to hydrogen plasma treatment. In this case, the flow rate of hydrogen and a silicon gas in a deposition gas is not necessarily controlled.

The gate insulating film, the microcrystalline semiconductor film, the buffer layer, and a semiconductor film to which an impurity imparting one conductivity type is added which forms a source and drain regions may be formed in either one reaction chamber or reaction chambers which are different according to a kind of a film.

Before a substrate is carried in a reaction chamber to perform film formation, it is preferable to perform cleaning, flush (washing) treatment (hydrogen flush using hydrogen as a flush substance, silane flush using silane (a silane gas) as a flush substance, or the like), or coating in which the inner wall of each reaction chamber is coated with a protective film (the coating is also referred to as pre-coating treatment). Pre-coating treatment is treatment in which plasma treatment is performed by flowing of a deposition gas in a reaction chamber to coat the inner wall of the reaction chamber with a thin protective film which is a film to be formed, in advance. By the flush treatment and the pre-coating treatment, a film to be formed can be prevented from being contaminated by an impurity such as oxygen, nitrogen, or fluorine in the reaction chamber.

As the buffer layer, an amorphous semiconductor film is used, and preferably, an amorphous semiconductor film including any one or more of nitrogen, hydrogen, and halogen is used. When any one of nitrogen, hydrogen, and halogen is included in an amorphous semiconductor film, oxidization of a crystal included in a microcrystalline semiconductor film can be suppressed. Energy gap Eg of a microcrystalline semiconductor film is 1.1 eV to 1.5 eV, whereas energy gap Eg of a buffer layer is 1.6 eV to 1.8 eV, which is large. In contrast, mobility of a buffer layer is small. The mobility of a buffer layer is typically a fifth to a tenth as large as that of a microcrystalline semiconductor film. Accordingly, a channel formation region is a microcrystalline semiconductor film, and a buffer layer is a high-resistant region. Note that the concentration of each of carbon, nitrogen, and oxygen which are included in the buffer layer and the microcrystalline semiconductor film may be set to $3 \times 10^{19}$ cm$^{-3}$ or less, preferably $5 \times 10^{18}$ cm$^{-3}$ or less. The thickness of the buffer layer may be 2 nm to 50 nm (preferably 10 nm to 30 nm).

The buffer layer can be formed by a plasma CVD method, a sputtering method, or the like. Further, after the amorphous semiconductor film is formed, a surface of the amorphous semiconductor film is subjected to treatment by nitrogen plasma, hydrogen plasma, or halogen plasma, so that the surface of the amorphous semiconductor film is nitrided, hydrogenated, or halogenated.

When the buffer layer is provided over the microcrystalline semiconductor film, oxidation of crystal grains included in the microcrystalline semiconductor film can be suppressed; thus, degradation of electric characteristics of a thin film transistor can be reduced.

The microcrystalline semiconductor film can be directly formed over a substrate, unlike a polycrystalline semiconductor film. In specific, a film can be formed using silicon hydride as a source gas by a microwave plasma CVD apparatus with a frequency of 1 GHz or more. A microcrystalline semiconductor film formed by the above-described method includes a microcrystalline semiconductor film including crystal grains of 0.5 mu to 20 nm in an amorphous semiconductor film. Accordingly, it is not necessary to provide a step of crystallization after a semiconductor film is formed, unlike the case of using a polycrystalline semiconductor film. The number of steps in manufacturing a thin film transistor can be reduced, a yield of a display device can be increased, and cost can be reduced. Further, plasma using a microwave with a frequency of 1 GHz or more has high electron density, and silicon hydride which is a source gas can be easily dissociated. Therefore, a microcrystalline semiconductor film can be easily formed as compared to a microwave plasma CVD method with a frequency of several tens of megahertz to several hundreds of megahertz, and a deposition rate can be increased. Thus, mass productivity of display devices can be enhanced.

A thin film transistor (TFT) is manufactured using a microcrystalline semiconductor film, and a display device is manufactured using the thin film transistor for a pixel portion, and further, for a driver circuit. The thin film transistor using a microcrystalline semiconductor film has a mobility of 1 cm$^2$/V·sec to 20 cm$^2$/V·sec, which is 2 to 20 times higher than that of a thin film transistor using an amorphous semiconductor film. Accordingly, part of a driver circuit or the entire driver circuit can be formed over the same substrate as a pixel portion, so that a system-on-panel can be manufactured.

One aspect of a method for manufacturing a display device of the present invention is a method for manufacturing a display device having a bottom-gate thin film transistor in which a microcrystalline semiconductor film is used as a channel formation region, including the steps of forming a microcrystalline semiconductor film by introducing a silicon hydride gas or a silicon halide gas when a surface of a gate insulating film is subjected to hydrogen plasma to generate a crystalline nucleus over a surface of the gate insulating film, and by increasing the flow rate of the silicon hydride gas or the silicon halide gas on a timely basis; and depositing an amorphous semiconductor film as a buffer layer over the microcrystalline semiconductor film without exposing a growing surface of the microcrystalline semiconductor film to atmosphere.

Another aspect of a method for manufacturing a display device of the present invention is a method for manufacturing a display device having a bottom-gate thin film transistor in which a microcrystalline semiconductor film is used for a channel formation region, including the steps of subjecting a surface of a gate insulating film to hydrogen plasma; forming a microcrystalline semiconductor film by introducing a silicon hydride gas or a silicon halide gas to generate a crystalline nucleus over the surface of the gate insulating film which has been subjected to hydrogen plasma; and depositing an amorphous semiconductor film as a buffer layer over the microcrystalline semiconductor film without exposing a growing surface of the microcrystalline semiconductor film to atmosphere.

The display device includes a display element. As the display element, a liquid crystal display element or a light-emitting element can be used. Examples of a light-emitting element include, in its category, an element whose luminance is controlled with current or voltage, specifically, an inorganic electroluminescence (EL) element, an organic EL element, an electron source element (electron-emissive element) used for a field emission display (FED), and the like. Further, a display medium whose contrast is changed by an electric effect, such as an electronic ink, can be used.

In addition, the display device includes a panel in which a display element is sealed, and a module in which an IC and the like including a controller are mounted on the panel. The present invention further relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a display device, or a light source (including a lighting device). Further, the display device includes any of the following modules hi its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

According to the present invention, a display device having a thin film transistor with excellent electric characteristics and high reliability can be manufactured.

BRIEF DESCRIPTION OF THE DRAWINGS

In the accompanying drawings:

FIGS. 9A and 9B are explanatory diagrams of a display device of the present invention;

FIGS. 26A and 26B are explanatory diagrams of a display device of the present invention.

DETAILED DESCRIPTION OF THE INVENTION

Embodiment Mode

Figure 1A:
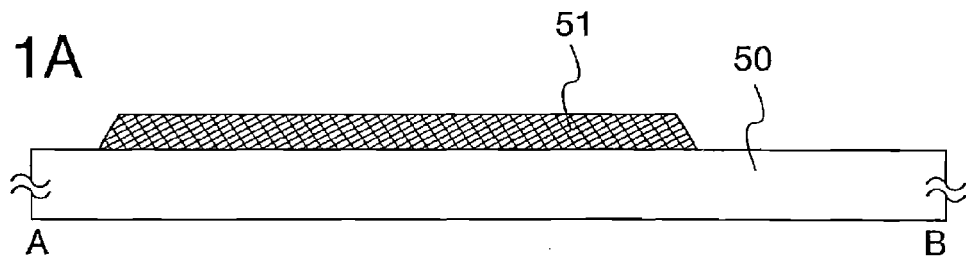
FIGS. 1A to 1E are explanatory diagrams of a method for manufacturing a display device of the present invention.

Embodiment modes of the present invention are described in detail with reference to drawings. However, the present invention is not limited to descriptions below, and it is easily understood by those skilled in the art that modes and details can be modified in various ways without departing from the purpose and the scope of the present invention. Therefore, the present invention should not be interpreted as being limited to the description of the embodiment modes given below. In the structure of the present invention which is described below, the same reference numerals are commonly given to the same components or components having the same function in the structure of the invention, and a repetitive explanation will be omitted.

Embodiment Mode 1

This embodiment mode describes a manufacturing process of a thin film transistor used for a display device, with reference to FIGS. 1A to 1E, FIGS. 2A to 2D, FIGS. 3A and 3B, and FIGS. 4A to 4D. FIGS. 1A to 1E, FIGS. 2A to 2D, and FIGS. 3A and 3B are cross-sectional views illustrating a manufacturing process of a thin film transistor. FIGS. 4A to 4D are plan views of a connection region of a thin film transistor and a pixel electrode in one pixel, and FIGS. 1A to 1E, FIGS. 2A to 2D, and FIGS. 3A and 3B are cross-sectional views illustrating a manufacturing process of a thin film transistor which are taken along line A-B in FIGS. 4A to 4D.

As for a thin film transistor having a microcrystalline semiconductor film, an n-type thin film transistor has higher mobility than a p-type thin film transistor; thus, an n-type thin film transistor is more suitable for a driver circuit. However, in the present invention, either an n-type or p-type thin film transistor can be used. With either polarity of a thin film transistor, it is preferable that all the thin film transistors formed over one substrate have the same polarity so that the number of manufacturing steps is reduced. Here, description is made using an n-channel thin film transistor.

Figure 4A:
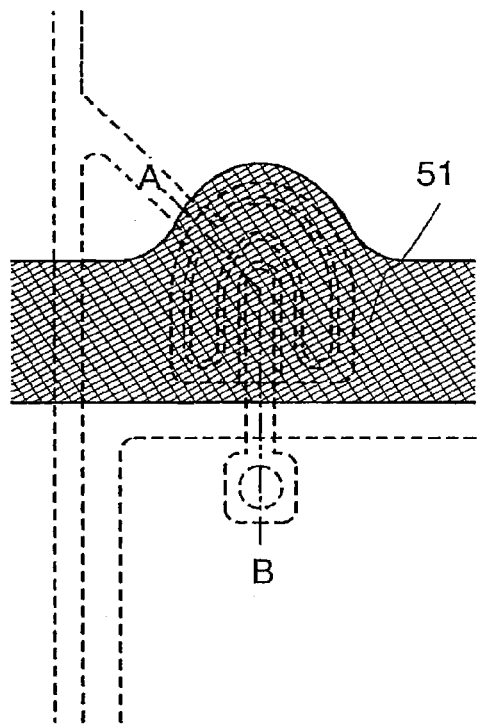
FIGS. 4A to 4D are explanatory diagrams of a method for manufacturing a display device of the present invention.
Figure 4B:
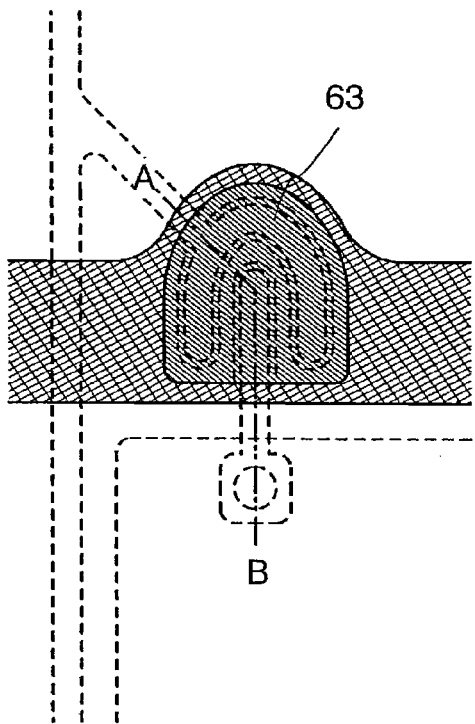
Figure 4C:
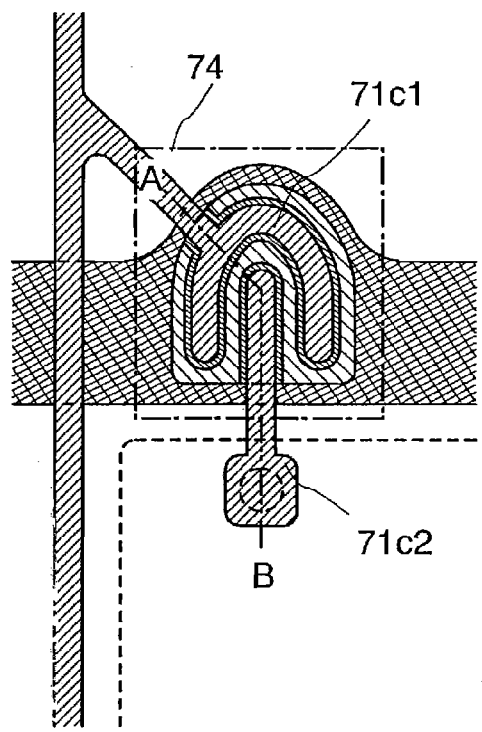
Figure 4D:
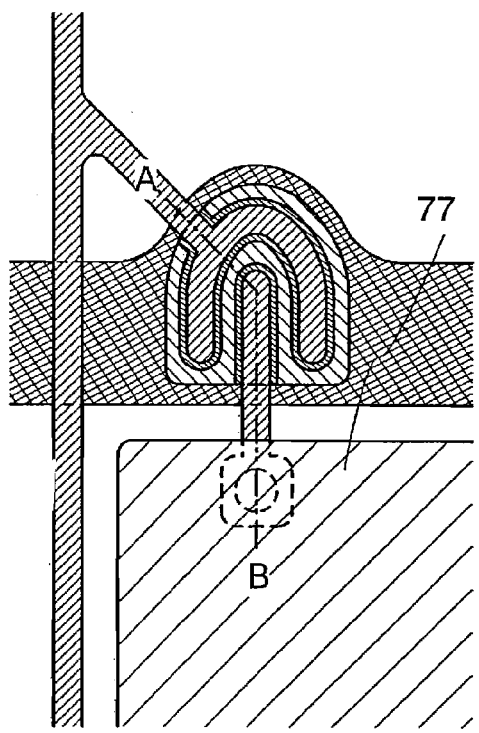

A gate electrode 51 is formed over a substrate 50 (see FIGS. 1A and 4A). As the substrate 50, a plastic substrate having heat resistance that can withstand a processing temperature of the present manufacturing process, or the like as well as a non-alkaline glass substrate manufactured by a fusion method or a float method such as a substrate of barium borosilicate glass, aluminoborosilicate glass, or aluminosilicate glass, and a ceramic substrate can be used. Alternatively, a metal substrate such as a stainless steel alloy substrate, which is provided with an insulating film over the surface, may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrode 51 is formed from a metal material such as titanium, molybdenum, chromium, tantalum, tungsten, or aluminum, or an alloy material thereof. The gate electrode 51 can be formed in the following manner: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrode 51 can be formed by discharging a conductive nanopaste of silver, gold, copper, or the like by an ink-jet method and baking it. Note that a nitride film formed from the above metal material may be provided as, a barrier metal for improving adherence of the gate electrode 51 and preventing diffusion to a base, between the substrate 50 and the gate electrode 51.

Since semiconductor films and wirings are formed over the gate electrode 51, the gate electrode 51 is preferably processed to have tapered end portions so that the semiconductor films and the wirings thereover are not disconnected. Further, although not illustrated, wirings connected to the gate electrodes can also be concurrently formed in this step.

Figure 1B:
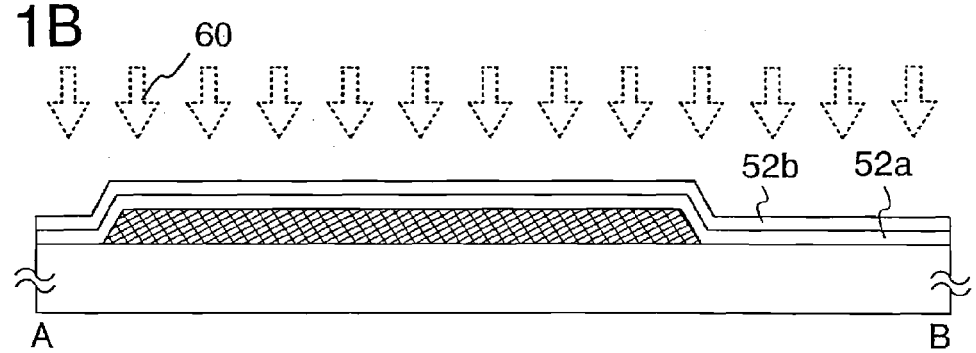
Figure 1C:
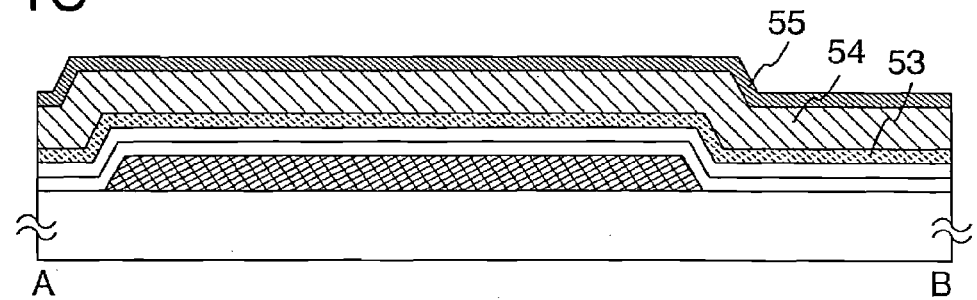

Next, gate insulating films 52a and 52b, a microcrystalline semiconductor film 53, a buffer layer 54, and a semiconductor film 55 to which an impurity imparting one conductivity type is added are formed in this order over the gate electrode 51 (see FIG. 1C).

In the present invention, the microcrystalline semiconductor film 53 is formed over the surface of the gate insulating film 52b when the surface of the gate insulating film 52b is subjected to hydrogen plasma 60 (see FIG. 1B).

By the formation of the microcrystalline semiconductor film over the gate insulating film which has been subjected to hydrogen plasma, crystal growth of a microcrystal can be promoted because, by the hydrogen plasma, a surface of the gate insulating film can be terminated by hydrogen and inactivated. Therefore, the resulting microcrystalline semiconductor film can be made to have high electric characteristics and high reliability.

The hydrogen plasma treatment with respect to the surface of the gate insulating film 52b can be performed by increasing the flow rate ratio of hydrogen to a silicon gas in a deposition gas including hydrogen and a silicon gas (a silicon hydride gas or a silicon halide gas) which forms the microcrystalline semiconductor film 53. The flow rate of a silicon gas is increased and the flow rate of hydrogen is decreased so that the flow rate ratio of hydrogen to a silicon gas is decreased as film formation proceeds. Thus, the microcrystalline semiconductor film 53 is formed. For example, the microcrystalline semiconductor film 53 may be formed in such a way that the flow rate ratio of hydrogen to a silicon gas is approximately set to be 1000:1 at the time of starting film formation, and the flow rate of a silicon gas is increased and the flow rate of hydrogen is decreased until the flow rate ratio of hydrogen to a silicon gas is approximately 50:1 at the time of terminating film formation. The flow rate of hydrogen and a silicon gas may be controlled in a phased manner by varying the flow rate in each given period, or may be controlled continuously. Further, time for performing hydrogen plasma treatment may be provided in which, immediately after film formation is started, a silicon gas is not supplied (that is, the flow rate of a silicon gas is set to 0) and only hydrogen is supplied as a deposition gas. For example, silane can be used as a silicon gas.

In this embodiment mode, the flow rate of hydrogen and a silicon gas is further controlled, and hydrogen is decreased and a silicon gas is increased so that the flow rate ratio of hydrogen to a silicon gas is decreased. Thus, a buffer layer is successively formed over the microcrystalline semiconductor film. A step of forming the buffer layer may be performed almost only by a silicon gas (a silicon hydride gas or a silicon halide gas) with the flow rate of hydrogen further decreased. An amorphous semiconductor film can be formed, as the buffer layer, over the microcrystalline semiconductor film without exposing a growing surface of the microcrystalline semiconductor film 53 to the atmosphere.

The treatment using hydrogen plasma 60 performed on the surface of the gate insulating film 52b, the formation of the microcrystalline semiconductor film 53, and the formation of the buffer layer 54 can be successively carried out by control of the flow rate ratio of hydrogen to a silicon gas in a deposition gas of the microcrystalline semiconductor film 53. The flow rate of hydrogen and a silicon gas may be controlled in the following manner: for example, the flow rate ratio of hydrogen to a silicon gas is set to be 1000:1 at the time of starting the formation of the microcrystalline semiconductor film, and the flow rate of hydrogen is gradually decreased but the flow rate of a silicon gas is gradually increased so that the flow ratio of hydrogen to a silicon gas is approximately 50:1 at the time of terminating the formation of the microcrystalline semiconductor film 53.

Next, a mask 56 is formed over the semiconductor film 55 to which an impurity imparting one conductivity type is added. Note that at least the gate insulating films 52a and 52b, the microcrystalline semiconductor film 53, and the buffer layer 54 may be successively formed. Further, the gate insulating films 52a and 52b, the microcrystalline semiconductor film 53, the buffer layer 54, and the semiconductor film 55 to which an impurity imparting one conductivity type is added may be successively formed. At least the gate insulating films 52a and 52b, the microcrystalline semiconductor film 53, and the buffer layer 54 are successively formed without being exposed to the atmosphere, whereby each interface of a stack of layers can be formed without being contaminated by an atmospheric component or by a contamination impurity element contained in the atmosphere. Thus, variations in characteristics of thin film transistors can be reduced.

Each of the gate insulating films 52a and 52b can be formed of a silicon oxide film, a silicon nitride film, a silicon oxynitride film, or a silicon nitride oxide film by a CVD method, a sputtering method, or the like. Here, a mode is described in which either a silicon oxide film or a silicon oxynitride film and either a silicon nitride film or a silicon nitride oxide film are stacked in this order as the gate insulating films 52a and 52b. Note that the gate insulating film can be formed by stacking not two layers but three layers of either a silicon nitride film or a silicon nitride oxide film, either a silicon oxide film or a silicon oxynitride film, and either a silicon nitride film or a silicon nitride oxide film in this order from the substrate side. Alternatively, the gate insulating film can be formed of a single layer selected from a silicon oxide film, a silicon nitride film, a silicon oxynitride film, or a silicon nitride oxide film. Further, the gate insulating film is preferably formed by a microwave plasma CVD apparatus with a frequency of 1 GHz. A silicon oxynitride film or a silicon nitride oxide film which is formed by a microwave plasma CVD apparatus has high dielectric strength, and thus, reliability of a thin film transistor to be formed later can be increased.

Here, a silicon oxynitride film means a film that contains more oxygen than nitrogen, and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively, as the composition. Further, a silicon nitride oxide film means a film that contains more nitrogen than oxygen, and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively, as the composition.

The microcrystalline semiconductor film 53 is a film having an intermediate structure between an amorphous structure and a crystalline structure (including a single crystalline and polycrystalline structure). This semiconductor is a semiconductor having a third state which is stable in terms of free energy, and it is a crystalline substance including a short range order and lattice distortion, the crystal grain size of which can be 0.5 to 20 nm dispersed in a non-single crystal semiconductor film. Microcrystalline silicon, which is a typical example of a microcrystalline semiconductor, has a Raman spectrum which is shifted to a lower wave number side than 521 $cm^{-1}$ that represents single-crystal silicon. That is, the peak of a Raman spectrum of microcrystalline silicon exists between 521 $cm^{-1}$ that represents single crystalline silicon and 480 $cm^{-1}$ that represents amorphous silicon. In addition, microcrystalline silicon is made to contain hydrogen or halogen of at least 1 at. % or more for termination of dangling bonds. Moreover, microcrystalline silicon is made to contain a rare gas element such as helium, argon, krypton, or neon to further enhance lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements selected from helium, argon, krypton, or neon in addition to silicon hydride and hydrogen, the microcrystalline semiconductor film can be formed. In that case, the flow rate ratio of hydrogen to silicon hydride is set to be 5:1 to 200:1, preferably 50:1 to 150:1, more preferably 100:1.

A microcrystalline semiconductor film exhibits weak n-type conductivity when an impurity element for valence control is not intentionally added. Thus, threshold control of a microcrystalline semiconductor film which serves as a channel formation region of a thin film transistor can be achieved by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a proportion of 1 ppm to 1000 ppm, preferably 1 ppm to 100 ppm. The concentration of boron may be set to be, for example, $1\times10^{14}$ atoms/cm$^3$ to $6\times10^{16}$ atoms/cm$^3$.

Further, the oxygen concentration of the microcrystalline semiconductor film is preferably set to $5\times10^{19}$ cm$^{-3}$, more preferably $1\times10^{19}$ cm$^{-3}$ or less, and each of the nitrogen concentration and the carbon concentration of the microcrystalline semiconductor film is preferably set to $1\times10^{18}$ cm$^{-3}$ or less. By decreases in concentrations of oxygen, nitrogen, and carbon to be mixed into the microcrystalline semiconductor film, the microcrystalline semiconductor film can be prevented from being changed into an n type.

The microcrystalline semiconductor film 53 is formed to a thickness of greater than 0 nm and less than or equal to 50 nm, preferably greater than 0 nm and less than or equal to 20 nm. The microcrystalline semiconductor film 53 serves as a channel formation region of a thin film transistor which is formed later. When the microcrystalline semiconductor film 53 is formed to a thickness within the above-described range, a thin film transistor to be formed later is to be a fully depleted type. Further, since the microcrystalline semiconductor film includes a microcrystal, the microcrystalline semiconductor film has lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a display device with less variation of electrical characteristics can be manufactured.

Further, the microcrystalline semiconductor film has higher mobility than an amorphous semiconductor film. Thus, when, as a switch of a display element, a thin film transistor in which a channel formation region is formed using a microcrystalline semiconductor film is used, the area of the channel formation region, that is, the area of the thin film transistor can be reduced. Accordingly, the area of the thin film transistor in a single pixel is reduced, and thus, the aperture ratio of the pixel can be increased. As a result of this, a device with high resolution can be manufactured.

The microcrystalline semiconductor film has a needle-like crystal which has grown longitudinally from the lower side. The microcrystalline semiconductor film has a mixed structure of amorphous and crystalline structures, and it is likely that a crack is generated and a gap is formed between the crystalline region and the amorphous region due to local stress. A new radical may be interposed into this gap and cause crystal growth. Because the upper crystal face is larger, crystal is likely to grow upward into a needle shape. Even if the microcrystalline semiconductor film grows longitudinally as described above, the growth rate is a tenth to a hundredth of the film formation rate of an amorphous semiconductor film.

The buffer layer 54 can be formed using a silicon gas (a silicon hydride gas or a silicon halide gas) such as $SiH_4$, $Si_2H_6$, $SiH_2Cl_2$, $SiHCl_3$, $SiCl_4$, or $SiF_4$ by a plasma CVD method. Further, an amorphous semiconductor film can be formed by diluting the silicon gas with one or plural kinds of rare gas elements selected from helium, argon, krypton, or neon. With the use of hydrogen at a flow rate which is 1 to 20 times, preferably 1 to 10 times, more preferably 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With the use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed.

Alternatively, as the buffer layer 54, an amorphous semiconductor film can be formed by sputtering with hydrogen or a rare gas using an amorphous semiconductor as a target. In this case, by inclusion of ammonia, nitrogen, or $N_2O$ in an atmosphere, a nitrogen-containing amorphous semiconductor film can be formed. Alternatively, by inclusion of a gas including fluorine, chlorine, bromine, or iodine ($F_2$, $Cl_2$, $Br_2$, $I_2$, HF, HCl, HBr, HI, or the like) in an atmosphere, an amorphous semiconductor film containing fluorine, chlorine, bromine, or iodine can be formed.

Still alternatively, the buffer layer 54 may be formed by formation of an amorphous semiconductor film on the surface of the microcrystalline semiconductor film 53 by a plasma CVD method or a sputtering method and then by hydrogenation, nitridation, or halogenation of the surface of the amorphous semiconductor film through processing of the surface of the amorphous semiconductor film with hydrogen plasma, nitrogen plasma, halogen plasma, or a rare gas (helium, argon, krypton, or neon).

The buffer layer 54 is preferably formed using an amorphous semiconductor film which does not contain crystal grains. Therefore, when the buffer layer 54 is formed by a high-frequency plasma CVD method with a frequency of several tens of megahertz to several hundreds of megahertz or a microwave plasma CVD method, formation conditions are preferably controlled so that an amorphous semiconductor film does not contain crystal grains.

In some cases, the buffer layer 54 is partly etched in a later step of formation of source and drain regions. At this time, the buffer layer 54 is preferably formed to a thickness such that part of the buffer layer 54 is left remaining. It is preferable that the buffer layer 54 be typically formed to a thickness of greater than or equal to 150 nm and less than or equal to 400 nm.

By formation of an amorphous semiconductor film, furthermore, an amorphous semiconductor film including hydrogen, nitrogen, or halogen over the surface of the microcrystalline semiconductor film 53, surfaces of crystal grains included in the microcrystalline semiconductor film 53 can be prevented from being naturally oxidized. By formation of the buffer layer over the surface of the microcrystalline semiconductor film 53, microcrystal grains can be prevented from being oxidized.

Further, since the buffer layer 54 is formed using an amorphous semiconductor film or an amorphous semiconductor film including hydrogen, nitrogen, or halogen, the buffer layer 54 has higher resistance than the microcrystalline semiconductor film serving as a channel formation region. Accordingly, in a thin film transistor to be formed later, the buffer layer which is formed between the source and drain regions, and the microcrystalline semiconductor film serves as a high-resistant region. Accordingly, the off current of the thin film transistor can be reduced. When the thin film transistor is used as a switching element of a display device, the contrast of the display device can be improved.

In the case of forming an n-channel type thin film transistor, the semiconductor film 55 to which an impurity imparting one conductivity type is added may be formed in such a way that phosphorus is added as a typical impurity element and an impurity gas such as $PH_3$ is added to silicon hydride. In the case of forming a p-channel thin film transistor, the semiconductor film 55 to which an impurity imparting one conductivity type is added may be formed in such a way that boron is added as a typical impurity element and an impurity gas such as $B_2H_6$ is added to silicon hydride. The semiconductor film 55 to which an impurity imparting one conductivity type is added can be formed using a microcrystalline semiconductor or an amorphous semiconductor. The semiconductor film 55 to which an impurity imparting one conductivity type is added is preferably formed to a thickness of 2 nm to 50 nm (preferably 10 nm to 30 nm).

When the gate insulating films 52a and 52b, the microcrystalline semiconductor film 53, the buffer layer 54, and the semiconductor film 55 to which an impurity imparting one conductivity type is added are successively formed without being exposed to the atmosphere, productivity is improved.

Figure 1D:
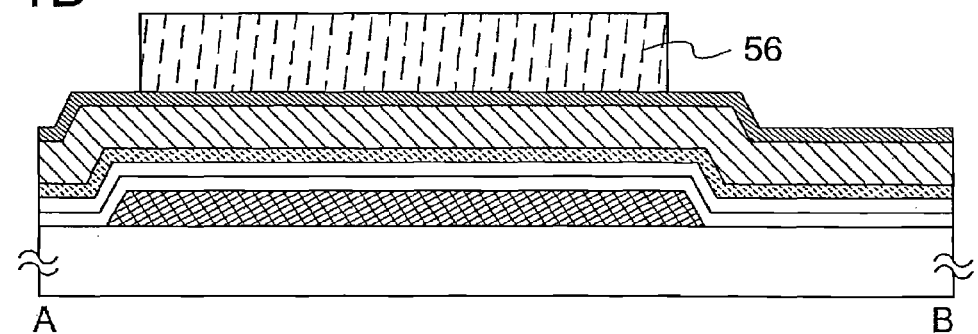
Figure 1E:
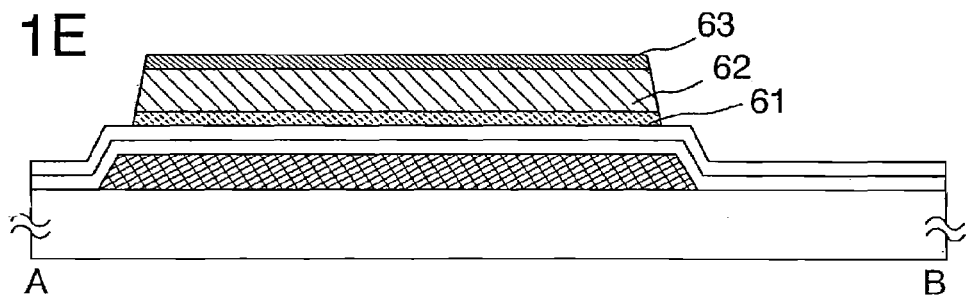

A mask 56 is formed over the microcrystalline semiconductor film 53, the buffer layer 54, and the semiconductor film 55 to which an impurity imparting one conductivity type is added (see FIG. 1D). The mask 56 is formed by a photolithography technique or an ink-jet method.

Subsequently, the microcrystalline semiconductor film 53, the buffer layer 54, and the semiconductor film 55 to which an impurity imparting one conductivity type is added are etched using the mask 56 to be isolated to form a microcrystalline semiconductor film 61, a buffer layer 62, and a semiconductor film 63 to which an impurity imparting one conductivity type is added (see FIG. 1D). Then, the mask 56 is removed. Note that FIG. 1E corresponds to a cross-sectional views taken along line A-B in FIG. 4B.

The end portions of the microcrystalline semiconductor film 61, the buffer layer 62, and the semiconductor film 63 to which an impurity imparting one conductivity type is added are etched to have a tapered shape. Thus, the semiconductor film 63 to which an impurity imparting one conductivity type is added and the microcrystalline semiconductor film 61 can be prevented from being directly in contact with each other. The taper angle of the end portions is 90° to 30°, preferably 80° to 45°. Thus, a distance between the semiconductor film 63 to which an impurity imparting one conductivity type is added and the microcrystalline semiconductor film 61 is increased, so that leakage current can be prevented. Further, disconnection of a wiring due to a step shape can be prevented.

Figure 2A:
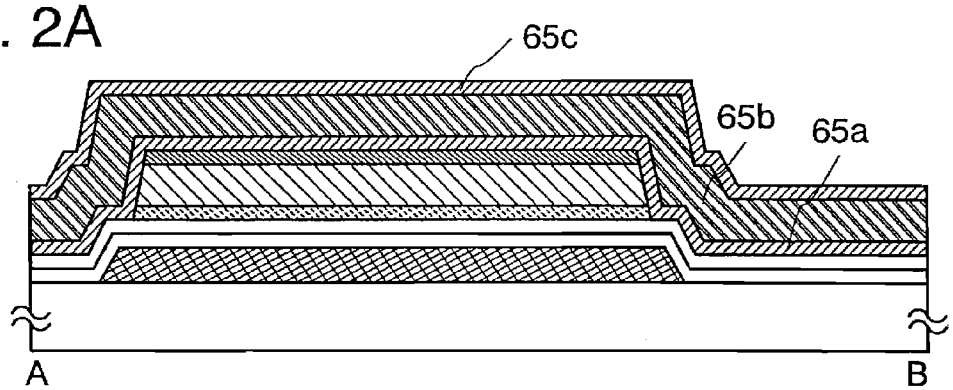
FIGS. 2A to 2D are explanatory diagrams of a method for manufacturing a display device of the present invention.

Subsequently, conductive films 65a to 65c are formed over the semiconductor film 63 to which an impurity imparting one conductivity type is added and the gate insulating film 52b (see FIG. 2A). A mask 66 is formed over the conductive films 65a to 65c.

The conductive film is preferably formed in a single layer or stacked layers of aluminum, copper, or an aluminum alloy to which an element which improves heat resistance or an element which prevents hillock, such as silicon, titanium, neodymium, scandium, or molybdenum is added. Alternatively, a film in contact with the semiconductor film to which an impurity element imparting one conductivity type is added may be formed from titanium, tantalum, molybdenum, or tungsten, or a nitride of such an element, and aluminum or an aluminum alloy may be formed thereover to form a stacked structure. Further alternatively, top and bottom surfaces of aluminum or an aluminum alloy may be each covered with titanium, tantalum, molybdenum, tungsten, or a nitride thereof to form a stacked structure. Here, as the conductive film, description is made on a conductive film having a structure in which three layers of the conductive films 65a to 65c are stacked, that is, stacked conductive films in which a molybdenum film is used for the conductive films 65a and 65c and an aluminum film is used for the conductive film 65b or stacked conductive films in which a titanium film is used for the conductive films 65a and 65c and an aluminum film is used for the conductive film 65b.

The conductive films 65a to 65c are formed by a sputtering method or a vacuum evaporation method. Alternatively, the conductive films 65a to 65c may be formed by discharging a conductive nanopaste of silver, gold, copper, or the like by a screen printing method, an ink-jet method, or the like and baking it.

The mask 66 can be formed in a manner similar to the mask 56.

Figure 2B:
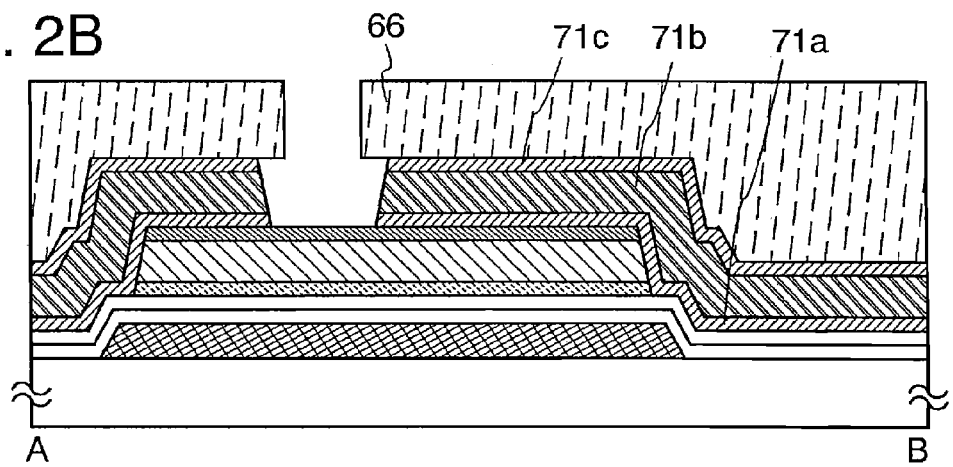

Next, the conductive films 65a to 65c are etched using the mask 66 to be isolated to form source and drain electrodes 71a to 71c (see FIG. 2B). When the conductive films 65a to 65c are subjected to wet etching as in this embodiment mode, the conductive films 65a to 65c are isotropically etched. Thus, end portions of the mask 66 and end portions of the source and drain electrodes 71a to 71c are not aligned, and the end portions of the source and dram electrodes 71a to 71c further recede. Subsequently, the semiconductor film 63 to which an impurity imparting one conductivity type is added and the buffer layer 62 are etched using the mask 66 to form source and drain regions 72 and a buffer layer 73 (see FIG. 2C). Note that the buffer layer 73 is partly etched to cover a surface of the microcrystalline semiconductor film 61.

The buffer layer 73 is partly etched to form a groove between the source and drain electrodes 71a to 71c. The end portions of the groove in the buffer layer 73 are roughly aligned with end portions of the source and drain regions 72. The groove is formed in the same etching process as etching by which the source and drain regions 72 are formed. That is, the groove is formed in a self-aligning process in which the groove almost coincides with an opening of the mask 66 which is the same photoresist mask. When the groove is formed in the buffer layer 73, a region is enlarged in which leakage current flows. Thus, there is an effect of decrease in off current. Further, the groove has an effect that oxygen is prevented from entering the microcrystalline semiconductor film by mixture of hydrogen and/or fluorine in the groove.

The buffer layer 73 has a thickness of 200 nm to 300 nm. The groove in the buffer layer 73 is a region which is shaped into a groove to separate the source and drain regions and to decrease leakage current between the source and drain regions. Further, the buffer layer 73 has such a remaining thickness as to be able to prevent the microcrystalline semiconductor film below from being oxidized. A region in which the microcrystalline semiconductor film overlaps with the source and drain regions has a thickness of 200 nm to 300 nm as described above so that a high-resistant region is formed which can improve dielectric strength.

Figure 2C:
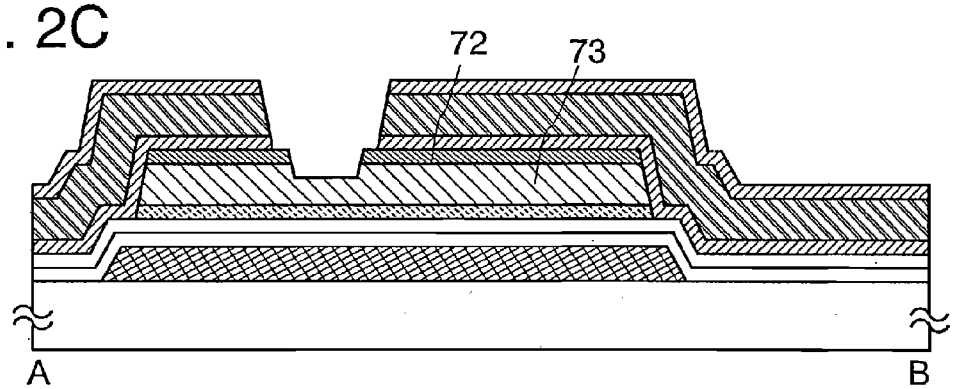
Figure 2D:
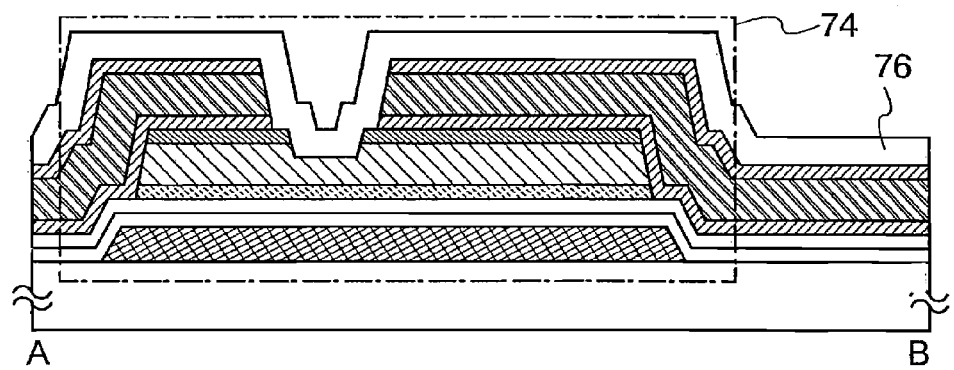

The end portions of the source and drain electrodes 71a to 71c are not aligned with the end portions of the source and drain regions 72. The end portions of the source and drain regions 72 are formed so as to be projected beyond the end portions of the source and drain electrodes 71a to 71c. Subsequently, the mask 66 is removed. Note that FIG. 2C corresponds to a cross-sectional view taken along line A-B in FIG. 4C. As shown in FIG. 2C, the end portions of the source and drain regions 72 are projected beyond the source and drain electrodes 71c. Further, one of the source and drain electrodes also serves as a source wiring or a drain wiring.

As shown in FIG. 2C, the end portions of the source and drain electrodes 71a to 71c are not aligned with the end portions of the source and drain regions 72. Thus, the end portions of the source and drain electrodes 71a to 71c are apart from each other; accordingly, leakage current and short circuit between the source and drain electrodes can be prevented. Therefore, a thin film transistor with high reliability and high dielectric strength can be manufactured.

Through the above-described steps, a thin film transistor 47 of channel-etched type can be manufactured.

The buffer layer 73 below the source and drain regions 72 and the buffer layer 73 above the channel formation region of the microcrystalline semiconductor film 61 are concurrently formed from the same material (the concentration of each of carbon, nitrogen, and oxygen is $3 \times 10^{19}$ cm$^{-3}$ or less, preferably $5 \times 10^{18}$ cm$^{-3}$ or less) and have a groove. The buffer layer 73 above the channel formation region of the microcrystalline semiconductor film 61 blocks external air and an etching residue with hydrogen included therein and protects the microcrystalline semiconductor film 61. The buffer layer 73 below the source and drain regions 72 is formed from the same material and extends to overlap with the microcrystalline semiconductor film 61 which forms the channel formation region. Further, the buffer layer is made thick; thus, even when a groove is formed, the microcrystalline semiconductor film can be stabilized because the buffer layer exists below the groove.

The buffer layer 73 prevents the generation of a parasitic channel and also serves as a stopper in etching for the source and drain regions. The buffer layer 73 can stop radicals in etching. If a structure is such that the buffer layer 73 is not provided and only the microcrystalline semiconductor film 61 is provided, oxidation occurs in the thickness direction and electric characteristics of a transistor are impaired. Thus, characteristics become worse, and mobility is decreased and a subthreshold swing (S value) is increased. Further, as the buffer layer 73, an amorphous silicon film is effective for preventing oxidation. Even if the groove is formed, the surface is terminated with hydrogen; thus, oxidation can be prevented.

Further, the buffer layer 73 is etched so that the groove is formed. Accordingly, the semiconductor film thereover, to which an impurity imparting one conductivity type is added, is completely removed. Thus, a parasitic channel can be prevented from being generated by an impurity imparting one conductivity type, such as phosphorus, which is a residue.

The buffer layer 73 which does not include an impurity imparting one conductivity type is provided, whereby an impurity imparting one conductivity type, which is included in the source and drain regions, and an impurity imparting one conductivity type, which is used for controlling threshold voltage of the microcrystalline semiconductor film, can be prevented from being mixed to each other. When impurities imparting one conductivity type are mixed with each other, a recombination center is generated, which leads to flow of leakage current and loss of the effect of reducing off current.

By provision of the buffer layer as described above, a thin film transistor with high dielectric strength, in which leakage current is reduced, can be manufactured. Accordingly, the thin film transistor has high reliability and can be suitably used for a liquid crystal display device where a voltage of 15 V is applied.

Figure 3A:
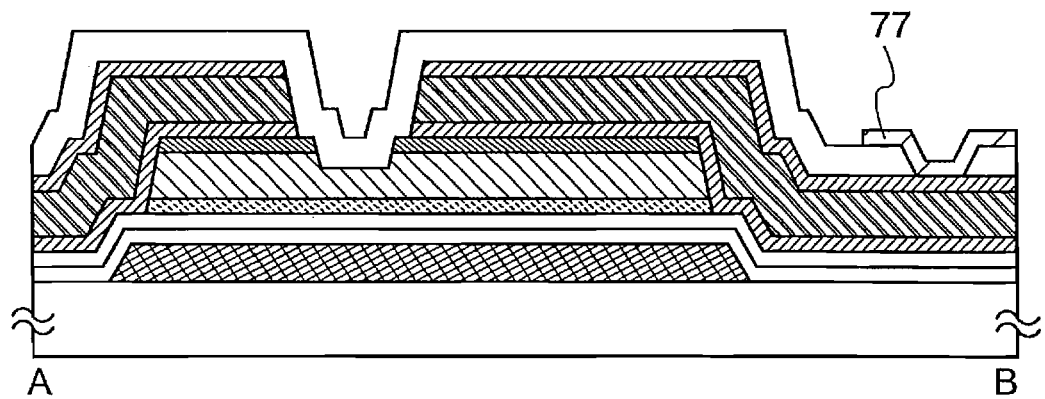
FIGS. 3A and 3B are explanatory diagrams of a method for manufacturing a display device of the present invention.

Next, an insulating film 76 is formed over the source and drain electrodes 71a to 71c, the source and drain regions 72, the microcrystalline semiconductor film 61, and the gate insulating film 52b (see FIG. 3A). The insulating film 76 can be formed in a manner similar to the gate insulating films 52a and 52b. Note that the insulating film 76 prevents intrusion of a contaminating impurity such as an organic matter, a metal matter, or water vapor contained in the atmosphere; thus, a dense film is preferably used for the insulating film 76. Further, the insulating film 76 is formed of a silicon nitride film; thus, the oxygen concentration of the buffer layer 73 can be set to $5 \times 10^{19}$ atoms/cm$^3$ or less, preferably $1 \times 10^{19}$ atoms/cm$^3$ or less.

Subsequently, a contact hole is formed in the insulating film 76. In the contact hole, a pixel electrode 77 is formed in contact with the source electrode or drain electrode 71c. Note that FIG. 3A corresponds to a cross-sectional view taken along line A-B in FIG. 4D.

A conductive material having a light-transmitting property, such as indium oxide which includes tungsten oxide, indium zinc oxide which includes tungsten oxide, indium oxide which includes titanium oxide, indium tin oxide which contains titanium oxide, indium tin oxide (hereinafter, referred to as ITO), indium zinc oxide, or indium tin oxide to which silicon oxide has been added, can be used for the pixel electrode 77.

Further, the pixel electrode 77 can be formed using a conductive composition including a conductive high molecule (also referred to as a conductive polymer). As for the pixel electrode formed using a conductive composition, the sheet resistance is preferably less than or equal to 10000 Ω/square and the light transmittance at a wavelength of 550 nm is preferably greater than or equal to 70%. Furthermore, the resistivity of a conductive high molecule included in the conductive composition is preferably equal to or less than 0.1 Ω·cm.

As a conductive high molecule, a so-called π electron conjugated conductive high molecule can be used. For example, polyaniline or a derivative thereof, polypyrrole or a derivative thereof, polythiophene or a derivative thereof, or a copolymer of two or more kinds of those materials can be given.

Figure 3B:
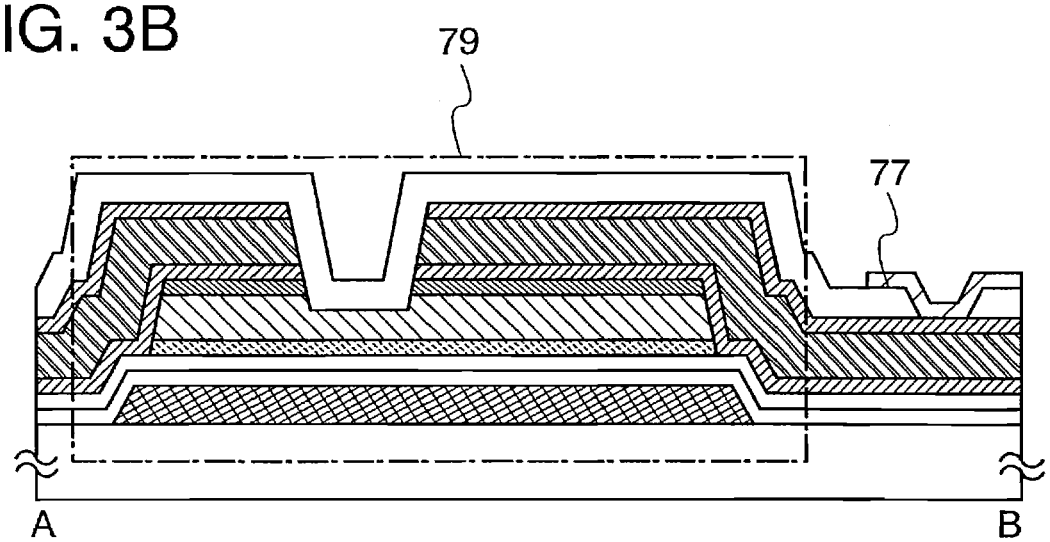

The end portions of the source and drain regions and the end portions of the source and drain electrodes may be aligned with each other. FIG. 3B shows a thin film transistor 79 of channel-etched type in which the end portions of the source and drain regions and the end portions of the source and drain electrodes are aligned with each other. When the source and drain electrodes and the source and drain regions are subjected to dry etching, a shape like the thin film transistor 79 can be obtained. Alternatively, also when the semiconductor film to which an impurity imparting one conductivity type is added is etched using the source and drain electrodes as masks to form the source and drain regions, a shape like the thin film transistor 79 can be obtained.

The thin film transistor of channel-etched type is manufactured through the small number of manufacturing steps; thus, cost can be reduced. Further, when the channel formation region is formed using a microcrystalline semiconductor film, an electron field effect mobility of 1 $cm^2/V \cdot sec$ to 20 $cm^2/V \cdot sec$ can be obtained. Therefore, this thin film transistor can be used as an element for switching a pixel of a pixel portion, furthermore, as an element which forms a driver circuit on the scan line (gate line) side.

According to this embodiment mode, a display device having a thin film transistor with excellent electric characteristics and high reliability can be manufactured.

Embodiment Mode 2

This embodiment mode describes an example in which a step of forming a microcrystalline semiconductor film is different from that in Embodiment Mode 1. Therefore, other steps can be performed in a manner similar to Embodiment Mode 1, and the same portion or a portion having the same function, and the same steps as in Embodiment Mode 1 are not repeatedly explained.

First, the gate electrode 51 is formed over the substrate 50 in a manner similar to Embodiment Mode 1, and the gate insulating films 52a and 52b are formed.

In this embodiment mode, hydrogen plasma treatment performed on the gate insulating film 52b and a step of forming the microcrystalline semiconductor film are separately carried out. First, the hydrogen plasma treatment is performed on the surface of the gate insulating film 52b. The microcrystalline semiconductor film may be formed over the gate insulating film which is subjected to hydrogen plasma treatment, with the use of a deposition gas including hydrogen and a silicon gas (a silicon hydride gas or a silicon chloride gas). In this case, the control of the flow rate of hydrogen and a silicon gas in the deposition gas is not necessarily performed, in which the flow rate of hydrogen is further increased than the flow rate of a silicon gas so that hydrogen plasma treatment can be performed.

The hydrogen plasma treatment and the step of forming the microcrystalline semiconductor film 53 may be performed in one reaction chamber or different reaction chambers. In either case, exposure to the atmosphere is prevented. After the microcrystalline semiconductor film 53 is formed, the buffer layer 54 is formed over the microcrystalline semiconductor film 53.

The microcrystalline semiconductor film is formed over the gate insulating film which has been subjected to hydrogen plasma; thus, the crystal growth of the microcrystal can be promoted. Therefore, the resulting microcrystalline semiconductor film can be made to have high electric characteristics and high reliability.

Embodiment Mode 3

This embodiment mode describes an example in which a step of manufacturing a display device is different from Embodiment Mode 1 or 2. Therefore, other steps can be performed in a manner similar to Embodiment Mode 1 or 2. The same portion or a portion having the same function and the same steps as in Embodiment Mode 1 are not repeatedly explained.

In Embodiment Mode 1, before the microcrystalline semiconductor film is formed, a reaction chamber may be subjected to cleaning and flush (washing) treatment (hydrogen flush using hydrogen as a flush substance, silane flush using silane as a flush substance, or the like). By the flush treatment, a film to be formed can be prevented from being contaminated by an impurity such as oxygen, nitrogen, or fluorine in a reaction chamber.

By the flush treatment, an impurity such as oxygen, nitrogen, or fluorine in a reaction chamber can be removed. For example, flush treatment is performed in the following manner: a plasma CVD apparatus is used, and monosilane is used as a flush substance and introduced into a chamber at a gas flow rate of 8 SLM to 10 SLM for 5 to 20 minutes, preferably 10 to 15 minutes, to perform silane flush treatment. Note that 1 SLM is 1000 sccm, that is, 0.06 $m^3/h$.

The cleaning can be performed with the use of, for example, fluorine radicals. Note that with the use of fluorine radicals, a reaction chamber can be cleaned by introducing carbon fluoride, nitrogen fluoride, or fluorine into a plasma generator provided outside the reaction chamber and dissociating the gas.

The flush treatment may be performed before the gate insulating film and the semiconductor film to which an impurity imparting one conductivity type is added are formed. Note that the flush treatment is effective when it is performed after cleaning.

Embodiment Mode 4

This embodiment mode describes an example in which a step of manufacturing a display device is different from Embodiment Mode 1 or 2. Therefore, other steps can be performed in a manner similar to Embodiment Mode 1 or 2, and the same portion or a portion having the same function, and the same steps as in Embodiment Mode 1 are not repeatedly explained.

In Embodiment Mode 1 or 2, before the microcrystalline semiconductor film is formed, a reaction chamber may be subjected to cleaning and flush (washing) treatment (hydrogen flush using hydrogen as a flush substance, silane flush using silane as a flush substance, or the like). By the flush treatment, a film to be formed can be prevented from being contaminated by an impurity such as oxygen, nitrogen, or fluorine in a reaction chamber.

Before a substrate is carried in a reaction chamber to perform film formation, coating may be performed in which a protective film is formed of a film used for a film formed on the inner wall of each reaction chamber (the coating is also referred to as pre-coating treatment). Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 μm to 0.4 μm. Flush treatment may be performed after pre-coating treatment (hydrogen flush, silane flush, or the like). In the case of performing cleaning and pre-coating treatment, it is necessary that a substrate be carried out from a reaction chamber. However, in the case of performing flush treatment (hydrogen flush, silane flush, or the like), a substrate may be carried in a reaction chamber because plasma treatment is not performed.

A protective film formed of an amorphous silicon film is formed on the inner wall of a reaction chamber in which a microcrystalline silicon film is formed, and hydrogen plasma treatment is performed before film formation. In this case, the protective film is etched and an extremely small amount of silicon is deposited on a substrate. The deposited silicon can be a nucleus of crystal growth.

By the pre-coating treatment, a film to be formed can be prevented from being contaminated by an impurity such as oxygen, nitrogen, or fluorine in a reaction chamber.

The pre-coating treatment may be performed before film formation of a semiconductor film to which an impurity imparting one conductivity type is added.

Embodiment Mode 5

This embodiment mode describes in detail an example of a method for forming a gate insulating film, a microcrystalline semiconductor film, and a buffer layer.

Figure 5A:
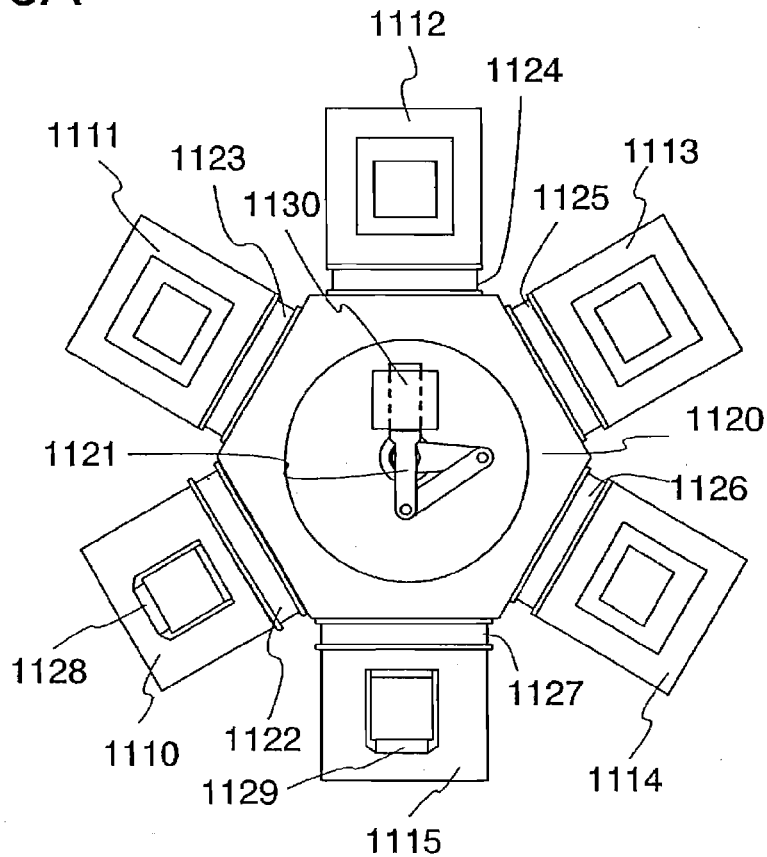
FIGS. 5A and 5B are explanatory plan views of a plasma CVD apparatus of the present invention.
Figure 5B:
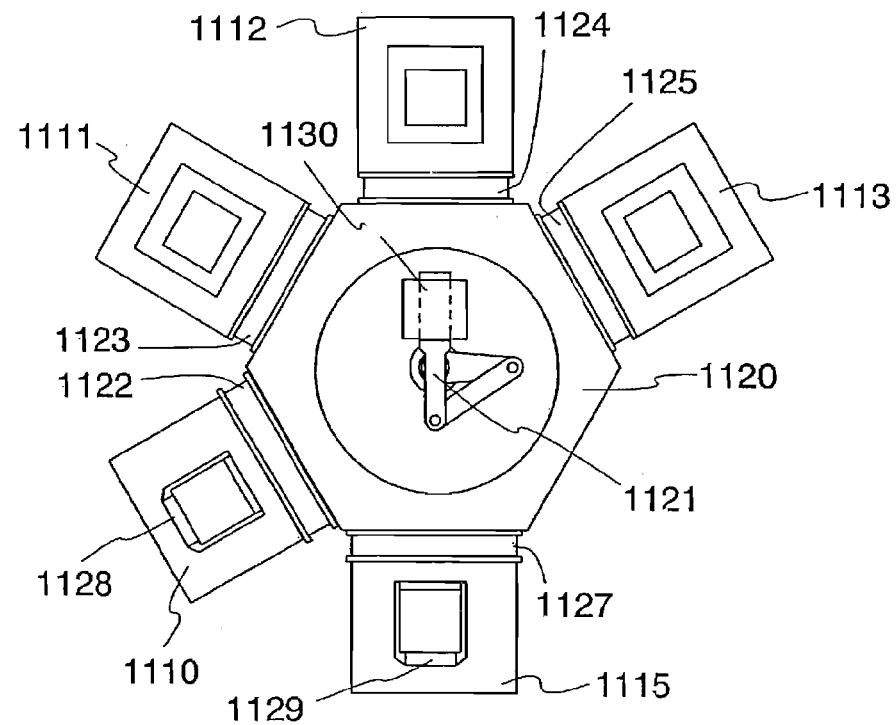

FIGS. 5A and 5B each illustrate an example of a plasma CVD apparatus which can be used for the present invention. FIGS. 5A and 5B each illustrate a microwave plasma CVD apparatus which can perform successive film formation. FIGS. 5A and 5B are plan views each schematically illustrate a microwave plasma CVD apparatus. A loading chamber 1110, an unloading chamber 1115, and reaction chambers (1) 1111 to (4) 1114 are provided around a common chamber 1120. Gate valves 1122 to 1127 are provided between the common chamber 1120 and each chamber so that treatment in each chamber does not have influence on treatment in other chambers. Note that the number of reaction chambers is not limited to four, and the number of reaction chambers may be either more than four or less than four. When the number of reaction chambers is large, reaction chambers can be allocated according to a kind of a film to be stacked; thus, the number of cleaning of the reaction chamber can be reduced. FIG. 5A illustrates an example of a microwave plasma CVD apparatus provided with four reaction chambers, and FIG. 5B illustrates an example of a microwave plasma CVD apparatus provided with three reaction chambers.

An example is described in which a gate insulating layer, a microcrystalline semiconductor film, a buffer layer, and a semiconductor film to which an impurity imparting one conductivity type is added are formed using a plasma CVD apparatus shown in FIGS. 5A and 5B. Substrates are set in a cassette 1128 and a cassette 1129 of the loading chamber 1110 and the unloading chamber 1115, respectively, and transferred to the reaction chambers (1) 1111 to (4) 1114 by a transfer unit 1121 of the common chamber 1120. In this apparatus, reaction chambers can be allocated according to the films to be deposited, and a plurality of different films can be formed successively without being exposed to the atmosphere.

In each of the reaction chambers (1) to (4), the gate insulating films 52*a* and 52*b*, the microcrystalline semiconductor film 53, the buffer layer 54, and the semiconductor film 55 to which an impurity imparting one conductivity type is added are stacked. In this case, the plurality of different kinds of films can be stacked successively by changing source gases. Further, in this case, atter the gate insulating film is formed, silicon hydride such as silane is introduced to the reaction chamber so that an oxygen residue is reacted with silicon hydride, and the reactant is ejected outside the reaction chamber; thus, the concentration of an oxygen residue in the reaction chamber can be reduced. Accordingly, the concentration of oxygen included in the microcrystalline semiconductor film can be reduced. In addition, crystal grains included in the microcrystalline semiconductor film can be prevented from being oxidized.

Alternatively, the gate insulating films 52*a* and 52*b*, the microcrystalline semiconductor film 53, and the buffer layer 54 are formed in each of the reaction chambers (1) and (3), and the semiconductor film 55 to which an impurity imparting one conductivity type is added is formed in each of the reaction chambers (2) and (4). When only the semiconductor film 55 to which an impurity imparting one conductivity type is added is formed separately from other films in this manner, the impurity imparting one conductivity type which remains in the chamber can be prevented from being mixed into other films.

Further, in a plasma CVD apparatus, films of one kind may be formed in a plurality of respective chambers in order to improve productivity. When films of one kind can be formed in a plurality of chambers, films can be concurrently formed over a plurality of substrates. For example, the reaction chambers (1) and (2) are used as reaction chambers in each of which a microcrystalline semiconductor film is formed, the reaction chamber (3) is used as a reaction chamber in which an amorphous semiconductor film is formed, and the reaction chamber (4) is used as a reaction chamber in which a semiconductor film to which an impurity imparting one conductivity type is added is formed. A microcrystalline semiconductor film is formed over a substrate in the reaction chamber (1) or reaction chamber (2), and over the substrate, a buffer layer is formed in the reaction chamber (3) and a semiconductor film to which an impurity imparting one conductivity type is added is formed in the reaction chamber (4). A buffer layer and a semiconductor film to which an impurity imparting one conductivity type is added may be successively formed in the reaction chamber (3). In this case, the number of reaction chambers may be three, and accordingly, a plasma CVD apparatus shown in FIG. 5B may be used. In the case where a plurality of substrates is concurrently treated as described above, a plurality of reaction chambers is provided, in each of which a film with a low deposition rate is formed. Accordingly, productivity can be improved.

Before a substrate is carried in a reaction chamber to perform film formation, cleaning, flush (washing) treatment (hydrogen flush, silane flush, or the like), or coating in which a protective film is formed of a film used for a film formed on the inner wall of each reaction chamber (the coating is also referred to as pre-coating treatment) is preferably performed. Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 μm to 0.4 μm. Flush treatment may be performed after pre-coating treatment (hydrogen flush, silane flush, or the like). In the case of performing cleaning and pre-coating treatment, it is necessary that a substrate be carried out from a reaction chamber. However, in the case of performing flush treatment (hydrogen flush, silane flush, or the like), a substrate may be carried in a reaction chamber because plasma treatment is not performed.

A protective film formed of an amorphous silicon film is formed on the inner wall of a reaction chamber in which a microcrystalline silicon film is formed, and hydrogen plasma treatment is performed before film formation. In this case, the protective film is etched and an extremely small amount of silicon is deposited on a substrate. The deposited silicon can be a nucleus of crystal growth.

In this manner, with use of the microwave plasma CVD apparatus in which the plurality of chambers are connected, the gate insulating films 52a and 52b, the microcrystalline semiconductor film 53, the buffer layer 54, and the semiconductor film 55 to which an impurity imparting one conductivity type is added can be concurrently formed; thus, the mass productivity can be enhanced. Further, also when some reaction chamber is being subjected to maintenance or cleaning, the films can be formed in other reaction chambers, and the films can be formed efficiently. In addition, each interface of a stack of layers can be formed without being contaminated by atmospheric components or impurity elements contained in the atmosphere; thus, variations in characteristics of the thin film transistors can be reduced.

The gate insulating films 52a and 52b may be formed in the reaction chamber (1), the microcrystalline semiconductor film 53 and the buffer layer 54 may be formed in the reaction chamber (2), and the semiconductor film 55 to which an impurity imparting one conductivity type is added may be formed in the reaction chamber (3). Alternatively, in the case where the gate insulating film 52a is formed of a silicon oxide film or silicon oxynitride film and the gate insulating film 52b is formed of a silicon nitride film or a silicon nitride oxide film, five reaction chambers may be provided: that is, a silicon oxide film or a silicon oxynitride film may be formed as the gate insulating film 52a in the reaction chamber (1), a silicon nitride film or a silicon nitride oxide film may be formed as the gate insulating film 52b in the reaction chamber (2), a microcrystalline semiconductor film may be formed in the reaction chamber (3), a buffer layer may be formed in the reaction chamber (4), and a semiconductor film to which an impurity imparting one conductivity type is added may be formed in the reaction chamber (5).

In any case, as described in Embodiment Mode 1 and Embodiment Mode 2, hydrogen plasma treatment is performed on a surface of the gate insulating film over which the microcrystalline semiconductor film is formed, so that growth of a microcrystal in the microcrystal semiconductor film can be promoted.

With use of the microwave plasma CVD apparatus having such a structure, films of similar kinds or one kind can be formed in its respective reaction chamber, and the films can be successively formed without being exposed to the atmosphere. Thus, an interface of a stack of layers can be formed without being contaminated by a residue of another film which has already been formed or impurity elements contained in the atmosphere.

Further, a microwave generator and a high frequency wave generator may be provided; thus, the gate insulating film, the microcrystalline semiconductor film, and the semiconductor film to which an impurity element imparting one conductivity type is added may be formed by a microwave plasma CVD method, and the buffer layer may be formed by a high frequency plasma CVD method.

Although the microwave plasma CVD apparatus in FIGS. 5A and 5B is provided with the loading chamber and the unloading chamber separately, a loading chamber and an unloading chamber may be combined and a loading/unloading chamber may be provided. In addition, the microwave plasma CVD apparatus may be provided with a spare chamber. By pre-heating of the substrate in the spare chamber, it is possible to shorten heating time before formation of the film in each reaction chamber, so that the throughput can be improved.

Hereinafter, film formation treatment is described in detail. In each treatment, gas supplied from a gas supply portion can be selected in accordance with its purpose.

Here, a method for forming a silicon oxynitride film as the gate insulating film 52a and forming a silicon nitride oxide film as the gate insulating film 52b is given as an example. Further, description is made by employing a microwave plasma CVD apparatus as an example of a plasma CVD apparatus.

First, the inside of the reaction chamber of the microwave plasma CVD apparatus is cleaned with fluorine radicals. The fluorine radicals are obtained by introducing carbon fluoride, nitrogen fluoride, or fluorine into a plasma generator provided outside the reaction chamber and dissociating the introduced carbon fluoride, nitrogen fluoride, or fluorine. By introducing the fluorine radicals into the reaction chamber, the reaction chamber can be cleaned.

After cleaning with the fluorine radicals, a large amount of hydrogen is introduced inside the reaction chamber, whereby the hydrogen and a fluorine residue in the reaction chamber react with each other to reduce the concentration of the fluorine residue. Thus, the amount of fluorine which enters a protective film which is formed later on the inner wall of the reaction chamber as pre-coating treatment can be reduced, and the thickness of the protective film can be reduced.

Next, a silicon oxynitride film is deposited as a protective film on surfaces of the inner wall of the reaction chamber. Here, a pressure in the reaction chamber is set to be 1 Pa to 200 Pa, preferably 1 Pa to 100 Pa, and one or more rare gases such as helium, argon, xenon, or krypton is introduced as a gas for generating plasma. Alternatively, hydrogen and any one kind of rare gases are introduced. In particular, it is preferable to use helium, or helium and hydrogen as a gas for generating plasma.

As a gas for generating plasma, one or more rare gases such as helium, argon, xenon, or krypton, and an oxygen gas may also be introduced. When an oxygen gas as well as a rare gas is introduced into the reaction chamber, plasma can be generated easily.

A power supply device is turned on, and plasma is generated in such a condition that an output of the power supply device is 500 W to 6000 W, preferably 4000 W to 6000 W. Further, a source gas is introduced from a gas supply portion into the reaction chamber. Specifically, dinitrogen monoxide, a rare gas, and silane are introduced as a source gas, whereby a silicon oxynitride film is formed as the protective film on the inner wall of the reaction chamber. At this time, a flow rate of silicon hydride is 50 sccm to 300 sccm, a flow rate of dinitrogen monoxide is 500 sccm to 6000 sccm, and a thickness of the protective film is 500 nm to 2000 nm.

Next, supply of the source gas is stopped, the pressure in the reaction chamber is reduced, and the power supply device is turned off. Then, a substrate is placed over a support in the reaction chamber.

Next, a silicon oxynitride film is deposited as the gate insulating film 52a over the substrate through a step similar to that of the protective film.

After the silicon oxynitride film with a given thickness is deposited, supply of a source gas is stopped, the pressure in the reaction chamber is reduced, and the power supply device is turned off.

Next, the pressure in the reaction chamber is set to be 1 Pa to 200 Pa, preferably 1 Pa to 100 Pa. One or more rare gases such as helium, argon, xenon, or krypton, which is a gas for generating plasma, and silane, dinitrogen monoxide, and ammonia, which are source gases, are introduced into the reaction chamber. Nitrogen may be introduced as a source gas instead of ammonia. Next, the power supply device is turned on, and plasma is generated in such a condition that an output of the power supply device is 500 W to 6000 W, preferably 4000 W to 6000 W. Subsequently, the source gas is introduced into the reaction chamber from the gas supply portion, whereby a silicon nitride oxide film is formed as the gate insulating film 52b over the silicon oxynitride film that is provided over the substrate. After that, supply of the source gas is stopped, the pressure in the reaction chamber is reduced, and the power supply device is turned off, so that the film formation process is completed.

Through the above-described steps, the silicon oxynitride film is formed as the protective film obtained by pre-coating treatment on the inner wall of the reaction chamber, and the silicon oxynitride film and the silicon nitride oxide film are formed successively over the substrate, whereby mixture of impurities such as silicon oxide into the silicon nitride oxide film, which is an upper layer of the gate insulating film can be suppressed. Since the silicon nitride oxide film has high dielectric strength, variation in threshold voltage of transistors can be reduced when the film is used for the gate insulating film. In addition, a BT (bias-temperature) characteristic can be improved. Further, resistance to static electricity is increased, so that a transistor that is hardly broken even when a high voltage is applied thereto can be manufactured. Furthermore, a transistor that is hardly broken over time can be manufactured. Still furthermore, a transistor that is hardly damaged by hot carriers can be manufactured.

In the case where a single layer of a silicon oxynitride film is formed as the gate insulating film, the above method for forming the protective film and the above method for forming the silicon oxynitride film are used. In particular, when the flow rate ratio of dinitrogen monoxide to silane is 100 to 300 times, preferably 150 to 250 times higher than that of silane, a silicon oxynitride film with high dielectric strength can be formed.

Now a method for successively forming a microcrystalline semiconductor film by a microwave plasma CVD method and an amorphous semiconductor film as the buffer layer is described. First, the reaction chamber is cleaned in a manner similar to the case of the gate insulating film.

Subsequently, flush treatment (hydrogen flush using hydrogen as a flush substance, silane flush using silane as a flush substance, or the like) may be performed. By the flush treatment, an impurity such as oxygen, nitrogen, or fluorine in a reaction chamber can be removed. For example, flush treatment is performed in the following manner: a plasma CVD apparatus is used, and monosilane is used as a flush substance and introduced into a chamber at a gas flow rate of 8 SLM to 10 SLM for 5 to 20 minutes, preferably, 10 to 15 minutes to perform silane flush treatment. Note that 1 SLM is 1000 sccm, that is, 0.06 m$^3$/h.

Then, a silicon film is deposited as a protective film in the reaction chamber. Here, a pressure in the reaction chamber is set to 1 Pa to 200 Pa, preferably 1 Pa to 100 Pa, and one or more rare gases such as helium, argon, xenon, or krypton is introduced as a gas for generating plasma. Alternatively, hydrogen and the rare gas may be introduced into the reaction chamber.

Next, the power supply device is turned on, and the plasma is generated in such a condition that an output of the power supply device is set to be 500 W to 6000 W, preferably 4000 W to 6000 W. Further, a source gas is introduced into the reaction chamber from the gas supply portion. Specifically, a silicon hydride gas or a silicon chloride gas, and a hydrogen gas are introduced as a source gas, so that a microcrystalline silicon film is formed as a protective film on surfaces of the inner wall of the reaction chamber. The microcrystalline semiconductor film can be formed by dilution with one or plural kinds of rare gas elements selected from helium, argon, krypton, or neon in addition to silicon hydride, a silicon chloride gas, and a hydrogen gas. In that case, the flow rate ratio of hydrogen to silicon hydride is set to be 5:1 to 200:1, preferably 50:1 to 150:1, more preferably 100:1. A thickness of the protective film at this time is 500 nm to 2000 nm. Note that before the power supply device is turned on, a silicon hydride gas and a hydrogen gas may be introduced in addition to the above-described rare gas into the reaction chamber.

Next, supply of the source gas is stopped, the pressure in the reaction chamber is reduced, and the power supply device is turned off. After that, the substrate is placed over the support in the reaction chamber.

A silicon gas (a silicon hydride gas or a silicon chloride gas) is introduced when a surface of the gate insulating film is subjected to hydrogen plasma, so that a microcrystalline semiconductor film is deposited over the substrate. The thickness of the microcrystalline semiconductor film is greater than 0 nm and less than or equal to 50 nm, preferably greater than 0 nm and less than or equal to 20 nm. Hydrogen plasma is subjected to the surface of the gate insulating surface, whereby the generation of a crystalline nucleus over the surface of the gate insulating film can be promoted. Accordingly, a microcrystalline semiconductor film with excellent electric characteristics can be formed.

After the microcrystalline silicon is deposited with a given thickness, the flow rate of the source gas is further adjusted. Specifically, the flow rate of a hydrogen gas is drastically reduced as compared to that of film formation conditions of the microcrystalline semiconductor film and the flow rate of a silicon gas (a silicon hydride gas or a silicon chloride gas) is increased. Furthermore, a hydrogen gas is not introduced into the reaction chamber but a silicon gas (a silicon hydride gas or a silicon chloride gas) is introduced. As described above, the flow rate of hydrogen with respect to a silicon gas (a silicon hydride gas or a silicon chloride gas) is reduced, whereby the deposition rate of an amorphous semiconductor film as a buffer layer can be improved. Further, the microcrystalline semiconductor film can be formed by dilution with one or plural kinds of rare gas elements selected from helium, argon, krypton, or neon in addition to a silicon gas (a silicon hydride gas or a silicon chloride gas). A power supply device is turned on, and plasma is generated in such a condition that an output of the power supply device is 500 W to 6000 W, preferably 4000 W to 6000 W, whereby an amorphous semiconductor film can be formed. The deposition rate of an amorphous semiconductor film is higher than a microcrystalline semiconductor film. Therefore, the pressure in the reaction chamber can be set low. A thickness of the amorphous semiconductor film at this time is set to 50 nm to 200 nm.

After the amorphous semiconductor film is deposited with a given thickness, supply of a source gas is stopped, the pressure in the reaction chamber is reduced, and the power supply device is turned off, so that the film formation process of the amorphous semiconductor film is completed.

Plasma generated by the microwave plasma CVD apparatus with a frequency of 1 GHz or more has high electron density and forms a lot of radicals from the source gas, and the radicals are supplied to the substrate. Thus, reaction of radicals on the surface of the substrate is promoted and a deposition rate of the microcrystalline silicon can be increased. Further, the microwave plasma CVD apparatus provided with the plurality of power supply devices and the plurality of dielectric plates can generate stable large-area plasma. Therefore, a film whose quality is highly uniform can be formed over a large-sized substrate, and mass productivity can be increased.

Further, the microcrystalline semiconductor film and the amorphous semiconductor film are successively formed in one reaction chamber, whereby an interface with little distortion can be formed.

In the case where a protective film with a thickness of 500 nm to 2000 nm is formed on the inner wall of the reaction chamber in respective steps of manufacturing the gate insulating films and the semiconductor film, the above-described cleaning treatment and treatment of forming a protective film can be eliminated.

This embodiment mode can be combined with the structure disclosed in other embodiment modes, as appropriate.

Embodiment Mode 6

A process of manufacturing a display device is described with reference to FIGS. 9A and 9B and FIGS. 10A to 10C. As a display element included in a display device, a light-emitting element utilizing electro luminescence is described here. The light-emitting elements utilizing electro luminescence are distinguished from each other depending on whether a light-emitting material thereof is an organic compound or an inorganic compound. In general, the former is referred to as an organic EL element, and the latter is referred to as an inorganic EL element. Thin film transistors 85 and 86 used in a display device are thin film transistors which have excellent electric characteristics and high reliability and can be manufactured in a manner similar to the thin film transistor 74 described in Embodiment Modes 1 to 4.

In an organic EL element, by application of voltage to the light-emitting element, electrons and holes are injected from the pair of electrodes into the layer containing an organic compound with a light-emitting property to cause current flow. Then, recombination of these carriers (the electrons and holes) makes the light-emitting organic compound to form an excited state and to emit light when the excited state returns to a ground state. Owing to such a mechanism, such a light-emitting element is referred to as a current-excitation light-emitting element.

Inorganic EL elements are classified into a dispersion type inorganic EL element and a thin film type inorganic EL element depending on its element structure. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin film type inorganic EL element has a structure in which a light-emitting layer is interposed between dielectric layers, and the obtained object is further interposed between electrodes. The mechanism of light emission of the thin film type inorganic EL element is localized light emission, which utilizes inner-shell electron transition of a metal ion. Note that an organic EL element is used for description, as a light-emitting element. Further, a thin film transistor of channel-etched type which is shown in FIGS. 3A and 3B is described as a thin film transistor which controls driving of a light-emitting element.

Through the steps similar to that in FIGS. 1A to 1E, FIGS. 2A to 2D, FIGS. 3A and 3B, and FIGS. 4A to 4D, the thin film transistors 85 and 86 are formed over the substrate 100, and an insulating film 87 serving as a protective film is formed over the thin film transistors 85 and 86, as shown in FIGS. 9A and 9B. Subsequently, a planarization film 111 is formed over the insulating film 87, and a pixel electrode 112 that is connected to the source or drain electrode of the thin film transistor 86 is formed over the planarization film 111.

It is preferable to form the planarization film 111 using an organic resin such as acrylic, polyimide, or polyamide, or siloxane.

In FIG. 9A, it is preferable to use a cathode as the pixel electrode 112 because the thin film transistor of a pixel is an n-channel TFT; if the thin film transistor of the pixel is a p-channel TFT, it is preferable to use an anode as the pixel electrode 112. Specifically, for the cathode, a material with a low work function, such as Ca, Al, CaF, MgAg, or AlLi can be used.

Subsequently, as shown in FIG. 9B, a partition wall 113 is formed over the planarization film 111 and an end portion of the pixel electrode 112. The partition wall 113 has an opening, and the pixel electrode 112 is exposed in the opening. The partition wall 113 is formed using an organic resin film, an inorganic insulating film, or an organic polysiloxane film. In particular, it is preferable that the partition wall 113 be formed from a photosensitive material, and the opening be formed over the pixel electrode, and a side wall of the opening form an inclined surface with a continuous curvature.

Then, a light-emitting layer 114 is formed so as to be in contact with the pixel electrode 112 in the opening of the partition wall 113. The light-emitting layer 114 may be formed using a single layer or by stacking a plurality of layers.

Subsequently, a common electrode 115 is formed using an anode material so as to cover the light-emitting layer 114. The common electrode 115 can be formed using a light-transmitting conductive film formed using a light-transmitting conductive material which is given as the pixel electrode 77 in Embodiment Mode 1. The common electrode 115 may also be formed using a titanium nitride film or a titanium film as well as the above light-transmitting conductive film. In FIG. 9B, the common electrode 115 is formed using ITO. In the opening of the partition wall 113, the pixel electrode 112, the light-emitting layer 114, and the common electrode 115 overlap with each other, so that a light-emitting element 117 is formed. After that, a protective film 116 is preferably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Further, in a practical case, it is preferable that a display device completed to the state illustrated in FIG. 9B be packaged (sealed) with a protective film (such as an attachment film or an ultraviolet curable resin film) or a cover material with high air-tightness and little degasification so that the display device is not exposed to external air.

Next, a structure of a light-emitting element is described with reference to FIGS. 10A to 10C. A cross-sectional structure of a pixel is described by taking an n-channel driving TFT as an example. Driving TFTs 7001, 7011, and 7021 used for display devices shown in FIGS. 10A to 10C have excellent electric characteristics and high reliability, and can be manufactured in a manner similar to the thin film transistor 74 described in Embodiment Modes 1 to 4.

In order to extract light emission of a light-emitting element, at least one of an anode and a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having the top emission structure is described with reference to FIG. 10A.

Figure 10A:
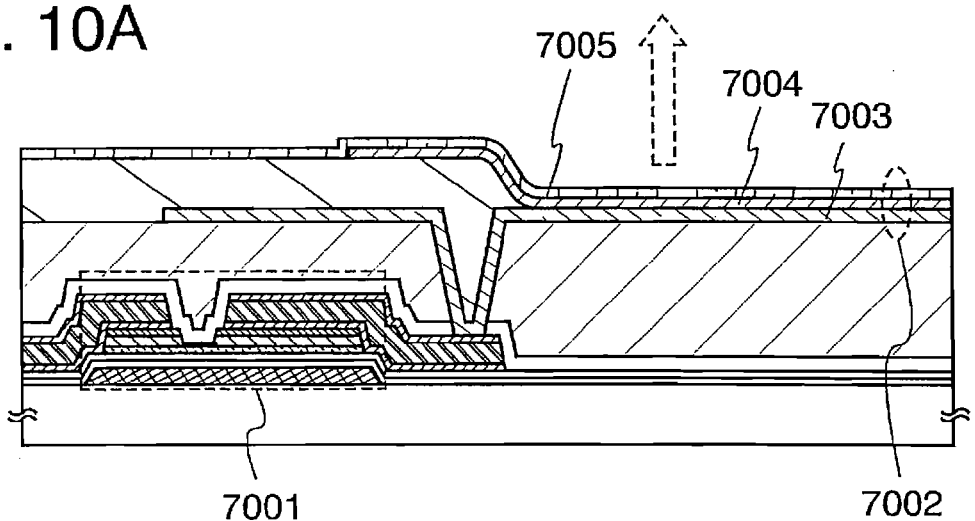
FIGS. 10A to 10C are explanatory diagrams of a display device of the present invention.

FIG. 10A is a cross-sectional view of a pixel in a case where a driving TFT 7001 is an n-channel TFT, and light generated in a light-emitting element 7002 is emitted to pass through an anode 7005. In FIG. 10A, a cathode 7003 of the light-emitting element 7002 and the driving TFT 7001 are electrically connected to each other. A light-emitting layer 7004 and the anode 7005 are stacked in this order over the cathode 7003. As the cathode 7003, a known conductive film can be used as long as it has a low work function and reflects light. For example, Ca, Al, CaF, MgAg, AlLi, or the like is preferably used. The light-emitting layer 7004 may be formed of a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 10A, light generated in the light-emitting element 7002 is emitted to pass through the anode 7005 as shown by an outline arrow.

Then, a light-emitting element having the bottom emission structure is described with reference to FIG. 10B. FIG. 10B is a cross-sectional view of a pixel in a case where a driving TFT 7011 is an n-channel TFT, and light generated in a light-emitting element 7012 is emitted to pass through a cathode 7013. In FIG. 10B, the cathode 7013 of the light-emitting element 7012 is formed over a light-transmitting conductive film 7017 that is electrically connected to the driving TFT 7011, and a light-emitting layer 7014 and an anode 7015 are stacked in order over the cathode 7013. A blocking film 7016 for reflecting or blocking light may be formed so as to cover the anode 7015 when the anode 7015 has a light-transmitting property. For the cathode 7013, various materials can be used as in the case of FIG. 10A as long as the cathode 7013 is a conductive film having a low work function. The cathode 7013 has a thickness that can transmit light (preferably, approximately from 5 nm to 30 nm). For example, an Al film having a thickness of 20 nm can be used as the cathode 7013. The light-emitting layer 7014 may be formed of a single layer or by stacking a plurality of layers as in the case of FIG. 10A. The anode 7015 is not required to transmit light therethrough, but can be formed using a light-transmitting conductive film as in the case of FIG. 10A. As the blocking film 7016, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the light-emitting layer 7014. In the pixel illustrated in FIG. 10B, light generated in the light-emitting element 7012 is emitted to pass through the cathode 7013 as shown by an outline arrow.

Now a light-emitting element having the dual emission structure is described with reference to FIG. 10C. In FIG. 10C, a cathode 7023 of a light-emitting element 7022 is formed over a light-transmitting conductive film 7027 that is electrically connected to a driving TFT 7021, and a light-emitting layer 7024 and an anode 7025 are stacked in this order over the cathode 7023. As the cathode 7023, a known conductive film can be used as long as it has a low work function as in the case of FIG. 10A. The cathode 7023 has a thickness that can transmit light. For example, an Al film having a thickness of 20 nm can be used as the cathode 7023. The light-emitting layer 7024 may be formed using a single layer or by stacking a plurality of layers as in the case of FIG. 10A. The anode 7025 can be formed using a light-transmitting conductive film as in the case of FIG. 10A.

The light-emitting element 7022 corresponds to a region where the cathode 7023 and the anode 7025 sandwich the light-emitting layer 7024. In the pixel illustrated in FIG. 10C, light generated in the light-emitting element 7022 is emitted to pass through both the anode 7025 and the cathode 7023 as shown by outline arrows.

Note that although an organic EL element is described as a light-emitting element, an inorganic EL element can be provided as a light-emitting element.

This embodiment mode describes an example in which a thin film transistor which controls driving of a light-emitting element (a driving IFI) is electrically connected to the light-emitting element. However, a current control TFT may also be formed between the driving TFT and the light-emitting element to be connected to them.

Figure 10B:
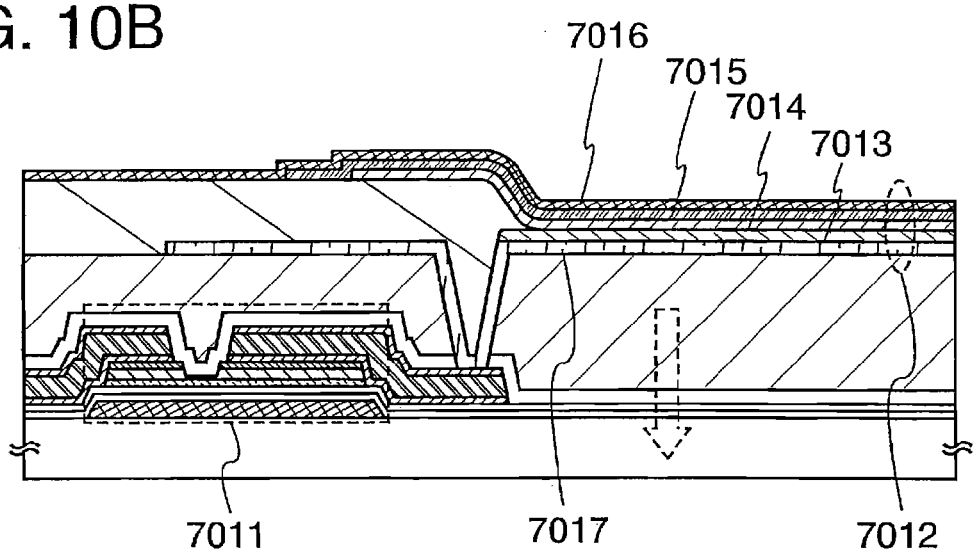
Figure 10C:
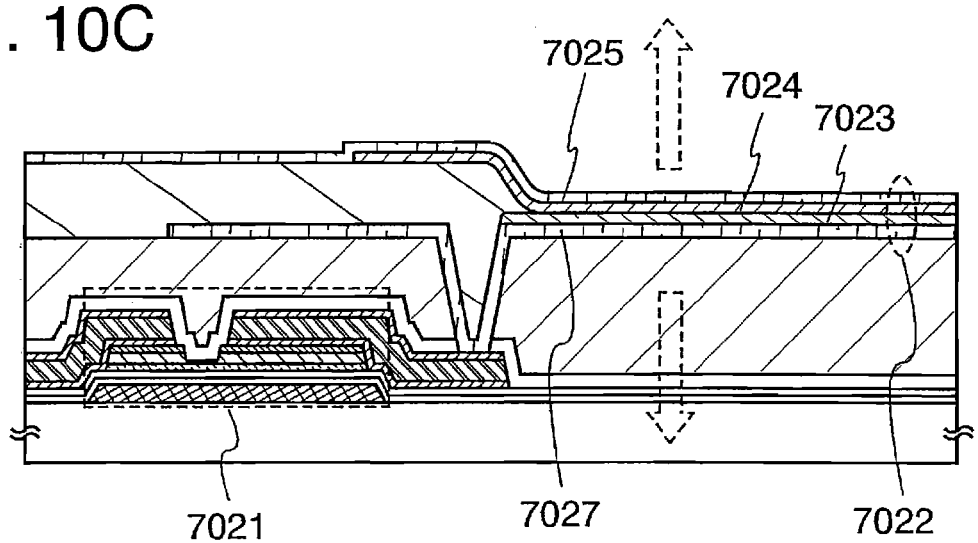

A light-emitting device described in this embodiment mode is not limited to the structures illustrated in FIGS. 10A to 10C, and can be modified in various ways based on the spirit of techniques according to the present invention.

Through the above-described steps, a light-emitting device can be manufactured as a display device. In a light-emitting device of this embodiment mode, a thin film transistor with excellent electric characteristics and high reliability is used; accordingly, a light-emitting device having high contrast and high visibility is obtained. Further, a thin film transistor formed using a microcrystalline semiconductor film without a laser crystallization step is used; accordingly, a light-emitting device with high visibility can be manufactured with high productivity.

Embodiment Mode 7

This embodiment mode describes below a display device having the thin film transistor described in Embodiment Modes 1 to 4. This embodiment mode describes an example of a liquid crystal display device using a liquid crystal display element as a display element, with reference to FIGS. 12 to 25. TFTs 628 and 629 which are used for a liquid crystal display device shown in FIGS. 12 to 25 can be manufactured in a manner similar to thin film transistors described in Embodiment Modes 1 to 4, and have excellent electric characteristics and high reliability.

First, a vertical alignment (VA) liquid crystal display device is described. The VA liquid crystal display device is a kind of form in which alignment of liquid crystal molecules of a liquid crystal display panel is controlled. The VA liquid crystal display device is a form in which liquid crystal molecules are vertical to a panel surface when voltage is not applied. In particular, in this embodiment mode, it is devised that a pixel is divided into several regions (sub-pixels) so that molecules are aligned in different directions in the respective regions. This is referred to as domain multiplication or multi-domain design. In the following description, a liquid crystal display device with multi-domain design is described.

Figure 12:
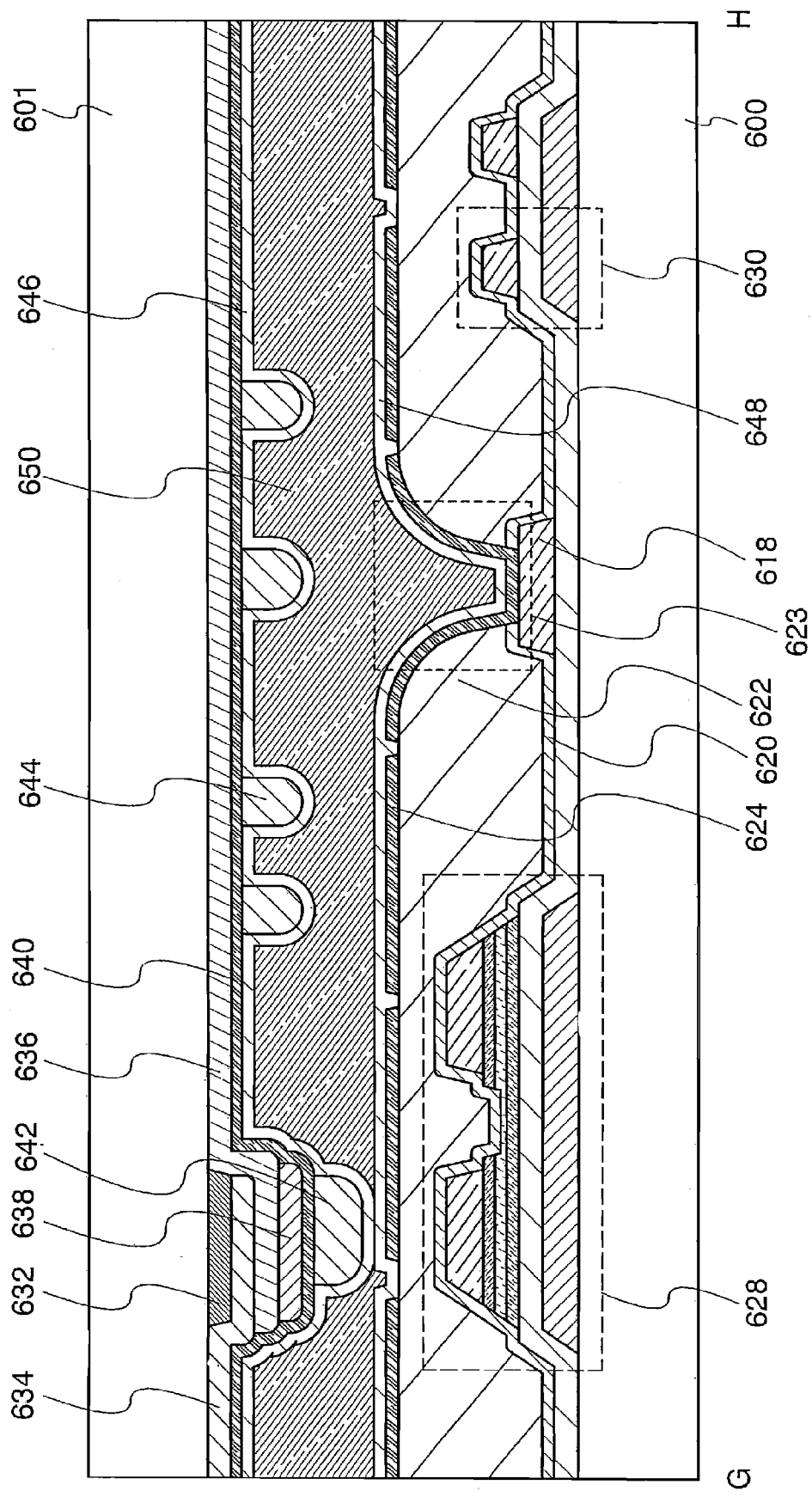
FIG. 12 is an explanatory diagram of a display device of the present invention.
Figure 13:
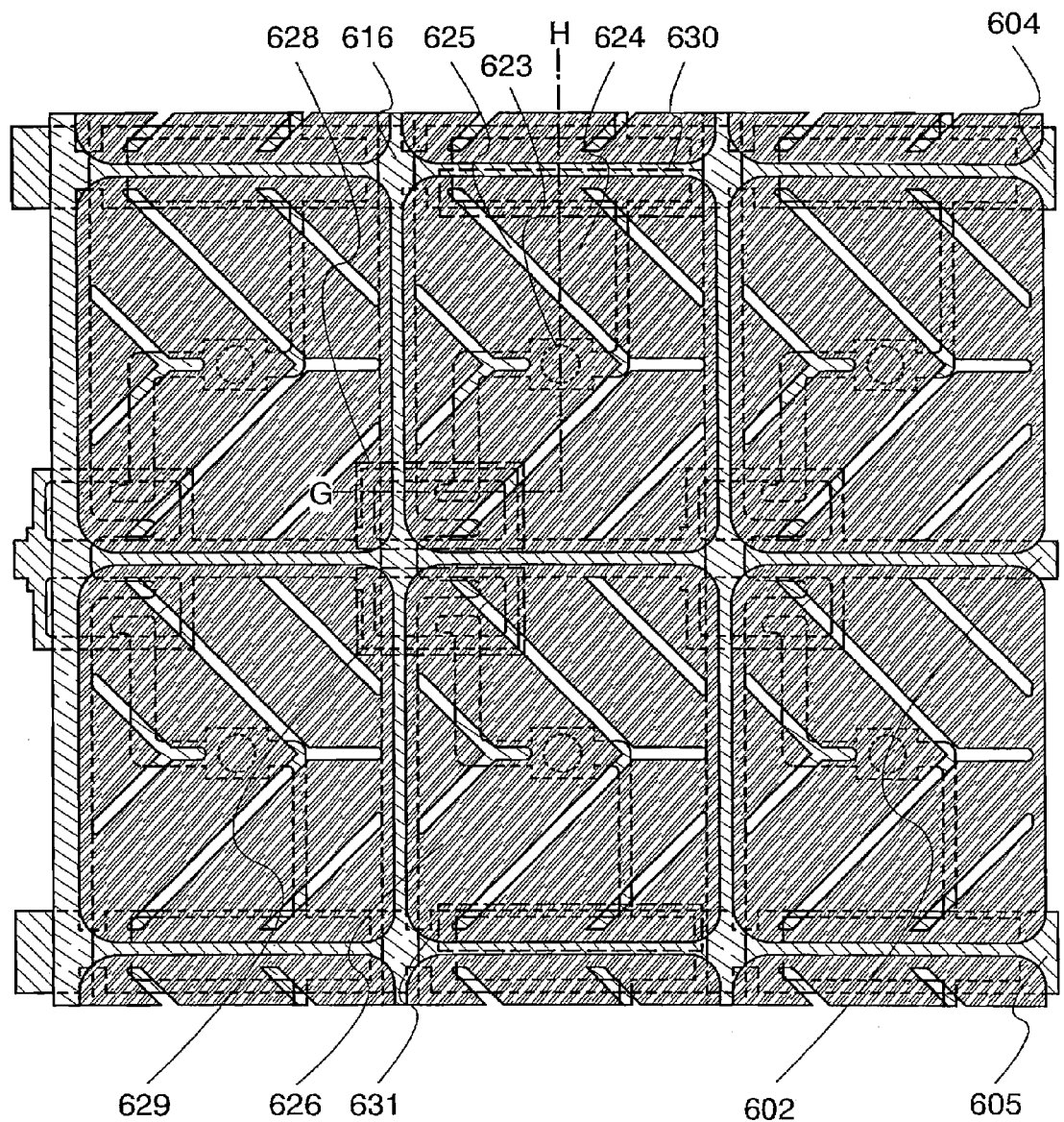
FIG. 13 is an explanatory diagram of a display device of the present invention.
Figure 14:
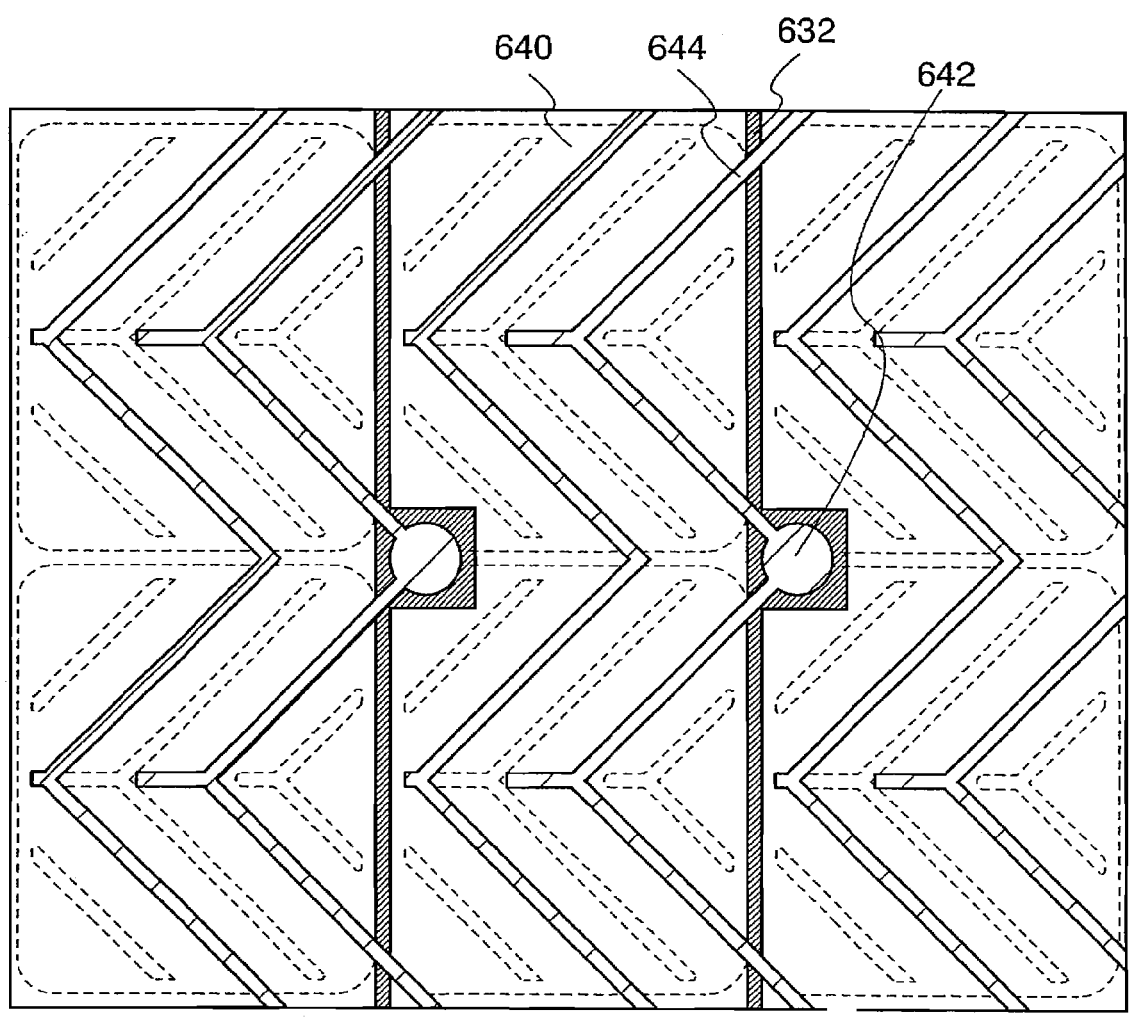
FIG. 14 is an explanatory diagram of a display device of the present invention.

FIGS. 13 and 14 show a pixel electrode and a counter electrode, respectively. FIG. 13 is a plan view of a side of a substrate on which the pixel electrode is formed. FIG. 12 shows a cross-sectional structure along a line G-H in FIG. 13. FIG. 14 is a plan view of a side of a substrate on which the counter electrode is formed. Hereinafter, description is made with reference to these drawings.

FIG. 12 illustrates a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected.

At the position where the counter substrate 601 is provided with a spacer 642, a light shielding film 632, a first color film 634, a second color film 636, a third color film 638, and the counter electrode 640 are formed. With this structure, the height of a projection 644 for controlling alignment of the liquid crystal and the height of the spacer 642 vary. An alignment film 648 is formed over the pixel electrode 624. Similarly, the counter electrode 640 is also provided with an alignment film 646. A liquid crystal layer 650 is formed between the alignment films 646 and 648.

Although a columnar spacer is used for the spacer 642, in this embodiment mode, a bead spacer may be dispersed. Further, the spacer 642 may be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring, and the storage capacitor portion 630 and also penetrates a third insulating film 622 which covers the insulating film 620. The thin film transistor described in Embodiment Mode 1 can be used as the TFT 628 as appropriate. The storage capacitor portion 630 includes a first capacitor wiring 604 which is formed in a manner similar to a gate wiring 602 of the TFT 628, a gate insulating film 606, and a second capacitor wiring 617 which is formed in a manner similar to a wiring 616 and the wiring 618.

A liquid crystal element is formed by overlapping of the pixel electrode 624, the liquid crystal layer 650, and the counter electrode 640.

FIG. 12 shows a structure over the substrate 600. The pixel electrode 624 is formed using the material described in Embodiment Mode 1. The pixel electrode 624 is provided with a slit 625. The slit 625 is for controlling alignment of the liquid crystal.

Figure 15:
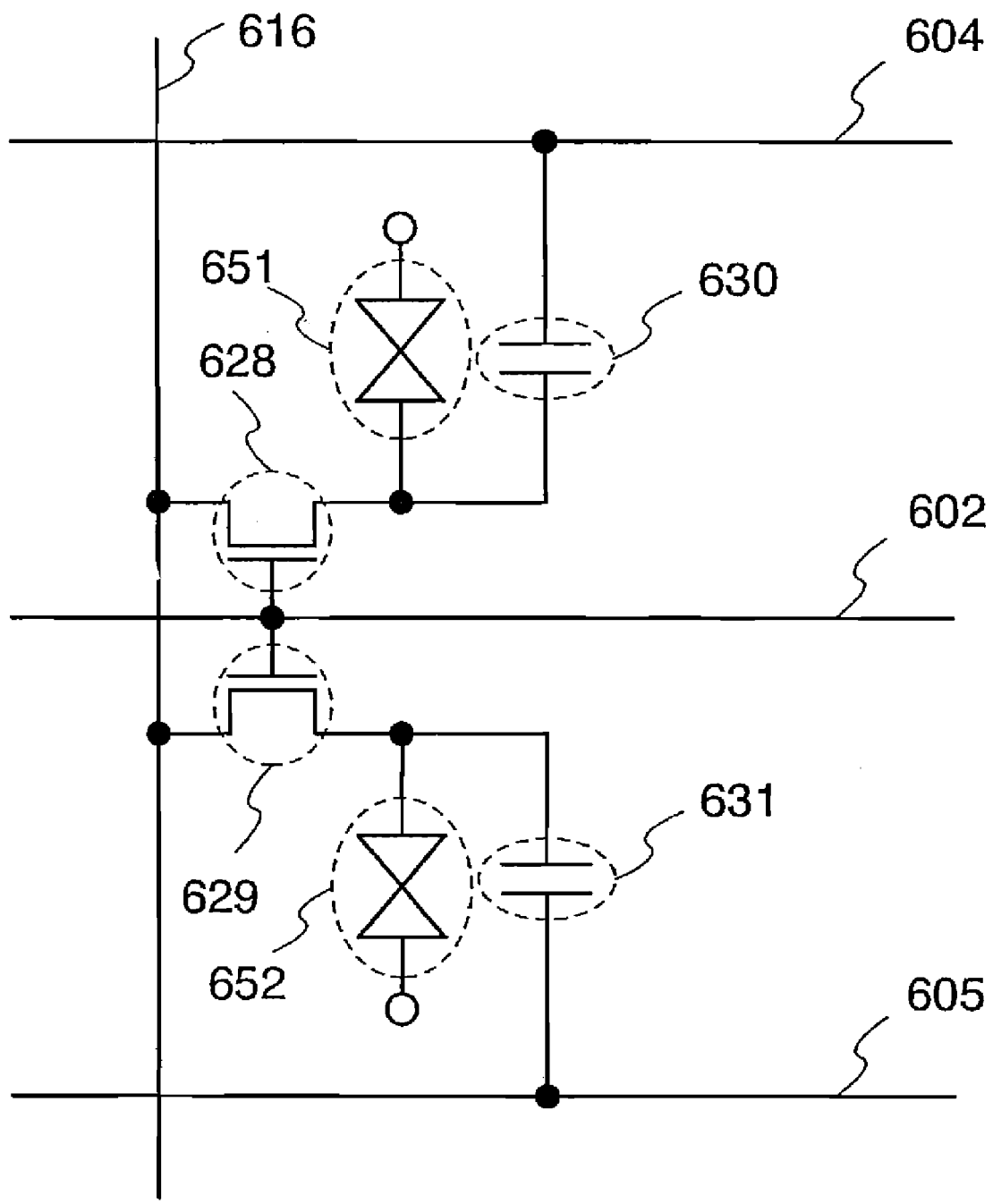
FIG. 15 is an explanatory diagram of a display device of the present invention.

A pixel electrode 626 and a storage capacitor portion 631 which are connected to the TFT 629 and shown in FIG. 15 can be formed in a manner similar to the pixel electrode 624 and the storage capacitor portion 630, respectively. Both the TFT 628 and the TFT 629 are connected to the wiring 616. A pixel of this liquid crystal display panel includes the pixel electrodes 624 and 626. Each of the pixel electrodes 624 and 626 is a sub-pixel.

FIG. 14 shows a structure of the counter substrate side. The counter electrode 640 is formed over the light shielding film 632. The counter electrode 640 is preferably formed using a material similar to the pixel electrode 624. The projection 644 for controlling alignment of the liquid crystal is formed over the counter electrode 640. Moreover, the spacer 642 is formed corresponding to the position of the light shielding film 632.

FIG. 15 shows an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged in an engaging manner and thus, an oblique electric field is effectively generated to control alignment of the liquid crystal, so that a direction of alignment of the liquid crystal varies depending on location. That is, a viewing angle of the liquid crystal display panel is increased by domain multiplication.

Next, another VA liquid crystal display device, which is different from the above-described device, is described with reference to FIGS. 16 to 19.

Figure 16:
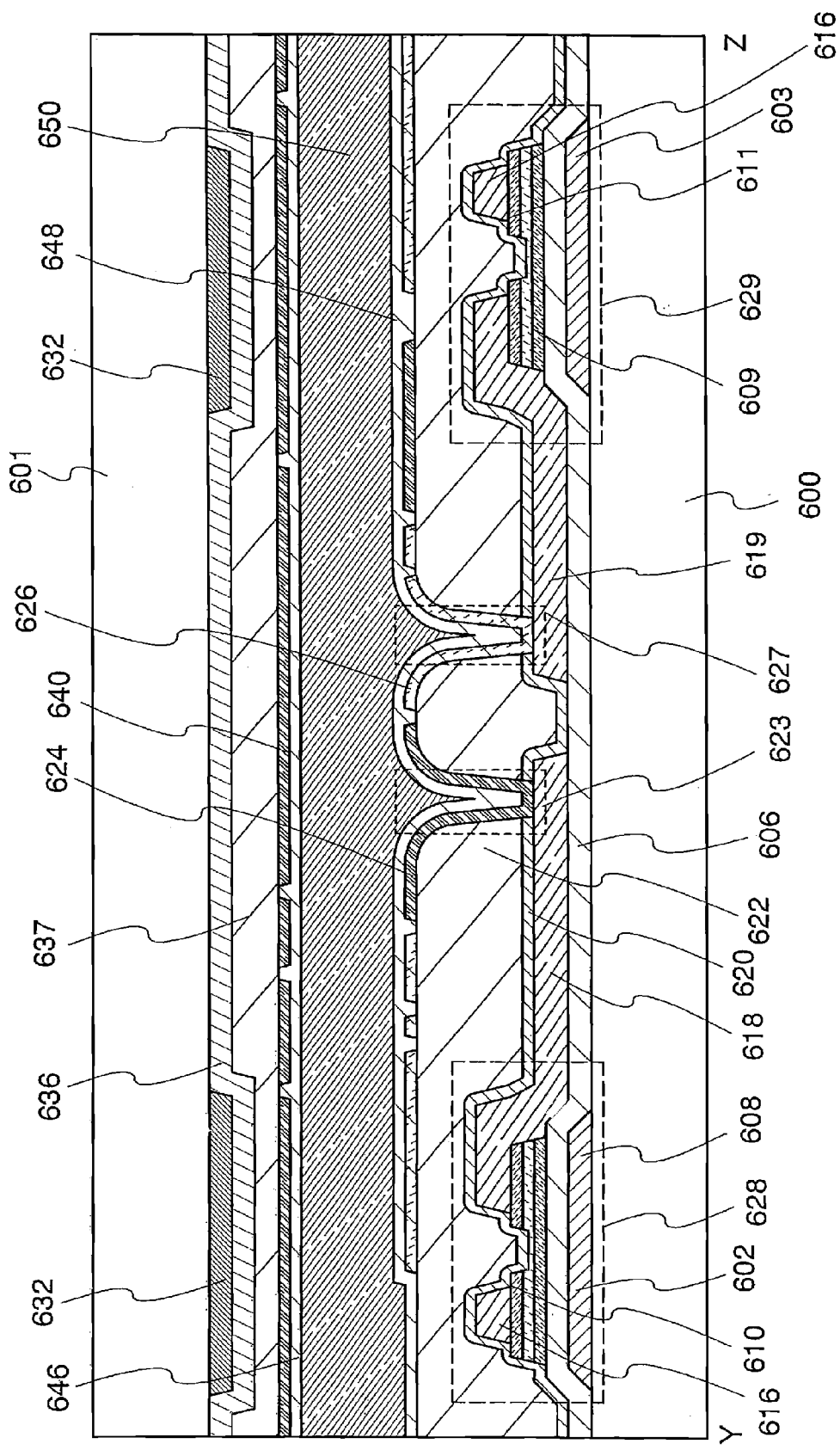
FIG. 16 is an explanatory diagram of a display device of the present invention.
Figure 17:
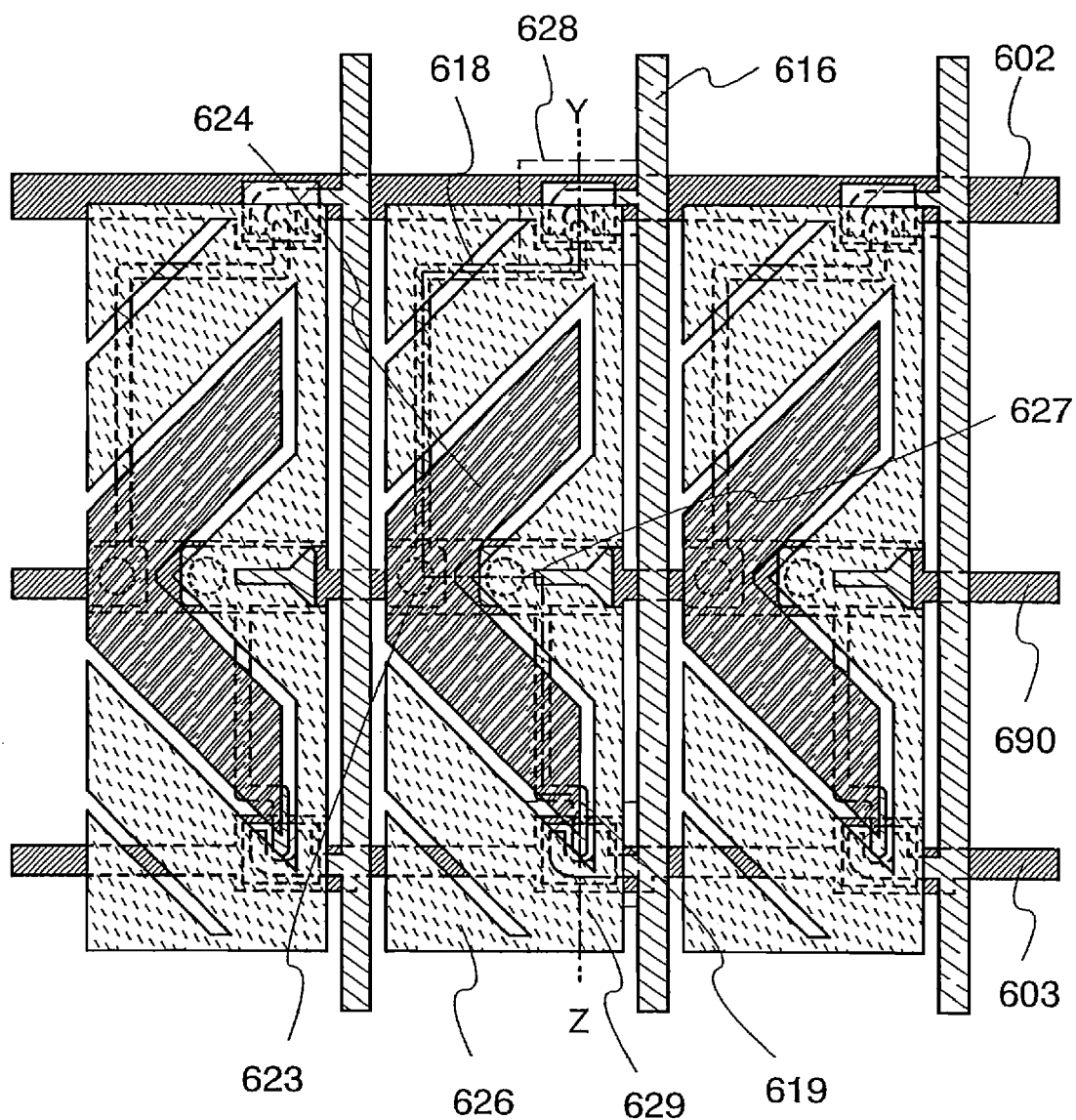
FIG. 17 is an explanatory diagram of a display device of the present invention.

FIGS. 16 and 17 each show a pixel structure of the VA liquid crystal display device. FIG. 17 is a plan view of the substrate 600. FIG. 16 shows a cross-sectional structure along a line Y-Z in FIG. 17. Hereinafter, description is made with reference to these drawings.

In this pixel structure, a plurality of pixel electrodes is included in one pixel, and a TFT is connected to each pixel electrode. Each TFT is driven by a different gate signal. That is, a multi-domain pixel has a structure in which signals supplied to the respective pixel electrodes are individually controlled.

Via the contact hole 623, the pixel electrode 624 is connected to the TFT 628 through the wiring 618. Via a contact hole 627, the pixel electrode 626 is connected to the TFT 629 through a wiring 619. The gate wiring 602 of the TFT 628 and a gate wiring 603 of the TFT 629 are separated so that different gate signals can be given. In contrast, the wiring 616 serving as a data line is used in common for the TFTs 628 and 629. As each of the TFTs 628 and 629, the thin film transistor described in Embodiment Mode 1 can be used as appropriate. Further, a capacitor wiring 690 is provided.

Figure 19:
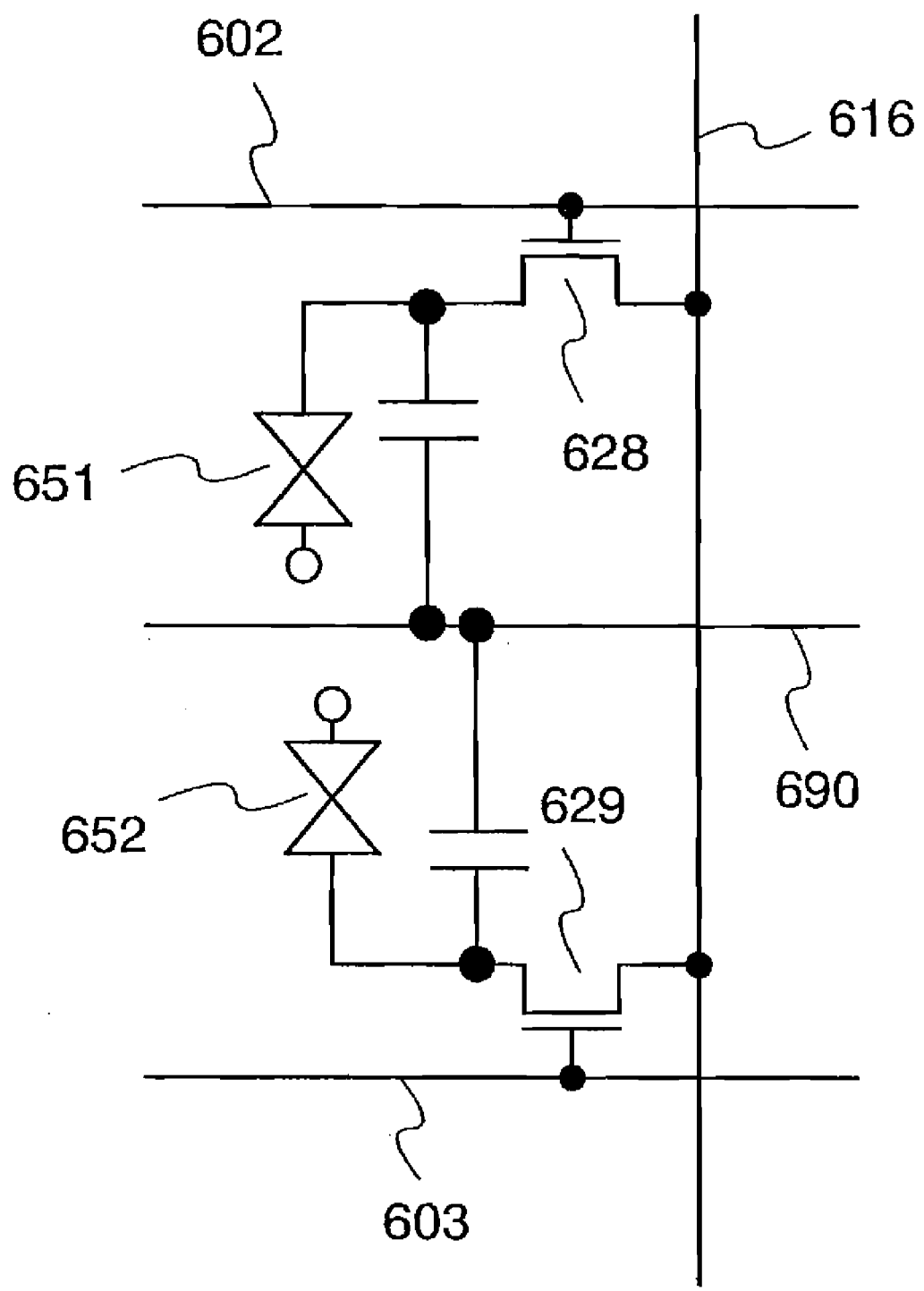
FIG. 19 is an explanatory diagram of a display device of the present invention.

The pixel electrodes 624 and 626 have different shapes and are separated by the slit 625. The pixel electrode 626 is formed so as to surround the external side of the pixel electrode 624 which is spread in a V shape. Timing of voltage application is made to vary between the pixel electrodes 624 and 626 by the TFTs 628 and 629 in order to control alignment of the liquid crystal. FIG. 19 shows an equivalent circuit of this pixel structure. The TFT 628 is connected to the gate wiring 602. The TFT 629 is connected to the gate wiring 603. When different gate signals are supplied to the gate wirings 602 and 603, operation timings of the MS 628 and 629 can vary.

Figure 18:
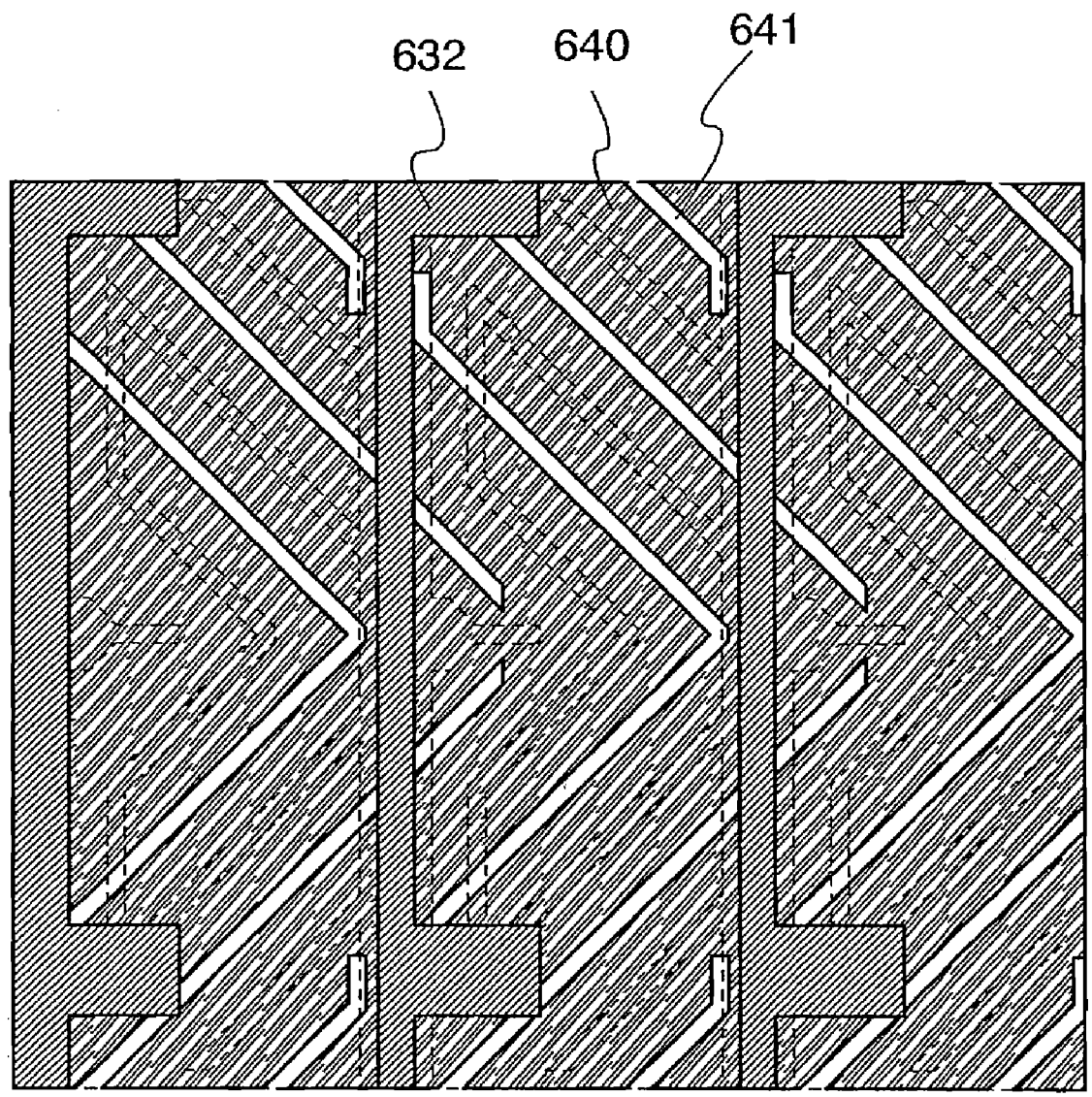
FIG. 18 is an explanatory diagram of a display device of the present invention.

The counter substrate 601 is provided with the light shielding film 632, the second color film 636, and the counter electrode 640. Moreover, a planarization film 637 is formed between the second color film 636 and the counter electrode 640 to prevent alignment disorder of the liquid crystal. FIG. 18 shows a structure of the counter substrate side. A slit 641 is formed in the counter electrode 640, which is used in common between different pixels. The slit 641 and the slit 625 on the pixel electrodes 624 and 626 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased.

A first liquid crystal element is formed by overlapping of the pixel electrode 624, the liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Next, a horizontal electric field liquid crystal display device is described. The horizontal electric field mode is a method in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 20:
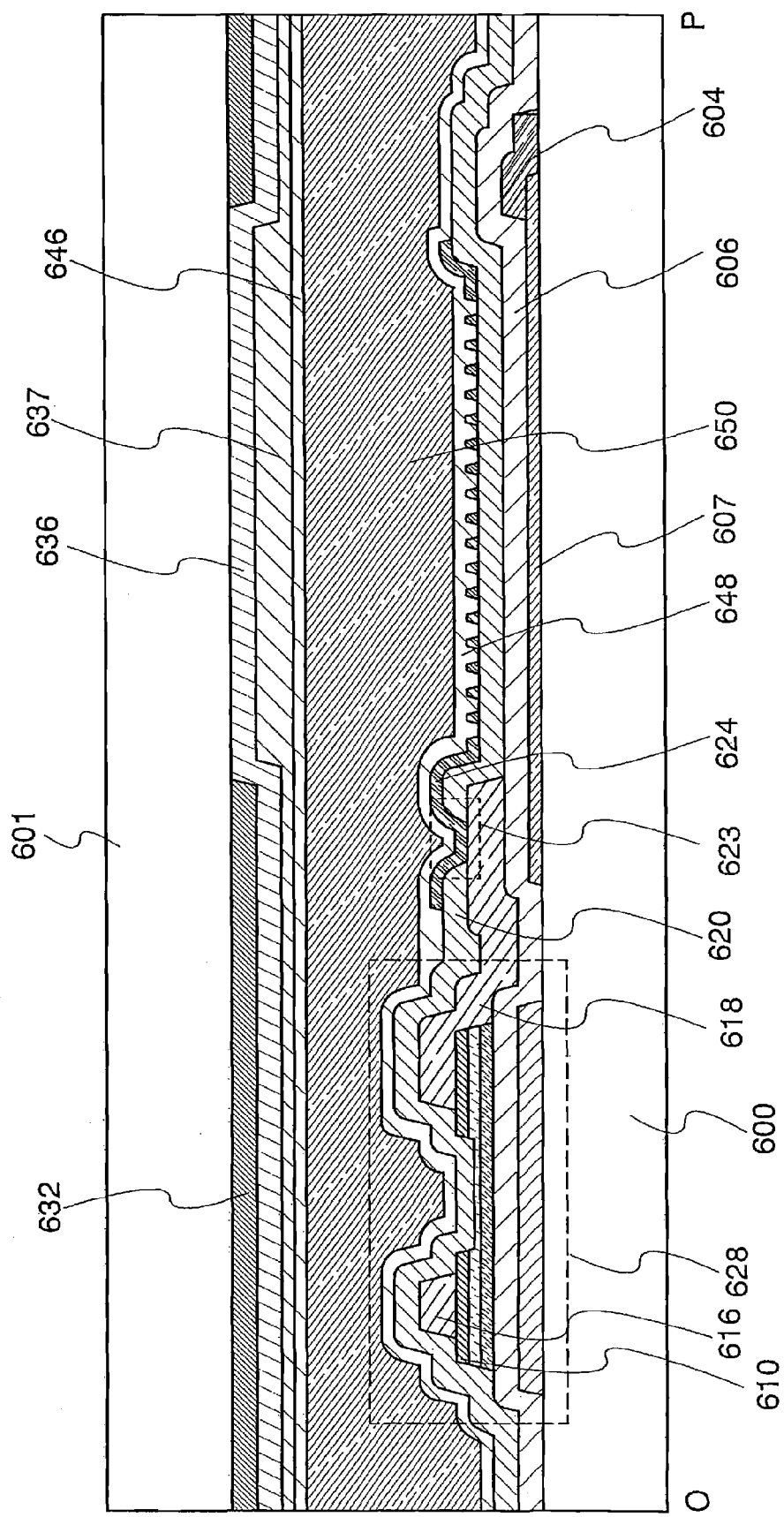
FIG. 20 is an explanatory diagram of a display device of the present invention.

FIG. 20 illustrates a state in which the substrate 600 provided with the TFT 628 and the pixel electrode 624 connected to the TFT 628 overlaps with the counter substrate 601, and liquid crystal is injected. The counter substrate 601 is provided with the light shielding film 632, the second color film 636, the planarization film 637, and the like. Since the pixel electrode is provided on the substrate 600 side, it is not provided on the counter substrate 601 side. The liquid crystal layer 650 is formed between the substrate 600 and the counter substrate 601.

A first pixel electrode 607, the capacitor wiring 604 connected to the first pixel electrode 607, and the TFT 628 described in Embodiment Mode 1 are formed over the substrate 600. The first pixel electrode 607 can be formed using a material similar to the pixel electrode 77 described in Embodiment Mode 1. The first pixel electrode 607 is formed in a shape which is compartmentalized roughly in a pixel shape. Note that the gate insulating film 606 is formed over the first pixel electrode 607 and the capacitor wiring 604.

The wirings 616 and 618 of the TFT 628 are formed over the gate insulating film 606. The wiring 616 serves as a data line extending in one direction, through which a video signal is transmitted in a liquid crystal display panel, and is connected to a source region 610 and serves as one of a source electrode and a drain electrode. The wiring 618 serves as the other of the source electrode and the drain electrode, and is connected to the second pixel electrode 624.

The second insulating film 620 is formed over the wirings 616 and 618. Over the insulating film 620, the second pixel electrode 624 connected to the wiring 618 via a contact hole formed in the insulating film 620 is formed. The pixel electrode 624 is formed using a material similar to the pixel electrode 77 described in Embodiment Mode 1.

In such a manner, the TFT 628 and the second pixel electrode 624 connected to the TFT 628 are formed over the substrate 600. Note that a storage capacitor is formed between the first pixel electrode 607 and the second pixel electrode 624.

Figure 21:
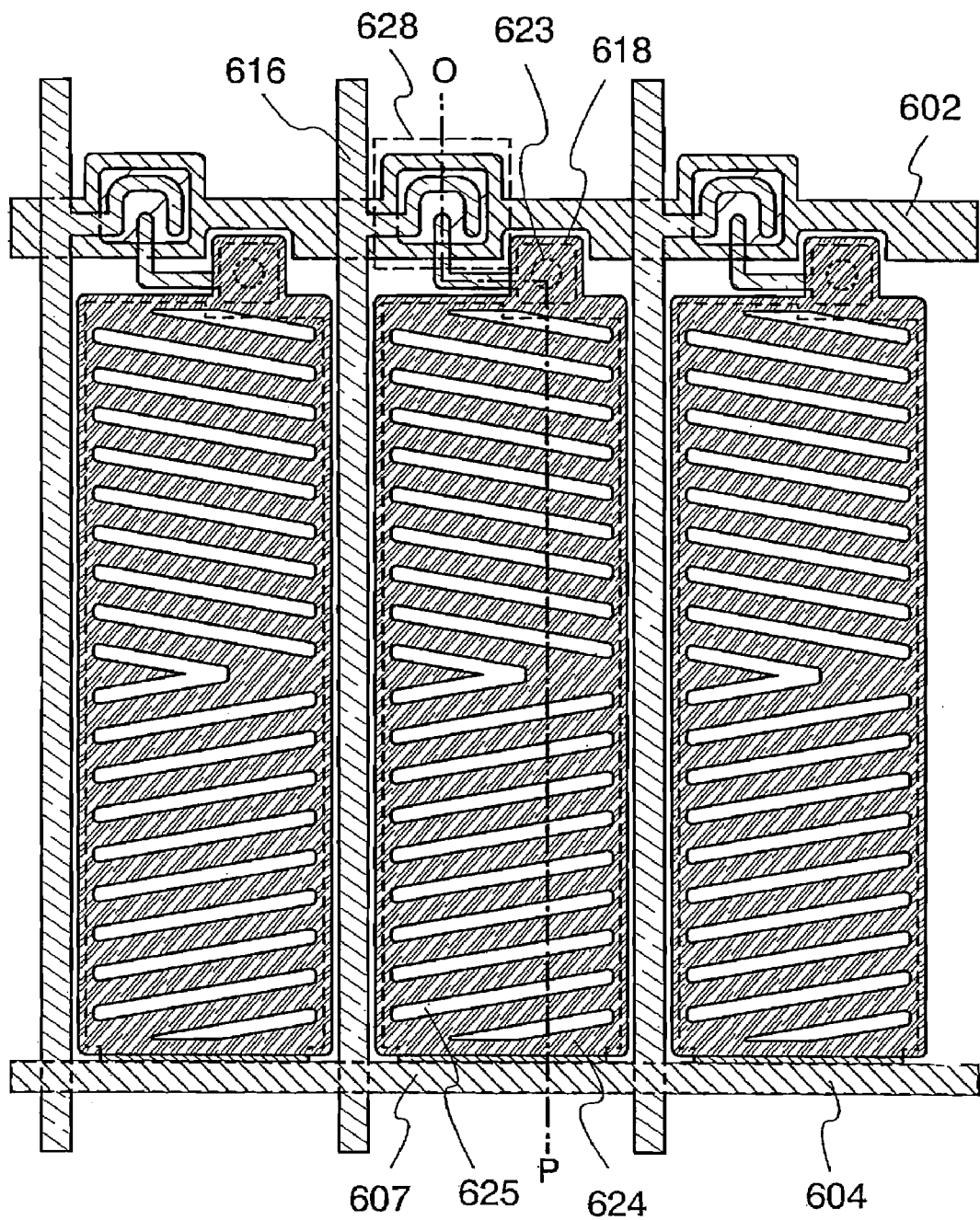
FIG. 21 is an explanatory diagram of a display device of the present invention.

FIG. 21 is a plan view illustrating a structure of the pixel electrode. FIG. 20 is a cross-sectional structure corresponding to a line O-P in FIG. 21. The pixel electrode 624 is provided with the slit 625. The slit 625 is for controlling alignment of the liquid crystal. In this case, an electric field is generated between the first pixel electrode 607 and the second pixel electrode 624. The thickness of the gate insulating film 606 formed between the first pixel electrode 607 and the second pixel electrode 624 is 50 nm to 200 nm, which is thin enough compared with the liquid crystal layer with a thickness of 2 μm to 10 μm. Accordingly, an electric field is generated substantially in parallel (in a horizontal direction) to the substrate 600. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Further, since both the first pixel electrode 607 and the second pixel electrode 624 are light-transmitting electrodes, an aperture ratio can be increased.

Next, another example of a horizontal electric field liquid crystal display device is described.

Figure 22:
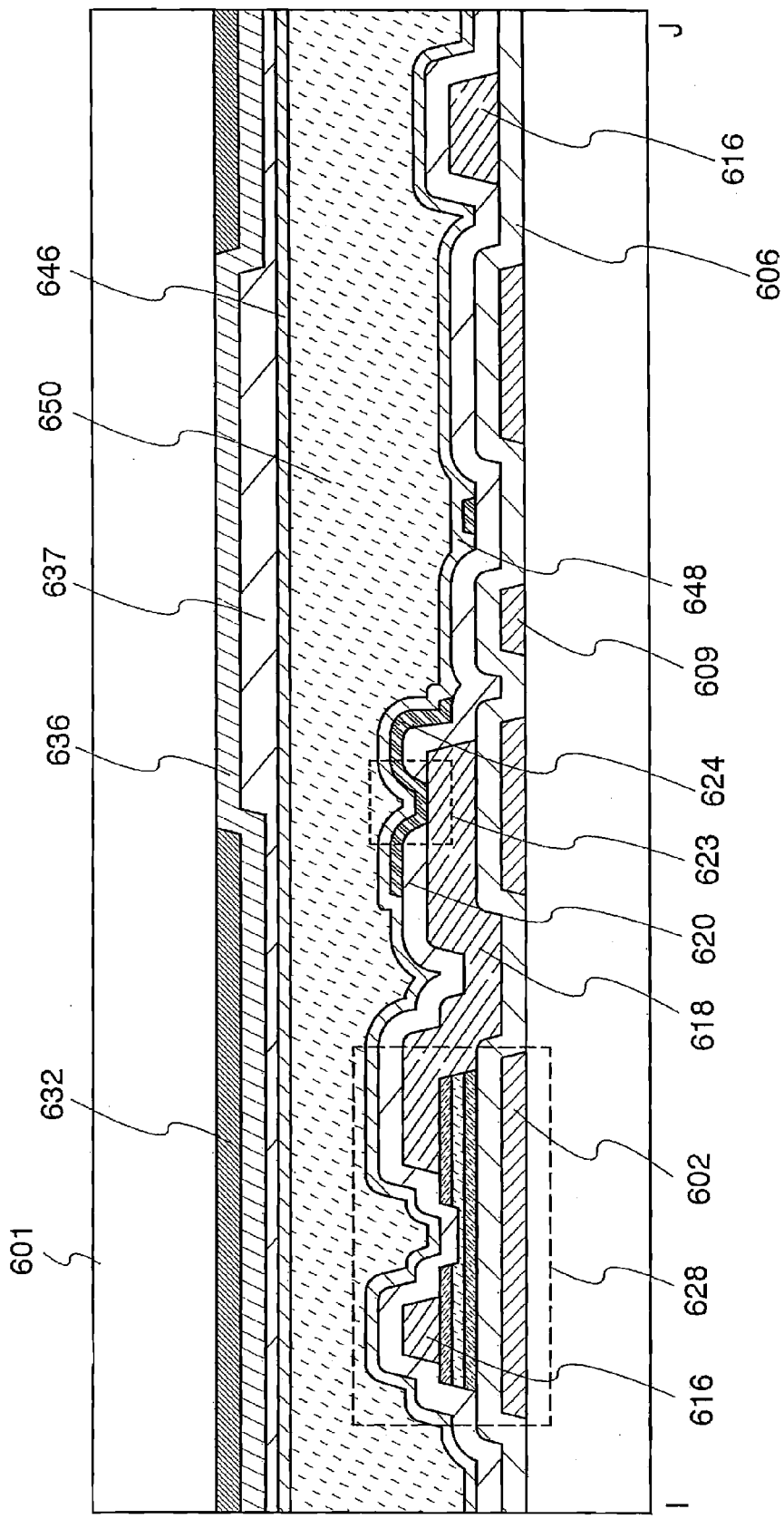
FIG. 22 is an explanatory diagram of a display device of the present invention.
Figure 23:
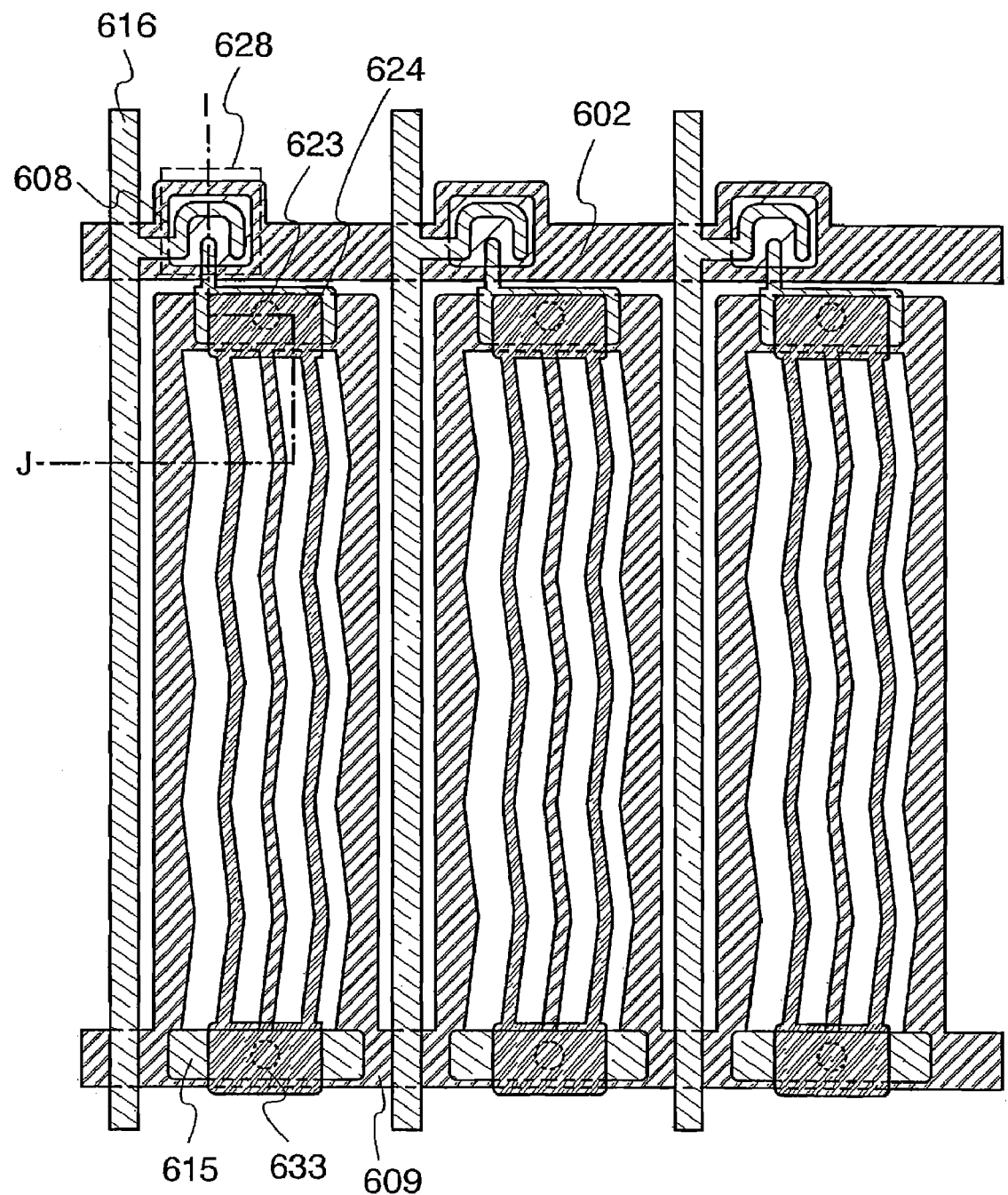
FIG. 23 is an explanatory diagram of a display device of the present invention.

FIGS. 22 and 23 each show a pixel structure of an in-plane switching (IPS) liquid crystal display device. FIG. 23 is a plan view. FIG. 22 shows a cross-sectional structure along a line I-J in FIG. 23. Hereinafter, description is made with reference to these drawings.

FIG. 22 illustrates a state in which the substrate 600 provided with the TFT 628 and the pixel electrode 624 connected to the TFT 628 overlaps with the counter substrate 601, and liquid crystal is injected. The counter substrate 601 is provided with the light shielding film 632, the second color film 636, the planarization film 637, and the like. Since the pixel electrode is provided on the substrate 600 side, it is not provided on the counter substrate 601 side. The liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as the gate wiring 602 of the TFT 628. The first pixel electrode 607 is formed in a shape which is compartmentalized roughly in a pixel shape.

The wirings 616 and 618 of the TFT 628 are formed over the gate insulating film 606. The wiring 616 serves as a data line extending in one direction, through which a video signal is transmitted in a liquid crystal display panel, and is connected to the source region 610 and serves as one of a source electrode and a drain electrode. The wiring 618 serves as the other of the source electrode and the drain electrode, and is connected to the second pixel electrode 624.

The second insulating film 620 is formed over the wirings 616 and 618. Over the insulating film 620, the second pixel electrode 624 connected to the wiring 618 via the contact hole 623 formed in the insulating film 620 is formed. The pixel electrode 624 is formed using a material similar to the pixel electrode 77 described in Embodiment Mode 1. Note that as shown in FIG. 23, the pixel electrode 624 is formed so as to generate a horizontal electric field with a comb-shaped electrode which is formed at the same time as the common potential line 609. Moreover, the pixel electrode 624 is formed so that comb-teeth portions of the pixel electrode 624 are alternately engaged with the comb-shaped electrode which is formed at the same time as the common potential line 609.

Alignment of the liquid crystal is controlled by an electric field generated between a potential applied to the pixel electrode 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode 624 connected to the TFT 628 are formed over the substrate 600. A storage capacitor is formed by the common potential line 609, a capacitor electrode 615, and the gate insulating film 606 provided therebetween. The capacitor electrode 615 and the pixel electrode 624 are connected via a contact hole 633.

Next, a mode of a TN liquid crystal display device is described.

Figure 24:
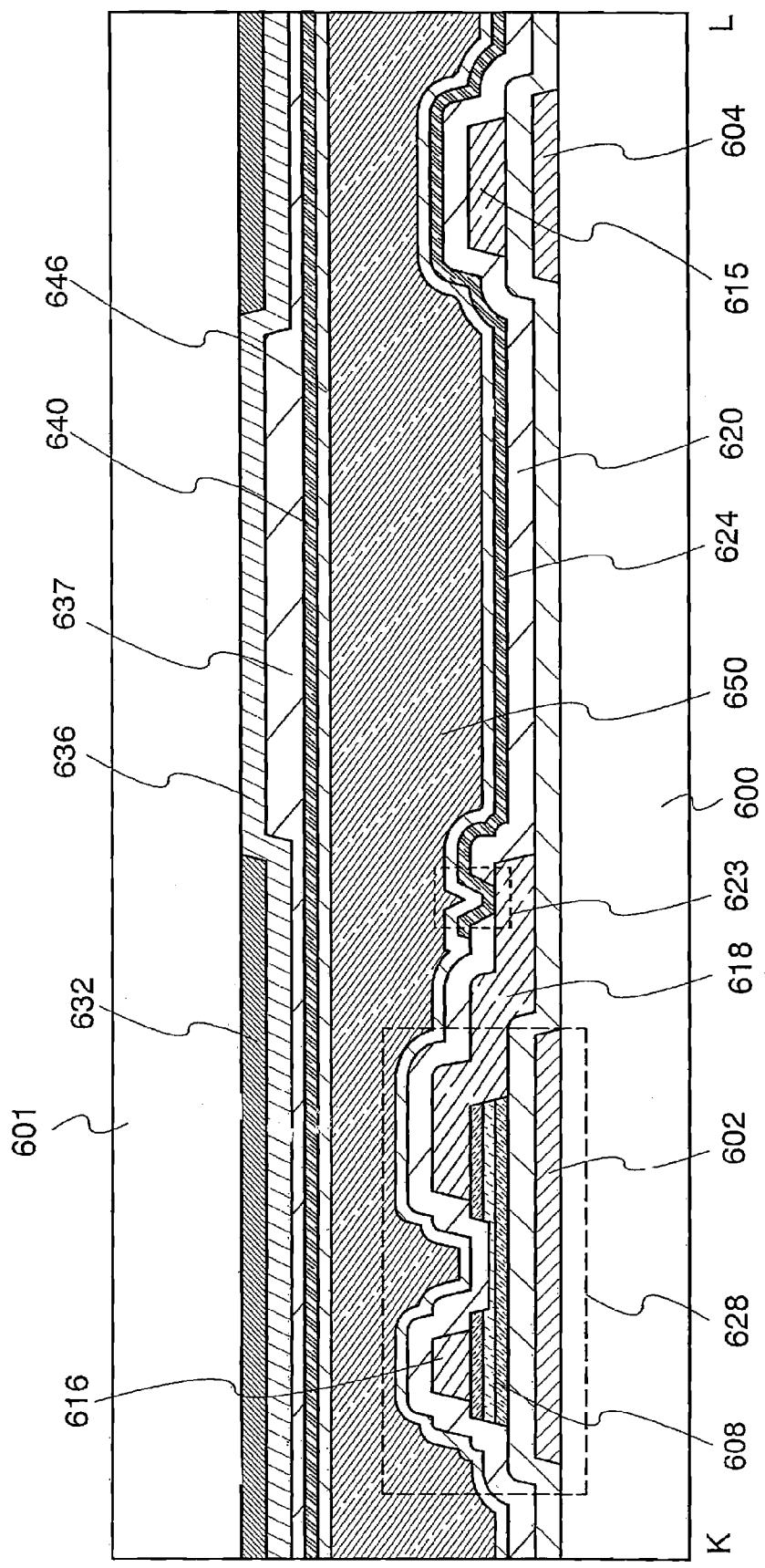
FIG. 24 is an explanatory diagram of a display device of the present invention.
Figure 25:
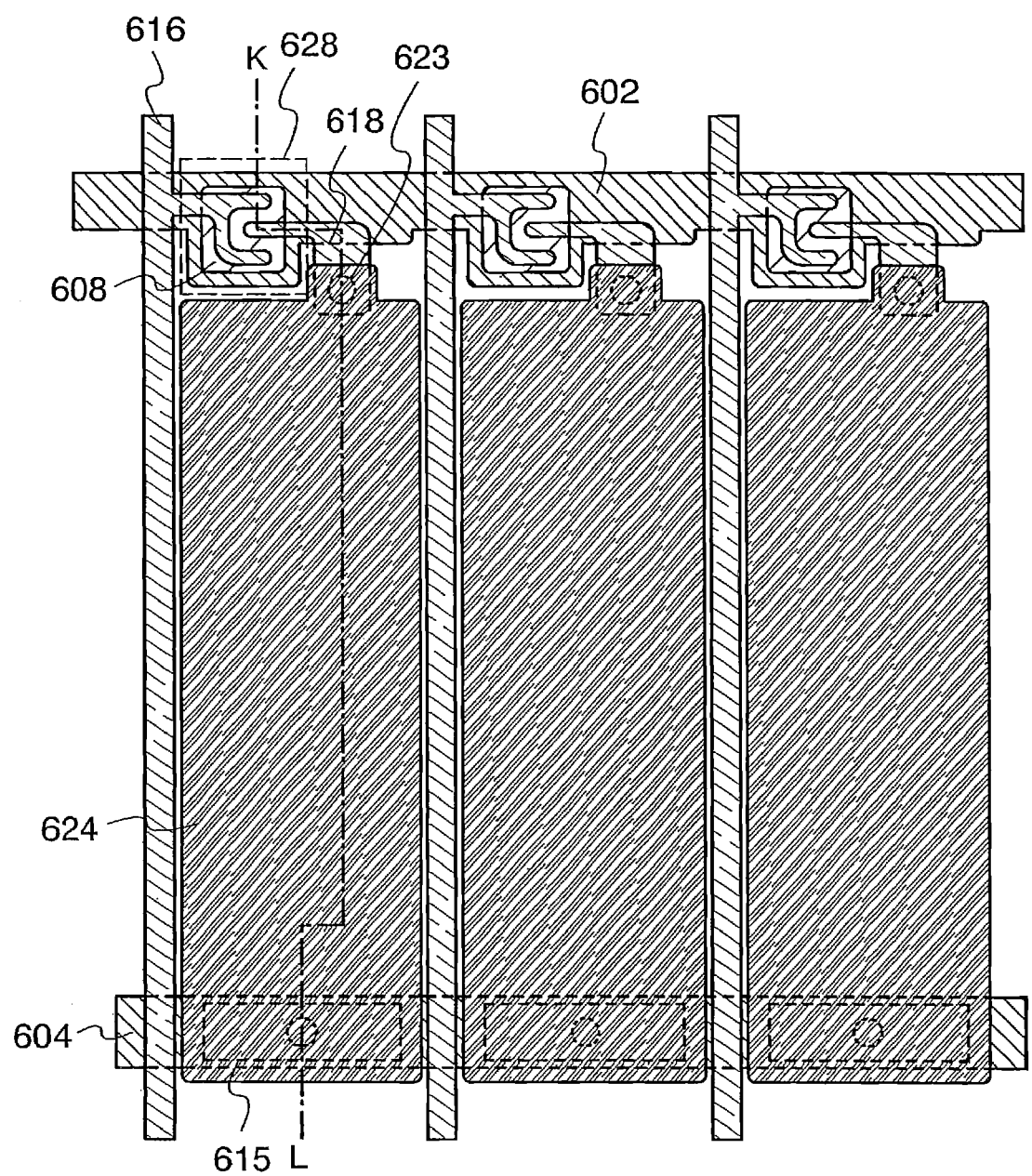
FIG. 25 is an explanatory diagram of a display device of the present invention.

FIGS. 24 and 25 each show a pixel structure of a TN liquid crystal display device. FIG. 25 is a plan view. FIG. 24 shows a cross-sectional structure along a line K-L in FIG. 25. Hereinafter, description is made with reference to these drawings.

The pixel electrode 624 is connected to the TFT 628 by the wiring 618 via the contact hole 623. The wiring 616 serving as a data line is connected to the 628. As the TFT 628, any of the TFTs is described in Embodiment Mode 1 can be used.

The pixel electrode 624 is formed using the pixel electrode 77 described in Embodiment Mode 1.

The counter substrate 601 is provided with the light shielding film 632, the second color film 636, and the counter electrode 640. The planarization film 637 is formed between the second color film 636 and the counter electrode 640 to prevent alignment disorder of liquid crystal. The liquid crystal layer 650 is formed between the pixel electrode 624 and the counter electrode 640.

A liquid crystal element is formed by overlapping of the pixel electrode 624, the liquid crystal layer 650, and the counter electrode 640.

The substrate 600 or the counter substrate 601 may be provided with a color filter, a shielding film (a black matrix) for preventing disclination, or the like. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode 640 is formed.

Through the above-described steps, the liquid crystal display device can be formed. Since a thin film transistor with small off current and with high reliability and high electric properties is used in the liquid crystal display device of this embodiment mode, the liquid crystal display device has high contrast and high visibility. Further, since a thin film transistor including a microcrystalline silicon film which is formed without any laser crystallization step is used, a liquid crystal display device with high visibility can be formed with high mass productivity.

Embodiment Mode 8

Next, a structure of a light-emitting panel, which is one mode of a light-emitting device of the present invention, is described below. This embodiment mode describes a liquid crystal display panel which is one mode of a liquid crystal display device having a liquid crystal display element as a display element (the liquid crystal display panel is also referred to as a liquid crystal panel) and a light-emitting display panel which is one mode of a display device having a light-emitting element as a display element (the light-emitting display panel is also referred to as a light-emitting panel).

Figure 6A:
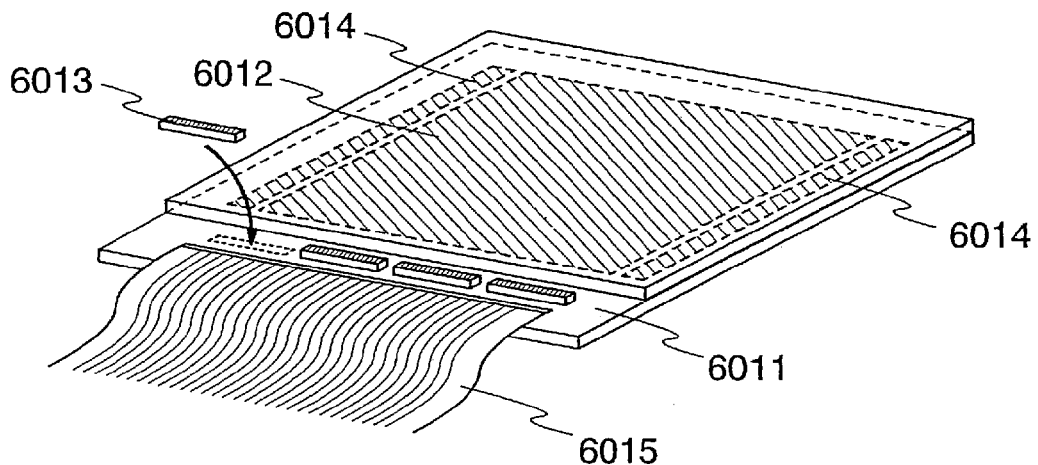
FIGS. 6A to 6C are explanatory diagrams of a method for manufacturing a semiconductor device of the present invention.

FIG. 6A shows a mode of a light-emitting display panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used. When the signal line driver circuit is formed using a transistor in which higher mobility can be obtained compared with the thin film transistor in which the microcrystalline semiconductor film is used, an operation of the signal line driver circuit which demands higher driving frequency than that of the scan line driver circuit can be stabilized. Note that the signal line driver circuit 6013 may be formed using a transistor using a single crystalline semiconductor, a thin film transistor using a polycrystalline semiconductor, or a transistor using SOI. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 6B:
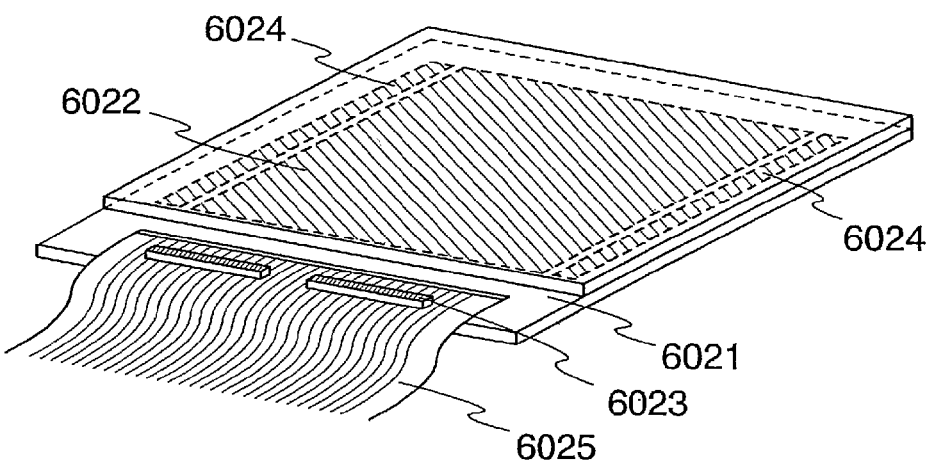

When a driver circuit is separately formed, a substrate over which the driver circuit is formed is not necessarily attached to a substrate over which a pixel portion is formed, and may be attached over an FPC, for example. FIG. 6B shows a mode of a light-emitting device panel in which a signal line driver circuit 6023 which is separately formed is connected to a pixel portion 6022 and a scan line driver circuit 6024 formed over a substrate 6021. The pixel portion 6022 and the scan line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 6C:
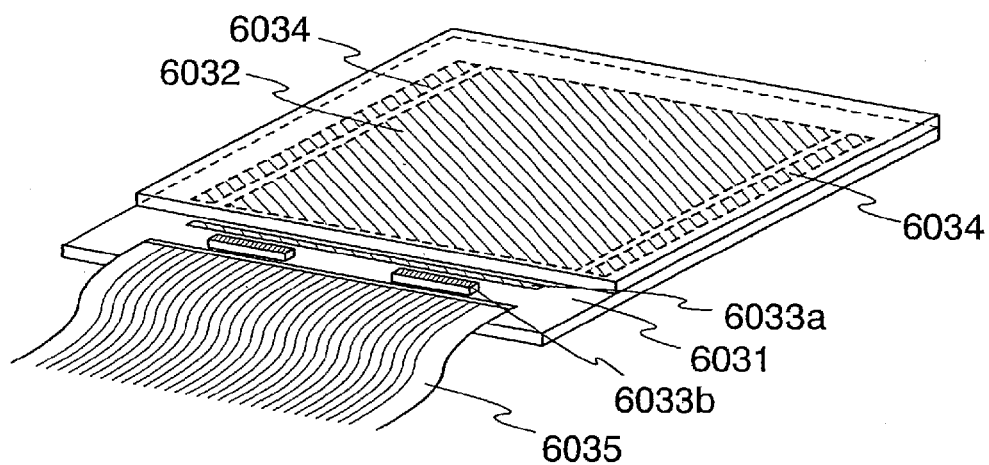

Alternatively, only part of a signal line driver circuit or part of a scan line driver circuit may be formed over the same substrate as a pixel portion by using a thin film transistor in which a microcrystalline semiconductor film is used, and the other part of the driver circuit may be separately formed and electrically connected to the pixel portion. FIG. 6C shows a mode of a light-emitting device panel in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 6A to 6C, in a light-emitting device of the present invention, all or a part of the driver circuit can be formed over the same substrate as the pixel portion, using the thin film transistor in which the microcrystalline semiconductor film is used.

Note that a connection method of a substrate which is separately formed is not particularly limited, and a known COG method, wire bonding method, TAB method, or the like can be used. Further, a connection position is not limited to the positions shown in FIGS. 6A to 6C as long as electrical connection is possible. Moreover, a controller, a CPU, a memory, or the like may be formed separately and connected.

Note that a signal line driver circuit used in the present invention is not limited to a structure including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 11A:
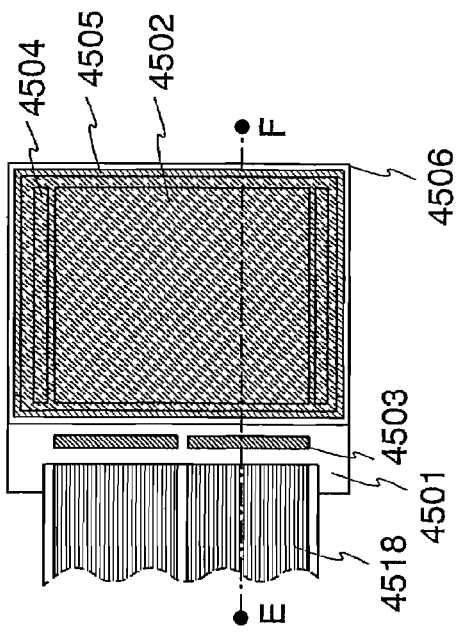
FIGS. 11A and 11B are explanatory diagrams of a display device of the present invention.
Figure 11B:
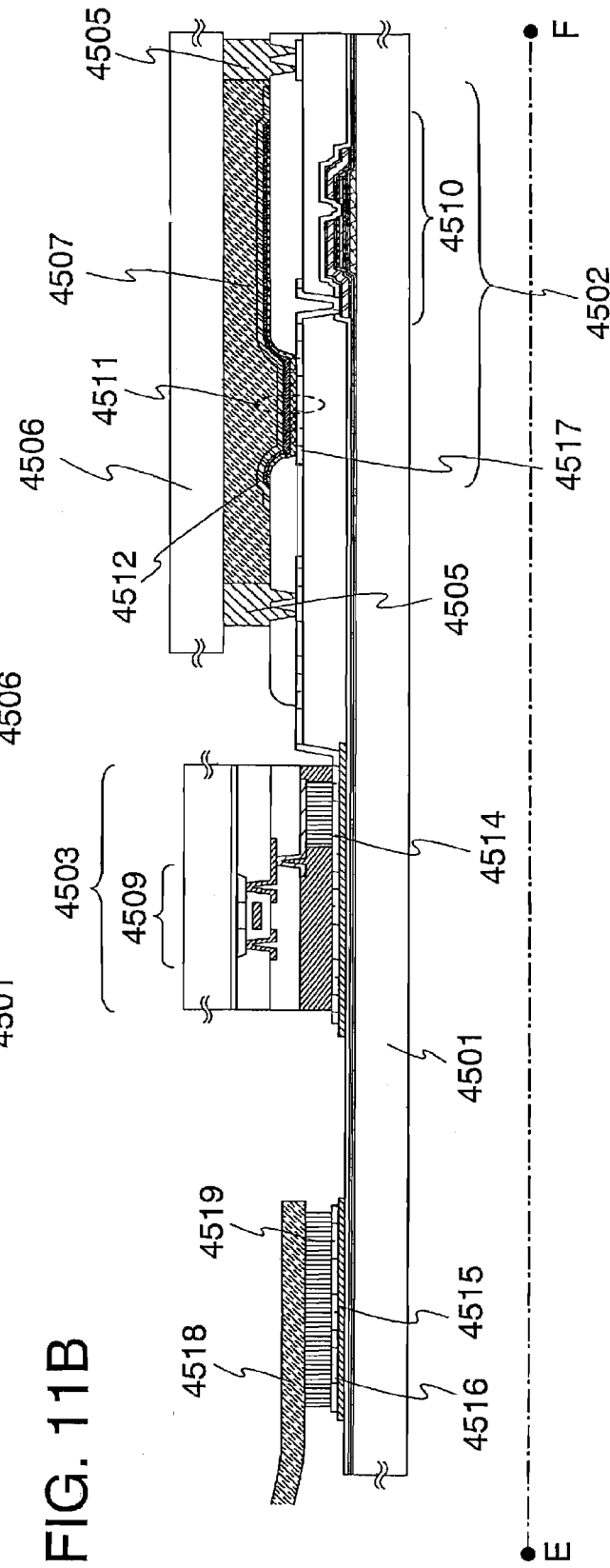

Next, the appearance and a cross section of a light-emitting display panel which is one mode of the display device of the present invention are described with reference to FIGS. 11A and 11B. FIG. 11A is a top plan view of a panel. In the panel, a thin film transistor in which a microcrystalline semiconductor film is used and a light-emitting element which are formed over a first substrate are sealed between the first substrate and a second substrate by a sealing material. FIG. 11B is a cross-sectional view along a line E-F in FIG. 11A.

The sealing material 4505 is provided so as to surround a pixel portion 4502 and a scan line driver circuit 4504 which are provided over the first substrate 4501. The second substrate 4506 is provided over the pixel portion 4502 and the scan line driver circuit 4504. Accordingly, the pixel portion 4502 and the scan line driver circuit 4504 are sealed together with a filler 4507 by the first substrate 4501, the sealing material 4505, and the second substrate 4506. Further, a signal line driver circuit 4503 formed using a polycrystalline semiconductor film over a different substrate is mounted on a region over the first substrate 4501, which is different from the region surrounded by the sealing material 4505. Note that in this embodiment mode, an example is described in which the signal line driver circuit including a thin film transistor using a polycrystalline semiconductor film is attached to the first substrate 4501; however, a signal line driver circuit may be formed using a transistor using a single crystalline semiconductor and attached to a substrate. FIGS. 11A and 11B illustrate a thin film transistor 4509 formed using a polycrystalline semiconductor film, which is included in the signal line driver circuit 4503.

Each of the pixel portion 4502 and the scan line driver circuit 4504 which are provided over the first substrate 4501 includes a plurality of thin film transistors. FIG. 11B illustrates the thin film transistor 4510 included in the pixel portion 4502. Note that in this embodiment mode, description is made on the assumption that the thin film transistor 4510 is a driving TFT; however, the thin film transistor 4510 may be a TFT for current control or a TFT for erasing. The thin film transistor 4510 corresponds to a thin film transistor in which a microcrystalline semiconductor film is used, and can be similarly manufactured through the steps described in Embodiment Modes 1 to 4.

Reference numeral 4511 denotes a light-emitting element. A pixel electrode included in the light-emitting element 4511 is electrically connected to a source or drain electrode of the thin film transistor 4510 via a wiring 4517. Moreover, in this embodiment mode, a light-transmitting conductive film 4512 is electrically connected to a common electrode of the light-emitting element 4511. Note that a structure of the light-emitting element 4511 is not limited to that described in this embodiment mode. The structure of the light-emitting element 4511 can be changed as appropriate depending on a direction in which light is extracted from the light-emitting element 4511, the polarity of the thin film transistor 4510, or the like.

Although not shown in the cross-sectional view of FIG. 11B, a variety of signals and a potential supplied to the separately formed signal line driver circuit 4503, the pixel portion 4502, and the scan line driver circuit 4504 are supplied from an FPC 4518 through lead wirings 4514 and 4515.

In this embodiment mode, a connection terminal 4516 is formed using the same conductive film as the pixel electrode included in the light-emitting element 4511. Further, the lead wirings 4514 and 4515 are formed using the same conductive film as the wiring 4517.

The connection terminal 4516 is electrically connected to a terminal included in the FPC 4518 through an anisotropic conductive film 4519.

The substrate located in the direction in which light is extracted from the light-emitting element 4511 needs to be transparent. In this case, a light-transmitting material such as a glass plate, a plastic plate, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler 4507.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. Further, the polarizing plate or the circular polarizing plate may be provided with an antireflection film. For example, anti-glare treatment for diffusing reflected light by unevenness of the surface and reducing reflection can be performed.

FIGS. 11A and 11B illustrate an example in which the signal line driver circuit 4503 is separately formed and attached to the first substrate 4501; however, this embodiment mode is not limited to this structure. A scan line driver circuit may be separately formed and attached to a substrate, or only part of a signal line driver circuit or part of a scan line driver circuit may be separately formed and attached to a substrate.

Next, the appearance and a cross section of a liquid crystal display panel which is one mode of the liquid crystal display device of the present invention are described with reference to FIGS. 26A and 26B. FIG. 26A is a top plan view of a panel. In the panel, a thin film transistor 4010 in which a microcrystalline semiconductor film is used and a liquid crystal element 4013 which are formed over a first substrate 4001 are sealed between the first substrate 4001 and a second substrate 4006 by a sealing material 4005. FIG. 26B is a cross-sectional view along a line M-N in FIG. 26A.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 are sealed together with liquid crystal 4008 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIGS. 26A and 26B illustrate a thin film transistor 4009 formed using a polycrystalline semiconductor film, which is included in the signal line driver circuit 4003.

Each of the pixel portion 4002 and the scan line driver circuit 4004 which are provided over the first substrate 4001 includes a plurality of thin film transistors. FIG. 26B illustrates the thin film transistor 4010 included in the pixel portion 4002. The thin film transistor 4010 corresponds to a thin film transistor in which a microcrystalline semiconductor film is used, and can be similarly manufactured through the steps described in Embodiment Modes 1 to 4.

Reference numeral 4013 denotes a liquid crystal element, and a pixel electrode 4030 included in the liquid crystal element 4013 is electrically connected to a wiring 4040 and a wiring 4041 of the thin film transistor 4010. A counter electrode 4031 of the liquid crystal element 4013 is formed on the second substrate 4006. A portion where the pixel electrode 4030, the counter electrode 4031, and the liquid crystal 4008 overlap with each other corresponds to the liquid crystal element 4013.

Note that for each of the first substrate 4001 and the second substrate 4006, glass, metal (typically, stainless steel), ceramic, or plastic can be used. As plastic, a fiberglass-reinforced plastics (FRP) plate, a polyvinyl fluoride (PVF) film, a polyester film, or an acrylic resin film can be used. Moreover, a sheet in which aluminum foil is interposed between PVF films or polyester films can also be used.

A spherical spacer 4035 is provided to control a distance (a cell gap) between the pixel electrode 4030 and the counter electrode 4031. Note that a spacer obtained by selective etching of an insulating film may be used.

A variety of signals and a potential supplied to the separately formed signal line driver circuit 4003, and either the scan line driver circuit 4004 or the pixel portion 4002 are supplied from an FPC 4018 through lead wirings 4014 and 4015.

In this embodiment mode, a connection terminal 4016 is formed using the same conductive film as the pixel electrode 4030 included in the liquid crystal element 4013. Further, the lead wirings 4014 and 4015 are formed using the same conductive film as the wiring 4041.

The connection terminal 4016 is electrically connected to a terminal included in the FPC 4018 through an anisotropic conductive film 4019.

Note that although not shown, a liquid crystal display device shown in this embodiment mode includes an alignment film and a polarizing plate, and may also include a color filter or a shielding film.

FIGS. 26A and 26B illustrate an example in which the signal line driver circuit 4003 is separately formed and attached to the first substrate 4001; however, this embodiment mode is not limited to this structure. A scan line driver circuit may be separately formed and attached to a substrate, or only part of a signal line driver circuit or part of a scan line driver circuit may be separately formed and attached to a substrate.

This embodiment mode can be implemented in combination with any of the structures described in the other embodiment modes.

Embodiment Mode 9

The display device obtained by the present invention can be used for a display module (an active matrix EL module or a liquid crystal module). That is, the present invention can be implemented in any of electronic devices having a display portion into which such an active matrix liquid crystal module is incorporated.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 7A to 7D show examples of such electronic devices.

Figure 7A:
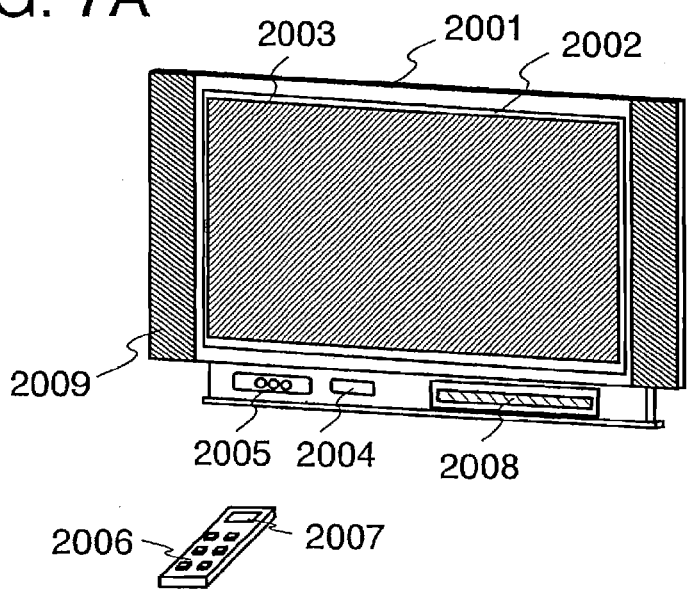
FIGS. 7A to 7D are diagrams showing electronic devices to which the present invention is applied.

FIG. 7A shows a television device. The television device can be completed by incorporating a display module into a housing as shown in FIG. 7A. A display panel at the stage after an FPC is attached is also referred to as a display module. A main screen 2003 is formed using the display module, and other accessories such as a speaker portion 2009 and an operation switch are provided. Thus, the television device can be completed.

As shown in FIG. 7A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit 2003 may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a light-emitting display panel with an excellent viewing angle, and the sub screen may be formed using a liquid crystal display panel in which display is performed with low power consumption. Alternatively, when reduction in power consumption is prioritized, a structure may be employed in which the main screen 2003 is formed using a light-emitting display panel, the sub screen is formed using a liquid crystal display panel, and the sub screen can be turned on and off.

Figure 8:
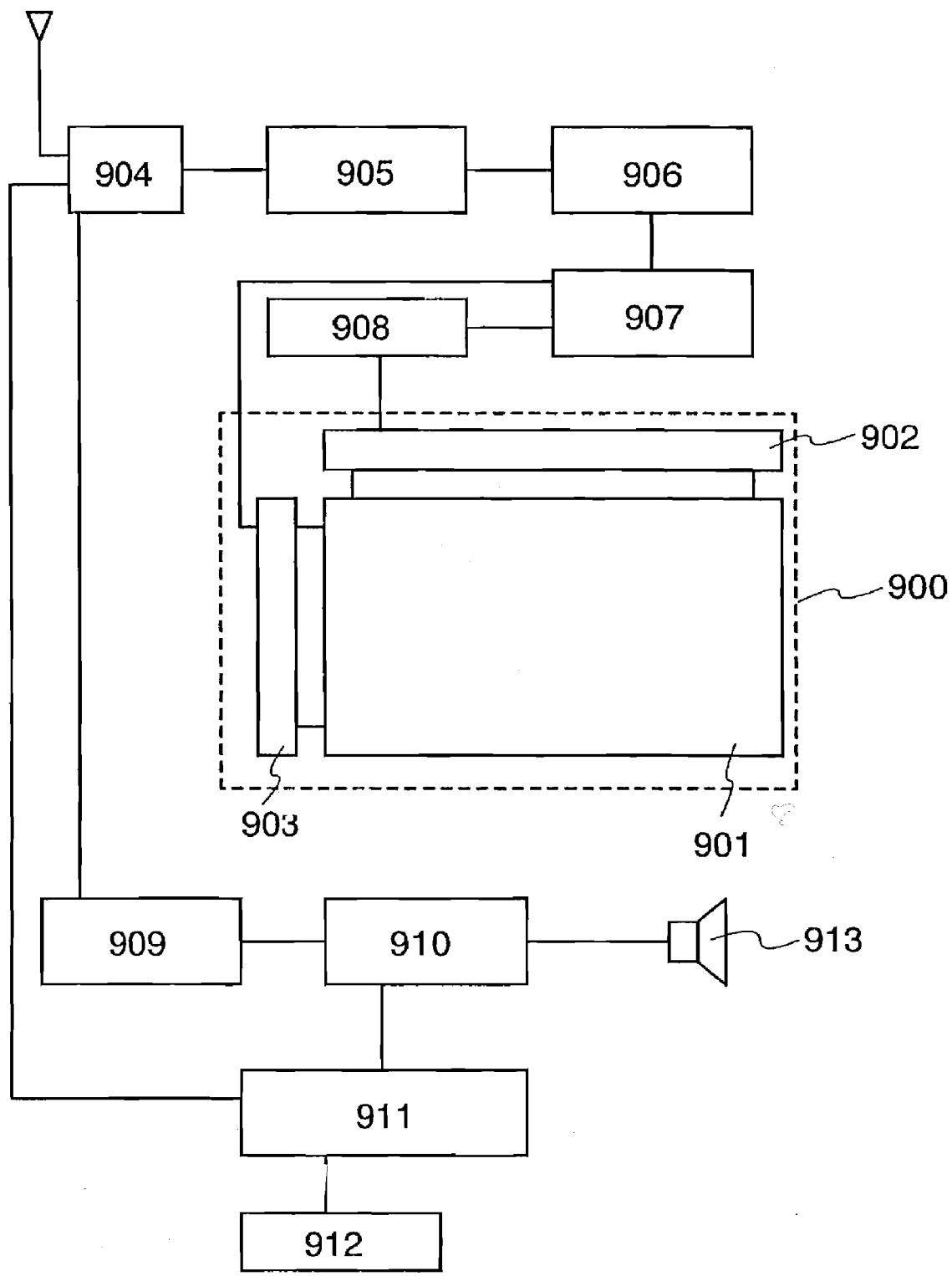
FIG. 8 is a block diagram illustrating a main structure of an electronic device to which the present invention is applied.

FIG. 8 is a block diagram of a main structure of a television device. A display panel 900 is provided with a pixel portion 901. A signal line driver circuit 902 and a scan line driver circuit 903 may be mounted on a substrate provided with the pixel portion 901 by a COG method.

As for other external circuits, the television device includes a video signal amplifier circuit 905 which amplifies a video signal among signals received by a tuner 904; a video signal processing circuit 906 which converts a signal output from the video signal amplifier circuit 905 into a color signal corresponding to each color of red, green, and blue; a control circuit 907 which converts the video signal into an input specification of a driver IC; and the like. The control circuit 907 outputs signals to each of the scan line side and the signal line side. When digital driving is performed, a structure may be employed in which a signal dividing circuit 908 is provided on the signal line side and an input digital signal is divided into m signals to be supplied.

Among the signals received by the tuner 904, an audio signal is transmitted to an audio signal amplifier circuit 909, and an output thereof is supplied to a speaker 913 through an audio signal processing circuit 910. A control circuit 911 receives control information on receiving station (receiving frequency) and volume from an input portion 912 and transmits a signal to the tuner 904 and the audio signal processing circuit 910.

It is needless to say that the present invention is not limited to a television device and can be applied to various uses, e.g., a monitor of a personal computer, a large display medium such as an information display board at the train station, the airport, or the like, or an advertisement display board on the street, and the like.

Figure 7B:
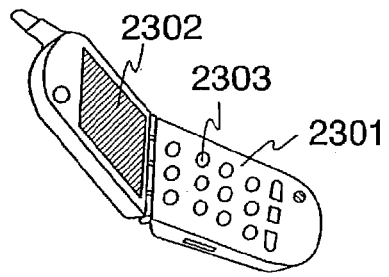

FIG. 7B shows an example of a cellular phone 2301. The cellular phone 2301 includes a display portion 2302, an operation portion 2303, and the like. When the display device described in the above-described embodiment mode is used for the display portion 2302, mass productivity can be increased.

Figure 7C:
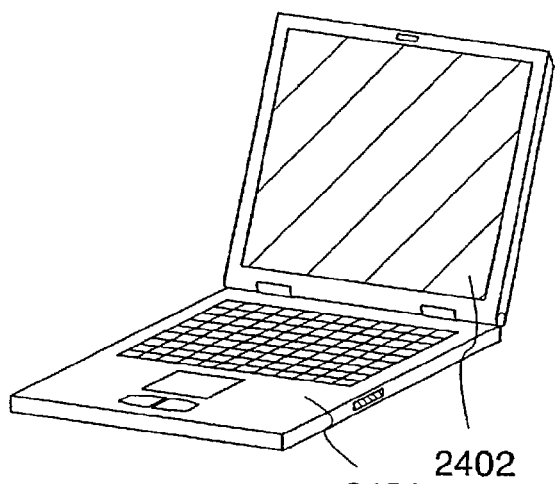

A portable computer shown in FIG. 7C includes a main body 2401, a display portion 2402, and the like. When the display device described in the above-described embodiment mode is used for the display portion 2402, mass productivity can be increased.

Figure 7D:
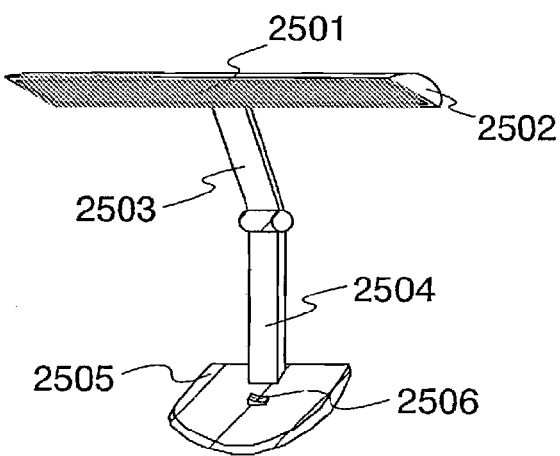

FIG. 7D shows a desk lamp including a lighting portion 2501, a shade 2502, an adjustable arm 2503, a support 2504, a base 2505, and a power supply switch 2506. The desk lamp is formed using the display device, which is formed using a manufacturing apparatus of the present invention, for the lighting portion 2501. Note that a lamp includes a ceiling light, a wall light, and the like in its category. By a manufacturing apparatus of the present invention, manufacturing cost can be significantly reduced, and an inexpensive desk lamp can be provided.

This application is based on Japanese Patent Application serial no. 2007-179095 filed with Japan Patent Office on Jul. 6, 2007, the entire contents of which are hereby incorporated by reference.

What is claimed is:

1. A method for manufacturing a semiconductor device comprising the steps of:
   forming a gate insulating film over a substrate;
   performing a hydrogen plasma treatment to generate a crystalline nucleus on a surface of the gate insulating film;
   forming a microcrystalline semiconductor film over the gate insulating film by using at least one of a silicon hydride gas and a silicon halide gas as a deposition gas after performing the hydrogen plasma treatment; and
   forming an amorphous semiconductor film over the microcrystalline semiconductor film,
   wherein a flow rate of the one of the silicon hydride gas and the silicon halide gas is increased during the formation of the microcrystalline semiconductor film.

2. The method for manufacturing a semiconductor device according to claim 1, wherein a concentration of oxygen of the microcrystalline semiconductor film is $5 \times 10^{19}$ cm$^{-3}$ or less, and a concentration of each of nitrogen and carbon of the microcrystalline semiconductor film is $1 \times 10^{18}$ cm$^{-3}$ or less.

3. The method for manufacturing a semiconductor device according to claim 1, wherein a thickness of the microcrystalline semiconductor film is greater than 0 nm and less than or equal to 50 nm.

4. The method for manufacturing a semiconductor device according to claim 1, wherein a thickness of the amorphous semiconductor film is greater than 150 nm and less than or equal to 400 nm.

5. The method for manufacturing a semiconductor device according to claim 1, wherein the microcrystalline semiconductor film is formed in a reaction chamber, and wherein a hydrogen gas or a silane gas is introduced in the reaction chamber before the microcrystalline semiconductor film is formed.

6. The method for manufacturing a semiconductor device according to claim 1, wherein the microcrystalline semiconductor film is formed in a reaction chamber, and wherein a protective film is formed on an inner wall of the reaction chamber before the microcrystalline semiconductor film is formed.

7. A method for manufacturing a semiconductor device comprising the steps of:
   forming a gate insulating film over a substrate;
   performing a hydrogen plasma treatment to generate a crystalline nucleus on a surface of the gate insulating film;
   forming a microcrystalline semiconductor film over the gate insulating film by using at least one of a silicon hydride gas and a silicon halide gas as a deposition gas after performing the hydrogen plasma treatment; and
   forming an amorphous semiconductor film over the microcrystalline semiconductor film,
   wherein a flow rate of the one of the silicon hydride gas and the silicon halide gas is increased during the formation of the microcrystalline semiconductor film,
   wherein the microcrystalline semiconductor film is formed without exposing the surface of the gate insulating film to atmosphere, and
   wherein the amorphous semiconductor film is formed without exposing a surface of the microcrystalline semiconductor film to atmosphere.

8. The method for manufacturing a semiconductor device according to claim 7, wherein a concentration of oxygen of the microcrystalline semiconductor film is $5 \times 10^{19}$ cm$^{-3}$ or less, and a concentration of each of nitrogen and carbon of the microcrystalline semiconductor film is $1 \times 10^{18}$ cm$^{-3}$ or less.

9. The method for manufacturing a semiconductor device according to claim 7, wherein a thickness of the microcrystalline semiconductor film is greater than 0 nm and less than or equal to 50 nm.

10. The method for manufacturing a semiconductor device according to claim 7, wherein a thickness of the amorphous semiconductor film is greater than 150 nm and less than or equal to 400 nm.

11. The method for manufacturing a semiconductor device according to claim 7, wherein the microcrystalline semiconductor film is formed in a reaction chamber, and wherein a hydrogen gas or a silane gas is introduced in the reaction chamber before the microcrystalline semiconductor film is formed.

12. The method for manufacturing a semiconductor device according to claim 7, wherein the microcrystalline semiconductor film is formed in a reaction chamber, and wherein a protective film is formed on an inner wall of the reaction chamber before the microcrystalline semiconductor film is formed.

13. A method for manufacturing a semiconductor device comprising the steps of:
   forming a gate electrode over a substrate;
   forming a gate insulating film over the gate electrode;
   performing a hydrogen plasma treatment to generate a crystalline nucleus on a surface of the gate insulating film;
   forming a microcrystalline semiconductor film over the gate insulating film by using at least one of a silicon hydride gas and a silicon halide gas as a deposition gas after performing the hydrogen plasma treatment;
   forming an amorphous semiconductor film over the microcrystalline semiconductor film;
   forming a semiconductor film to which an impurity is added, over the amorphous semiconductor film;
   forming source and drain electrodes over the semiconductor film to which the impurity is added;
   forming source and drain regions and a groove by selectively etching the semiconductor film to which the impurity is added and the amorphous semiconductor film; and forming a pixel electrode over the source and drain electrodes, wherein a flow rate of the one of the silicon hydride gas and the silicon halide gas is increased during the formation of the microcrystalline semiconductor film, wherein the microcrystalline semiconductor film is formed without exposing the surface of the gate insulating film to atmosphere, and wherein the amorphous semiconductor film is formed without exposing a surface of the microcrystalline semiconductor film to atmosphere.

14. The method for manufacturing a semiconductor device according to claim 13, wherein a concentration of oxygen of the microcrystalline semiconductor film is $5 \times 10^{19}$ cm$^{-3}$ or less, and a concentration of each of nitrogen and carbon of the microcrystalline semiconductor film is $1 \times 10^{18}$ cm$^{-3}$ or less.

15. The method for manufacturing a semiconductor device according to claim 13, wherein a thickness of the microcrystalline semiconductor film is greater than 0 nm and less than or equal to 50 nm.

16. The method for manufacturing a semiconductor device according to claim 13, wherein a thickness of the amorphous semiconductor film is greater than 150 nm and less than or equal to 400 nm.

17. The method for manufacturing a semiconductor device according to claim 13, wherein the microcrystalline semiconductor film is formed in a reaction chamber, and wherein a hydrogen gas or a silane gas is introduced in the reaction chamber before the microcrystalline semiconductor film is formed.

18. The method for manufacturing a semiconductor device according to claim 13, wherein the microcrystalline semiconductor film is formed in a reaction chamber, and wherein a protective film is formed on an inner wall of the reaction chamber before the microcrystalline semiconductor film is formed.

19. The method for manufacturing a semiconductor device according to claim 13, wherein the semiconductor film to which the impurity is added is formed without exposing a surface of the amorphous semiconductor film to atmosphere.

* * * * *

UNITED STATES PATENT AND TRADEMARK OFFICE
CERTIFICATE OF CORRECTION

PATENT NO. : 8,389,343 B2  Page 1 of 1
APPLICATION NO. : 13/198971
DATED : March 5, 2013
INVENTOR(S) : Shunpei Yamazaki It is certified that error appears in the above-identified patent and that said Letters Patent is hereby corrected as shown below:

In the Specification

At column 3, line 43, "0.5 mu" should be --0.5 nm--;

At column 4, line 58, "hi" should be --in--;

At column 12, line 49, "dram" should be --drain--;

At column 17, line 62, "atter" should be --after--;

At column 26, line 27, "IFI" should be --TFT--;

At column 28, line 52, "MS" should be --TFTs--;

At column 31, line 11, "628" should be --TFT 628--;

At column 31, line 12, "TFTs is" should be --TFTs--.

Signed and Sealed this
Seventeenth Day of September, 2013

Teresa Stanek Rea
*Deputy Director of the United States Patent and Trademark Office*